US010688622B2

(12) United States Patent
Aono et al.

(10) Patent No.: US 10,688,622 B2
(45) Date of Patent: Jun. 23, 2020

(54) SUBSTRATE PROCESSING APPARATUS

(71) Applicant: Ebara Corporation, Tokyo (JP)

(72) Inventors: Hiroshi Aono, Tokyo (JP); Kuniaki Yamaguchi, Tokyo (JP); Hiroshi Shimomoto, Tokyo (JP); Koji Maeda, Tokyo (JP); Tetsuya Yashima, Tokyo (JP); Kenji Shinkai, Tokyo (JP); Koichi Hashimoto, Tokyo (JP); Mitsuhiko Inaba, Tokyo (JP); Hidetatsu Isokawa, Tokyo (JP); Hidetaka Nakao, Tokyo (JP); Soichi Isobe, Tokyo (JP)

(73) Assignee: Ebara Corporation, Tokyo (JP)

(*) Notice: Subject to any disclaimer, the term of this patent is extended or adjusted under 35 U.S.C. 154(b) by 341 days.

(21) Appl. No.: 15/615,375

(22) Filed: Jun. 6, 2017

(65) Prior Publication Data
US 2018/0001440 A1 Jan. 4, 2018

(30) Foreign Application Priority Data

Jun. 30, 2016 (JP) ................. 2016-130900

(51) Int. Cl.
B24B 49/10 (2006.01)
B24B 37/34 (2012.01)
(Continued)

(52) U.S. Cl.
CPC ............ *B24B 37/345* (2013.01); *B08B 1/003* (2013.01); *B08B 1/04* (2013.01); *B08B 3/123* (2013.01);
(Continued)

(58) Field of Classification Search
CPC ....................................... B24B 49/10
(Continued)

(56) References Cited

U.S. PATENT DOCUMENTS

2002/0177386 A1* 11/2002 Smith ................. B24B 37/345
451/5
2004/0261944 A1 12/2004 Wakabayashi et al.
(Continued)

FOREIGN PATENT DOCUMENTS

JP H08-162514 A 6/1996
JP H10-284457 A 10/1998
(Continued)

OTHER PUBLICATIONS

Japan Patent Office, Notice of Reasons for Refusal in Japanese Patent Application No. 2016-0130900 (dated Jun. 11, 2019).
(Continued)

Primary Examiner — Robert A Rose
(74) Attorney, Agent, or Firm — Leydig, Voit & Mayer, Ltd.

(57) ABSTRACT

A substrate processing apparatus is provided with a polishing part that polishes a substrate, a transporting part that transports a substrate before polishing to the polishing part, and a cleaning part that cleans the polished substrate. The cleaning part has a first cleaning unit and a second cleaning unit that are vertically arranged in two stages. The first cleaning unit and the second cleaning unit each have a plurality of cleaning modules that are arranged in series. The transporting part has a slide stage that is disposed between the first cleaning unit and the second cleaning unit, and transports a substrate before polishing along an arrangement direction of the plurality of cleaning modules.

19 Claims, 61 Drawing Sheets

(51) Int. Cl.
  *B08B 1/00* (2006.01)
  *B08B 1/04* (2006.01)
  *B08B 3/12* (2006.01)
  *B24B 37/10* (2012.01)
  *H01L 21/67* (2006.01)
  *H01L 21/687* (2006.01)

(52) U.S. Cl.
  CPC ........ *B24B 37/10* (2013.01); *H01L 21/67173* (2013.01); *H01L 21/67219* (2013.01); *H01L 21/68707* (2013.01)

(58) Field of Classification Search
  USPC ........................................ 451/5, 8, 9, 10, 41
  See application file for complete search history.

(56) References Cited

U.S. PATENT DOCUMENTS

| | | |
|---|---|---|
| 2008/0035181 A1 | 2/2008 | Takahashi et al. |
| 2009/0067959 A1 | 3/2009 | Takahashi et al. |
| 2009/0305612 A1 | 12/2009 | Miyazaki et al. |
| 2014/0030048 A1 | 1/2014 | Kosuge et al. |
| 2015/0290767 A1* | 10/2015 | Sugiyama ......... H01L 21/67219 451/444 |

FOREIGN PATENT DOCUMENTS

| | | |
|---|---|---|
| JP | 2003-309089 A | 10/2003 |
| JP | 2008-091920 A | 4/2008 |
| JP | 2008-294233 A | 12/2008 |
| JP | 2010-050436 A | 3/2010 |
| JP | 2015-207602 A | 11/2015 |
| JP | 2016-201399 A | 12/2016 |
| SG | 10201705171 A | 1/2018 |
| WO | WO 2007/099976 A1 | 9/2007 |

OTHER PUBLICATIONS

Intellectual Property Office of Singapore, Invitation to Respond to Written Opinion in Singapore Patent Application No. 10201705081P (dated Nov. 1, 2019).
Japan Patent Office, Notice of Reasons for Refusal in Japanese Patent Application No. 2016-130900 (dated Mar. 31, 2020).

* cited by examiner

SUBSTRATE PROCESSING APPARATUS

CROSS-REFERENCE TO RELATED APPLICATIONS

This application claims the benefit of Japanese Priority Patent Application JP 2016-130900 filed on Jun. 30, 2016, the entire contents of which are incorporated herein by reference.

FIELD

The present technology relates to a substrate processing apparatus, particularly a substrate processing apparatus used for polishing a substrate, such as a semiconductor wafer, to be flat.

BACKGROUND AND SUMMARY

In recent years, with the progress of the higher integration of semiconductor devices, circuit wiring is becoming finer, and an inter-wiring distance is becoming narrower. In manufacturing of a semiconductor device, many kinds of materials are repeatedly formed in a film shape on a silicon wafer, to form a layered structure. In order to form this layered structure, a technology to planarize a surface of the wafer is critical. As such a means of planarizing the surface of a wafer, a polishing device for performing a chemical-mechanical polishing (CMP) (also referred to as a chemical-mechanical polishing device) have been used widely.

The chemical-mechanical polishing (CMP) device is generally provided with a polishing table attached with a polishing pad, a top ring for holding a wafer, and a nozzle for supplying polishing liquid on the polishing pad. While the nozzle supplies the polishing liquid on the polishing pad, the top ring presses the wafer to the polishing pad, and the top ring and the polishing table are relatively moved, thereby to polish the wafer to planarize the surface of the wafer.

A substrate processing apparatus is an apparatus that has a function of cleaning and drying a polished wafer, in addition to such a CMP device. In such a substrate processing apparatus, improvement in a throughput of substrate processing is needed. Since a substrate processing apparatus has various processing parts for polishing or cleaning, delay in individual processing parts reduces overall throughput of the substrate processing apparatus. For example, a conventional substrate processing apparatus described in WO 2007/099976 A has not been able to simultaneously clean and dry a plurality of polished wafers, since only one cleaning line is provided in a cleaning part even when a polishing part has a plurality of polishing units.

Moreover, in the conventional substrate processing apparatus, when the polishing part has a first polishing unit and a second polishing unit, while a wafer has been directly carried into the first polishing unit from a loading/unloading part for polishing the wafer at the first polishing unit, a wafer has been carried into the second polishing unit via the first polishing unit from the loading/unloading part for polishing the substrate at the second polishing unit. Consequently, a same carry-in path portion of the first polishing unit and the second polishing unit has been congested, reducing a throughput.

Furthermore, in the conventional substrate processing apparatus, a transport robot disposed at the loading/unloading part has directly carried a wafer before polishing into the polishing part from the loading/unloading part, and has carried a cleaned wafer out from the cleaning part to the loading/unloading part. While high cleanliness is required for a hand of the transport robot that holds a cleaned wafer, there has been a concern that a wafer before polishing may be contaminated due to contact with a polishing environment when being directly carried into the polishing part.

It is desired to provide a substrate processing apparatus that can improve a throughput.

A substrate processing apparatus according to one embodiment is provided with:
a polishing part configured to polish a substrate;
a transporting part configured to transport a substrate before polishing to the polishing part; and
a cleaning part configured to clean a polished substrate.
The cleaning part has a first cleaning unit and a second cleaning unit that are vertically arranged in two stages;
the first cleaning unit and the second cleaning unit each have a plurality of cleaning modules that are arranged in series; and
the transporting part has a slide stage disposed between the first cleaning unit and the second cleaning unit, and configured to transport a substrate before polishing along an arrangement direction of the plurality of cleaning modules.

A substrate processing apparatus according to one embodiment is provided with:
a transporting part configured to transport a substrate before polishing to a polishing part; and
a cleaning part configured to clean a polished substrate.
The polishing part has
a first polishing unit and a second polishing unit; and
a polishing-part transport mechanism arranged adjacent to the transporting part and each of the first polishing unit and the second polishing unit.
The polishing-part transport mechanism has
a first transport unit configured to transport a substrate to the first polishing unit;
a second transport unit configured to transport a substrate to the second polishing unit; and
a transport robot disposed between the first transport unit and the second transport unit, and configured to transfer a substrate between the transporting part, and the first transport unit and the second transport unit.

A substrate processing apparatus according to one embodiment is provided with:
a polishing part configured to polish a substrate;
a transporting part configured to transport a substrate before polishing to the polishing part; and
a cleaning part configured to clean a polished substrate,
The polishing part has
N pieces (N is a natural number of 2 or more) of polishing devices;
a transport unit configured to transport a substrate to each of the N pieces of polishing devices; and
a transport robot configured to transfer a substrate between the transporting part and the transport unit.
The transport unit has
N pieces of pushers arranged at N locations of substrate-transport positions for the respective N pieces of polishing devices, and configured to vertically move; and
an exchanger having N pieces of stages vertically arranged in N stages, and configured to horizontally move independently from each other, between the N locations of substrate-transport positions and a standby position for transfer of a substrate with the transport robot.

A substrate processing apparatus according to one embodiment is provided with:

a polishing part configured to polish a substrate;

a transporting part configured to transport a substrate before polishing to the polishing part; and a cleaning part configured to clean a polished substrate.

The cleaning part has a plurality of cleaning modules arranged in series; and a cleaning-part transport mechanism configured to transport a substrate between the cleaning modules each.

The cleaning-part transport mechanism has a pair of arms that are openable/closable and configured to hold a substrate;

a vertical-moving mechanism configured to vertically move the pair of arms;

a rotating mechanism configured to rotate the pair of arms around a rotating shaft that is in parallel with an opening/closing direction; and an arm-transport mechanism configured to linearly move the pair of arms along an arrangement direction of the plurality of the cleaning modules.

DETAILED DESCRIPTION OF NON-LIMITING EXAMPLE EMBODIMENTS

Figure 1:
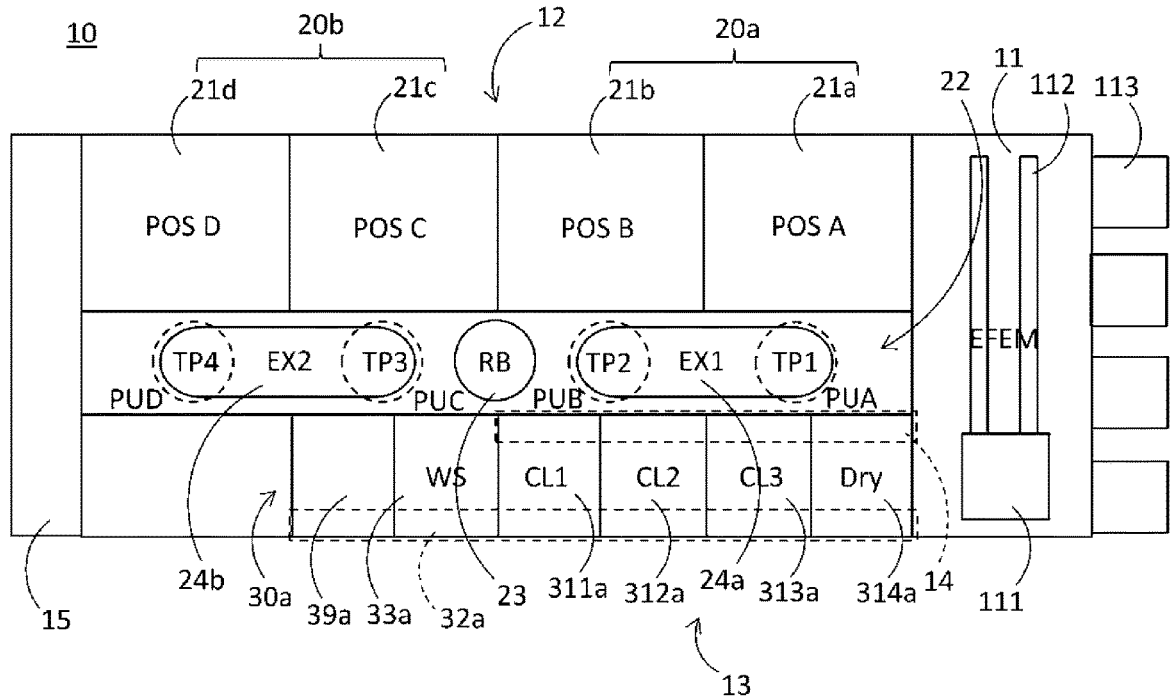
FIG. 1 is a plan view illustrating an entire configuration of a substrate processing apparatus according to one embodiment.

Embodiments are described below with reference to drawings. It should be noted that, in the following descriptions and drawings used in the following descriptions, parts capable of being identically configured are denoted by identical reference numerals, and will not be described in duplication.

A substrate processing apparatus according to one embodiment is provided with:

a polishing part configured to polish a substrate;

a transporting part configured to transport a substrate before polishing to the polishing part; and a cleaning part configured to clean a polished substrate.

The cleaning part has a first cleaning unit and a second cleaning unit that are vertically arranged in two stages;

the first cleaning unit and the second cleaning unit each have a plurality of cleaning modules that are arranged in series; and the transporting part has a slide stage disposed between the first cleaning unit and the second cleaning unit, and configured to transport a substrate before polishing along an arrangement direction of the plurality of cleaning modules.

According to the substrate processing apparatus described above, even when a plurality of substrates are successively transported from the polishing part to the cleaning part, the plurality of substrates can be cleaned in parallel by distributing the substrates to the first cleaning unit and the second cleaning unit. Accordingly, a throughput of entire process can be improved. Since a substrate before polishing is transported to the polishing part with the slide stage of the transporting part, the transport robot disposed at a loading/unloading part can be prevented from being contaminated due to contact with a polishing environment. Moreover, the first cleaning unit and the second cleaning unit are vertically arranged in two stages, and the slide stage is disposed between the first cleaning unit and the second cleaning unit, enabling suppression of an increase in footprint of the entire apparatus.

A substrate processing apparatus according to one embodiment is provided with:

a transporting part configured to transport a substrate before polishing to a polishing part; and a cleaning part configured to clean a polished substrate.

The polishing part has a first polishing unit and a second polishing unit; and a polishing-part transport mechanism arranged adjacent to the transporting part and each of the first polishing unit and the second polishing unit.

The polishing-part transport mechanism has a first transport unit configured to transport a substrate to the first polishing unit;

a second transport unit configured to transport a substrate to the second polishing unit; and a transport robot disposed between the first transport unit and the second transport unit, and configured to transfer a substrate between the transporting part, and the first transport unit and the second transport unit.

According to the substrate processing apparatus described above, substrates transported from the transporting part to the polishing part are distributed to the first transport unit and the second transport unit by the transport robot. Then, a substrate is carried into the first polishing unit from the first transport unit, and a substrate is carried into the second polishing unit from the second transport unit. Thus, the first polishing unit and the second polishing unit do not share a substrate carry-in path, eliminating congestion in carrying a substrate into the first polishing unit and the second polishing unit. This can improve a throughput of entire process.

In the substrate processing apparatus described above, the cleaning part is arranged adjacent to the transport robot, and the transport robot may transfer a substrate between the cleaning part, and the first and second transport units.

The substrate processing apparatus described above may be further provided with a control part configured to control an operation of the polishing part and the cleaning part; in which the cleaning part has a first cleaning unit and a second cleaning unit that are vertically arranged in two stages;

the first cleaning unit has a plurality of first cleaning modules and a first wafer station that are arranged in series, and a first cleaning-part transport mechanism configured to transport a substrate between the first wafer station and each of the first cleaning modules;

the second cleaning unit has a plurality of second cleaning modules and a second wafer station that are arranged in series, and a second cleaning-part transport mechanism configured to transport a substrate between the second wafer station and each of the second cleaning modules; and the control part controls an operation of the polishing part and the cleaning part such that, when abnormality occurs in any of the plurality of first cleaning modules, the first cleaning-part transport mechanism transports a substrate located in the first cleaning modules to the first wafer station, the transport robot transfers the substrate from the first wafer station to the second wafer station, and the substrate is transported from the second wafer station to the second cleaning modules by the second cleaning-part transport mechanism, to be cleaned.

According to such an aspect, even when abnormality occurs in any of the plurality of first cleaning modules, the substrate located in the first cleaning modules is transported to the second cleaning modules, to be cleaned, so that the substrate located in the first cleaning modules can be saved.

A substrate processing apparatus according to one embodiment is provided with:

a polishing part configured to polish a substrate;

a transporting part configured to transport a substrate before polishing to the polishing part; and a cleaning part configured to clean a polished substrate, The polishing part has N pieces (N is a natural number of 2 or more) of polishing devices;

a transport unit configured to transport a substrate to each of the N pieces of polishing devices; and a transport robot configured to transfer a substrate between the transporting part and the transport unit.

The transport unit has

N pieces of pushers arranged at N locations of substrate-transport positions for the respective N pieces of polishing devices, and configured to vertically move; and an exchanger having N pieces of stages vertically arranged in N stages, and configured to horizontally move independently from each other, between the N locations of substrate-transport positions and a standby position for transfer of a substrate with the transport robot.

According to the substrate processing apparatus described above, the transport unit can transport a substrate received from the transport robot, to each of the N locations of the polishing devices. For example, a first stage of the exchanger receives a first substrate from the transport robot and moves to a first substrate-transport position, then a first pusher ascends to transfer the first substrate from the first stage to a first polishing device, and while the first substrate is being polished at the first polishing device, a second stage receives a second substrate from the transport robot and moves to a second substrate-transport position, then a second pusher ascends to transfer the second substrate from the second stage to a second polishing device, and the second substrate can be polished at the second polishing device. Thus polishing two substrates in parallel can provide improvement in a throughput of entire process. It is also possible that, after the substrate is polished at the first polishing device, the first pusher descends to transfer the substrate from the first polishing device to the second stage, the second stage moves to the second substrate-transport position, the second pusher ascends to transfer the substrate from the second stage to the second polishing device, and the substrate is further polished at the second polishing device.

In the substrate processing apparatus described above, the exchanger may have at least one additional stage vertically arranged in multiple stages with respect to the N pieces of stages, and configured to horizontally move between the standby position and the N locations of substrate-transport positions, independently from the N pieces of stages.

According to such an aspect, for example, while both the first and second stages are used for transfer of a substrate with the first and second polishing devices, a third stage can receive a next substrate and wait. This can provide an earlier start timing of polishing process for the next substrate, and further improvement in the throughput.

The substrate processing apparatus described above may be further provided with a control part configured to control an operation of the polishing part, in which the control part controls an operation of the polishing part such that, when substrates are successively polished at the first polishing device and the second polishing device, the first stage receives a first substrate from the transport robot and moves from the standby position to the first substrate-transport position;

the first pusher ascends to transfer the first substrate from the first stage to the first polishing device;

while the first polishing device is polishing the first substrate, the first stage moves back to the standby position to receive a second substrate from the transport robot;

after the polishing at the first polishing device is finished, the first pusher descends to transfer the first substrate from the first polishing device to the second stage; and the second stage moves from the first substrate-transport position to the second substrate-transport position, and at the same time, the first stage moves from the standby position to the first substrate-transport position.

According to such an aspect, at the same time when the second stage holding the first substrate moves from the first substrate-transport position to the second substrate-transport position, the first stage holding the second substrate moves from the standby position to the first substrate-transport position, improving a throughput of process.

The substrate processing apparatus described above may be further provided with a control part configured to control an operation of the polishing part, in which the control part controls an operation of the polishing part such that, when substrates are polished in parallel at the first polishing device and the second polishing device, the first stage is used for receiving a substrate from the first polishing device but the first stage is not used for transfer of the substrate with the second polishing device, and the second stage is used for receiving a substrate from the second polishing device, but the second stage is not used for transfer of the substrate with the first polishing device.

According to such an aspect, when substrates are polished in parallel at the first polishing device and the second polishing device, the first stage and the second stage are exclusively used for receiving substrates from the first polishing device and the second polishing device respectively. Consequently, even when trouble occurs in receiving a substrate from one polishing device, a substrate can be continuously transferred to another polishing device (occurrence of deadlock can be avoided).

The substrate processing apparatus described above may be further provided with a control part configured to control an operation of the polishing part, in which the control part controls an operation of the polishing part such that, when a first substrate and a second substrate are polished in parallel at the first polishing device and the second polishing device, the first stage receives the first substrate from the transport robot and moves from the standby position to the first substrate-transport position;

the first pusher ascends to transfer the first substrate from the first stage to the first polishing device;

while the first polishing device is polishing the first substrate, the first stage moves back to the standby position from the first substrate-transport position to receive the second substrate from the transport robot, and moves from the standby position to the second substrate-transport position;

the second pusher ascends to transfer the second substrate from the first stage to the second polishing device;

while the second polishing device is polishing the second substrate, the first stage moves back to the standby position from the second substrate-transport position to receive a third substrate from the transport robot;

when the polishing at the first polishing device is finished before the polishing at the second polishing device is finished, the first pusher descends to transfer the first substrate from the first polishing device to the second stage, and the second stage moves from the first substrate-transport position to the standby position, and at the same time, the first stage moves from the standby position to the first substrate-transport position; and when the polishing at the second polishing device is finished before the polishing at the first polishing device is finished, the second pusher descends to transfer the second substrate from the second polishing device to a third stage, and the third stage moves from the second substrate-transport position to the standby position, and at the same time, the first stage moves from the standby position to the first substrate-transport position.

According to such an aspect, when first and second substrates are polished in parallel at the first and second polishing devices, the same first stage is used to transfer the wafers to both the first and second polishing devices, and the second stage and the third stage are exclusively used for receiving the substrates from the first polishing device and the second polishing device respectively. Consequently, even when trouble occurs in receiving a substrate from one polishing device, a substrate can be continuously transferred to another polishing device (occurrence of deadlock can be avoided).

A substrate processing apparatus according to one embodiment is provided with:

a polishing part configured to polish a substrate;

a transporting part configured to transport a substrate before polishing to the polishing part; and a cleaning part configured to clean a polished substrate.

The cleaning part has a plurality of cleaning modules arranged in series; and a cleaning-part transport mechanism configured to transport a substrate between the cleaning modules each.

The cleaning-part transport mechanism has a pair of arms that are openable/closable and configured to hold a substrate;

a vertical-moving mechanism configured to vertically move the pair of arms;

a rotating mechanism configured to rotate the pair of arms around a rotating shaft that is in parallel with an opening/closing direction; and an arm-transport mechanism configured to linearly move the pair of arms along an arrangement direction of the plurality of the cleaning modules.

According to the substrate processing apparatus described above, since the rotating mechanism can rotate the pair of arms so as to direct their tips upward, even when a shutter of a specific cleaning module among a plurality of cleaning modules is closed, the arms can avoid (skip) this cleaning module, to move. This eliminates necessity of waiting for the shutter to open in moving the arms to pass this cleaning module, and can improve a throughput of entire process.

In the substrate processing apparatus described above may be further provided with a control part configured to control an operation of the cleaning part, in which the control part controls an operation of the cleaning part such that, when the rotating mechanism rotates the pair of arms so as to direct their tips upward, the vertical-moving mechanism lowers the pair of arms.

According to such an aspect, it is possible to reduce a space required above the pair of arms since the vertical-moving mechanism lowers the pair of arms when the rotating mechanism rotates the pair of arms so as to direct their tips upward.

The substrate processing apparatus described above may have two sets each consisting of the pair of arms, the vertical-moving mechanism, and the rotating mechanism.

According to such an aspect, the two sets of arms can be properly used according to cleanliness of a substrate to be held. For example, while a first set of arms are used for a first half of cleaning process in cleaning process of each of the cleaning modules, a second set of arms are used for a second half of the cleaning process, which can prevent contamination of a substrate being subjected to the second half of cleaning process due to contact with the first set of arms.

In the substrate processing apparatus described above, the pair of arms may be provided with chuck tops capable of abutting to an outer periphery of a substrate, vertically in two stages.

According to such an aspect, the chuck tops can be properly used according to cleanliness of a substrate to be held. For example, while a lower chuck top is used for a first half of cleaning process in cleaning process of each of the cleaning modules, an upper chuck top is used for a second half of the cleaning process, which can prevent contamination of a substrate being subjected to the second half of cleaning process due to contact with the lower chuck top.

In the substrate processing apparatus described above, the set consisting of the pair of arms, the vertical-moving mechanism, and the rotating mechanism may be disposed in a suspended state below the arm-transport mechanism.

According to such an aspect, a maintenance space for the set consisting of the pair of arms, the vertical-moving mechanism, and the rotating mechanism is enlarged. This can reduce time required for maintenance.

In the substrate processing apparatus described above, the cleaning part may further have a pre-cleaning module arranged on a same line as the plurality of cleaning modules and configured to clean a substrate before polishing, and the cleaning-part transport mechanism may transport the substrate between the pre-cleaning module and each of the cleaning modules.

According to such an aspect, before a substrate before polishing is polished at the polishing device, a surface of this substrate can be cleaned at the pre-cleaning module. This can reduce trouble such as generation of scratch due to biting of a coarse particle during polishing process of the substrate.

Figure 2:
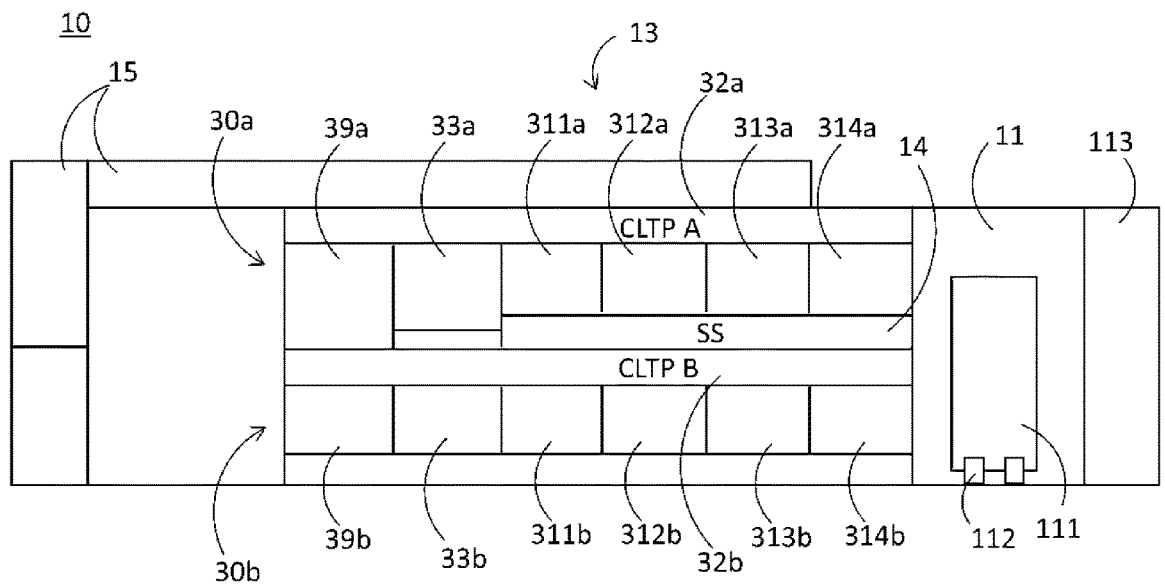
FIG. 2 is a side view of the substrate processing apparatus illustrated in FIG. 1, viewed from a cleaning-part side.

FIG. 1 is a plan view illustrating an entire configuration of a substrate processing apparatus according to one embodiment, and FIG. 2 is a side view of a polishing device illustrated in FIG. 1, viewed from a cleaning-part side. As illustrated in FIGS. 1 and 2, the substrate processing apparatus 10 according to the embodiment is provided with a housing with a substantially rectangular shape in plan view, and an inside of the housing is partitioned into a loading/unloading part 11, a polishing part 12, a cleaning part 13, and a transporting part 14, by partition walls. Each of these the loading/unloading part 11, the polishing part 12, the cleaning part 13, and the transporting part 14 is independently assembled and independently evacuated. The substrate processing apparatus 10 is also provided with a control part 15 (also referred to as a control panel) configured to control operations of the loading/unloading part 11, the polishing part 12, the cleaning part 13, and the transporting part 14.

<Loading/Unloading Part>

The loading/unloading part 11 is provided with a plurality of (four in the illustrated example) front loading parts 113 mounted with a wafer cassette that stocks many wafers (substrates) W. These front loading parts 113 are arranged adjacently in a width direction (vertical direction to a longitudinal direction) of the substrate processing apparatus 10. The front loading parts 113 can be mounted with an open cassette, a SMIF (Standard Manufacturing Interface) pod, or a FOUP (Front Opening Unified Pod). Each of the SMIF and the FOUP is a hermetically sealed container which houses a wafer cassette inside and is covered with a partition wall and thus can keep independent internal environment isolated from an external space.

In the loading/unloading part 11, a traveling mechanism 112 is laid along an arrangement direction of the front loading parts 113, and on this traveling mechanism 112, there is installed a transport robot 111 movable along the arrangement direction of the front loading parts 113. The transport robot 111 can have access to the wafer cassette mounted in the front loading parts 113, by moving on the traveling mechanism 112. The transport robot 111 is provided with vertical two hands, and the vertical hands can be properly used, for example, such that an upper hand is used for returning a wafer W to the wafer cassette, while a lower hand is used for transporting a wafer W before polishing.

Alternatively, the wafer W may also be transported by only a single hand.

Since the loading/unloading part 11 is an area where the cleanest state needs to be kept, inside the loading/unloading part 11 is always maintained at a higher pressure than any of an outside the apparatus, the polishing part 12, the cleaning part 13, and the transporting part 14. Additionally, above the traveling mechanism 112 of the transport robot 111 is provided with a filter fan unit (not shown) having a clean air filter, such as a HEPA filter or an ULPA filter, and the filter fan unit always downwardly blows clean air, from which particles, toxic steam, and gas have been removed.

<Transporting Part>

The transporting part 14 is an area for transporting a wafer before polishing from the loading/unloading part 11 to the polishing part 12, and is provided to extend along the longitudinal direction of the substrate processing apparatus 10. As illustrated in FIG. 1, the transporting part 14 is arranged adjacent to both the loading/unloading part 11, which is the cleanest area, and the polishing part 12, which is the dirtiest area. Therefore, in order to prevent diffusion of particles in the polishing part 12 into the loading/unloading part 11 through the transporting part 14, inside the transporting part 14 is formed with an air flow flowing from the loading/unloading part 11 side to the polishing part 12 side, as described later.

Figure 3:
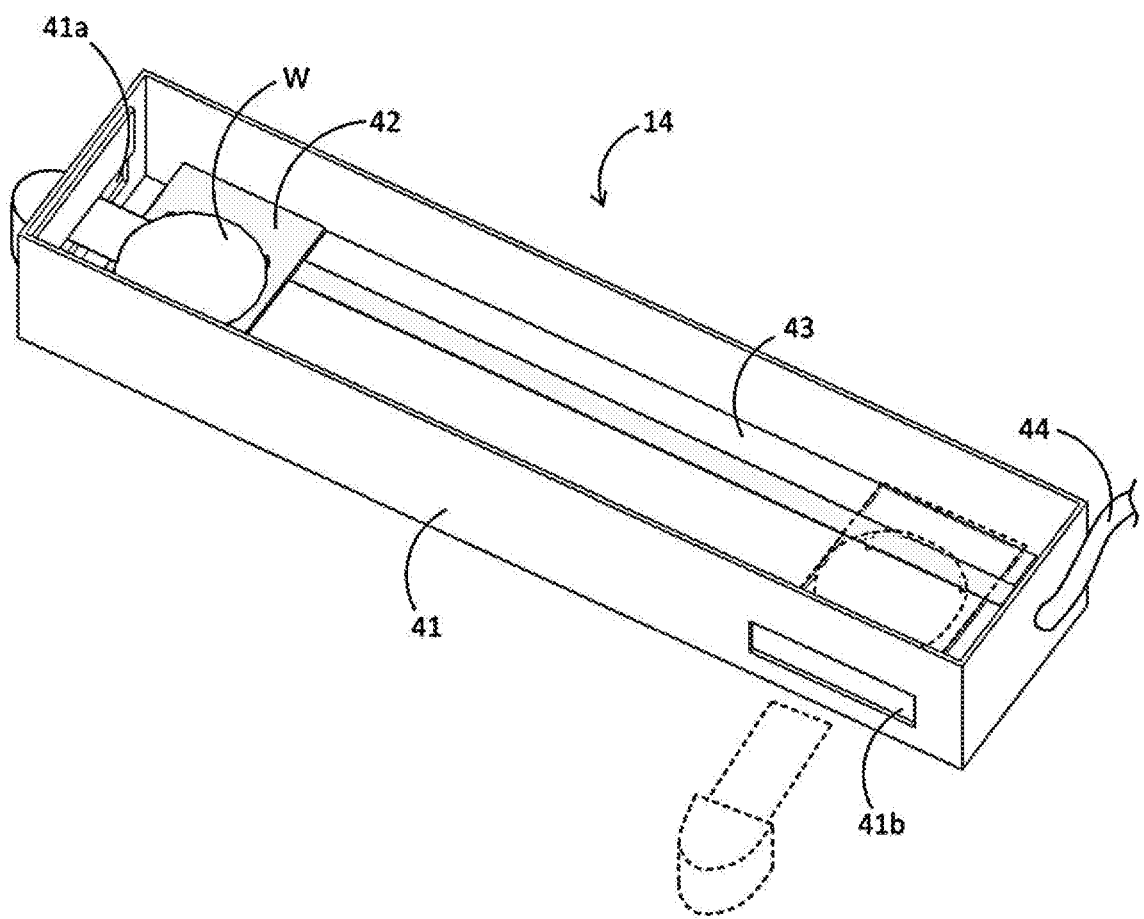
FIG. 3 is an exploded perspective view illustrating a transporting part of the substrate processing apparatus illustrated in FIG. 1.

A structure of the transporting part 14 is described in detail. FIG. 3 is an exploded perspective view illustrating an internal configuration of the transporting part 14. As illustrated in FIG. 3, the transporting part 14 has a cover 41 extending in the longitudinal direction; a slide stage 42 disposed inside the cover 41 and configured to hold a wafer W; a stage-moving mechanism 43 configured to move the slide stage 42 linearly along the longitudinal direction; and an exhaust duct 44 configured to evacuate inside the cover 41.

The cover 41 has a bottom plate, four side plates, and a top plate (not shown in FIG. 3). Among these, one side plate in the longitudinal direction is formed with a carry-in port 41a that is communicated with the loading/unloading part 11. On an end part on an opposite side to the carry-in port 41a, of one side plate in the width direction, there is formed a carry-out port 41b that is communicated with the polishing part 12. The carry-in port 41a and the carry-out port 41b can be opened and closed by a shutter, which is not shown. The transport robot 111 of the loading/unloading part 11 can have access to the slide stage 42 inside the cover 41 from the carry-in port 41a, and the transport robot 23 of the polishing part 12 can have access to the slide stage 42 inside the cover 41 from the carry-out port 41b.

As the stage-moving mechanism 43, for example, a motor drive mechanism using a ball screw or an air cylinder is used. It is preferable to use a rod-less cylinder as the stage-moving mechanism 43, since dust rising from the sliding part can be prevented. The slide stage 42 is fixed to a movable part of the stage-moving mechanism 43, and moved linearly along the longitudinal direction inside the cover 41, by power applied from the stage-moving mechanism 43.

The slide stage 42 is provided with four pins projecting upward, on its outer periphery. The wafer W that is placed on the slide stage 42 by the transport robot 111 of the loading/unloading part 11 is supported on the slide stage 42, with its outer peripheral edge guided and positioned by the four pins. These pins are formed of a resin such as a polypropylene (PP), a polychlorotrifluoroethylene (PCTFE), or a polyetheretherketone (PEEK).

The exhaust duct 44 is provided on another side plate in the longitudinal direction of the cover 41 (a side plate on the opposite side to the carry-in port 41a). Evacuation by the exhaust duct 44 with the carry-in port 41a being open causes formation of an air flow flowing from the carry-in port 41a side to the carry-out port 41b, inside the cover 41. This prevents diffusion of particles in the polishing part 12 into the loading/unloading part 11 through the transporting part 14.

<Polishing Part>

As illustrated in FIG. 1, the polishing part 12 is an area for polishing the wafer W, and has a first polishing unit 20a having a first polishing device 21a and a second polishing device 21b, a second polishing unit 20b having a third polishing device 21c and a fourth polishing device 21d, and a polishing-part transport mechanism 22 arranged adjacent to the transporting part 14 and each of the first and second polishing units 20a and 20b. The polishing-part transport mechanism 22 is disposed between the cleaning part 13, and the first and second polishing units 20a and 20b, in the width direction of the substrate processing apparatus 10.

The first polishing device 21a, the second polishing device 21b, the third polishing device 21c, and the fourth polishing device 21d are arranged along the longitudinal direction of the substrate processing apparatus 10. Since the second polishing device 21b, the third polishing device 21c, and the fourth polishing device 21d have similar configurations as the first polishing device 21a, the first polishing device 21a is described below.

Figure 4:
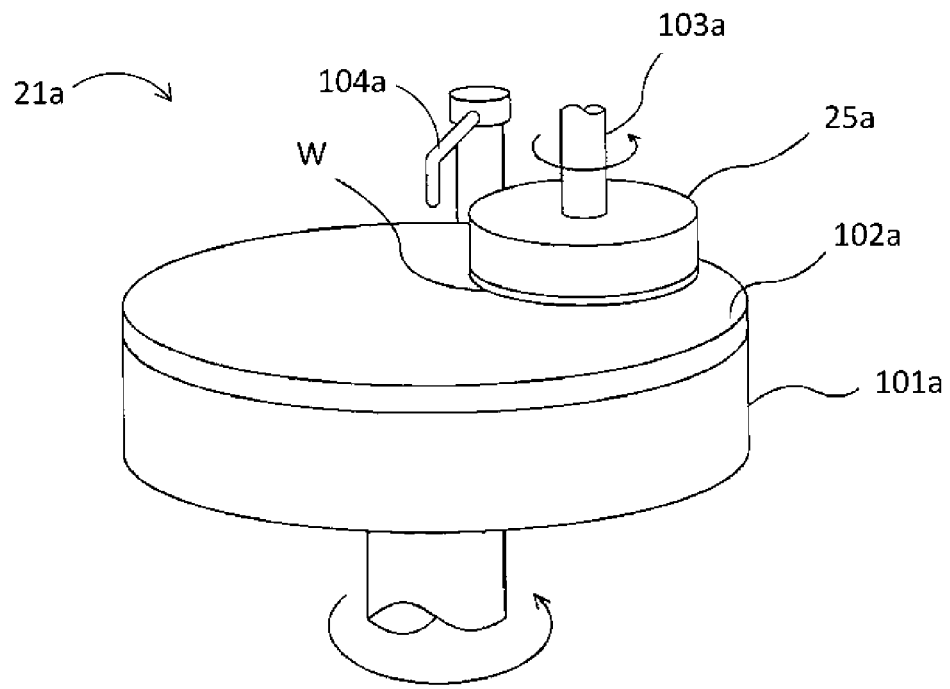
FIG. 4 is a perspective view schematically illustrating a first polishing device of the substrate processing apparatus illustrated in FIG. 1.

FIG. 4 is a perspective view schematically illustrating the first polishing device 21a. The first polishing device 21a has a polishing table 101a attached with a polishing pad 102a having a polishing surface, a top ring 25a configured to hold the wafer W and polish the wafer W while pressing the wafer W to the polishing pad 102a on the polishing table 101a, a polishing-liquid supply nozzle 104a configured to supply polishing liquid (also referred to as slurry) or dressing liquid (e.g., pure water) to the polishing pad 102a, a dresser (not shown) configured to dress the polishing surface of the polishing pad 102a, and an atomizer (not shown in FIG. 4, refer to FIGS. 32 and 33 described later) configured to atomize and spray a mixed gas of liquid (e.g., pure water) and gas (e.g., a nitrogen gas), or liquid (e.g., pure water) onto a polishing surface.

Among these, the top ring 25a is supported by a top ring shaft 103a. The polishing pad 102a is attached on an upper surface of the polishing table 101a, and an upper surface of this polishing pad 102a forms a polishing surface that polishes the wafer W. Alternatively, a fixed grindstone can also be used instead of the polishing pad 102a. The top ring 25a and the polishing table 101a are configured to rotate around their axes, as shown in FIG. 4 with an arrow. The wafer W is held on a lower surface of the top ring 25a by vacuum suction. In polishing, polishing liquid is supplied to the polishing surface of the polishing pad 102a from the polishing-liquid supply nozzle 104a, and the wafer W to be polished is pressed to the polishing surface by the top ring 25a, to be polished.

Figure 32:
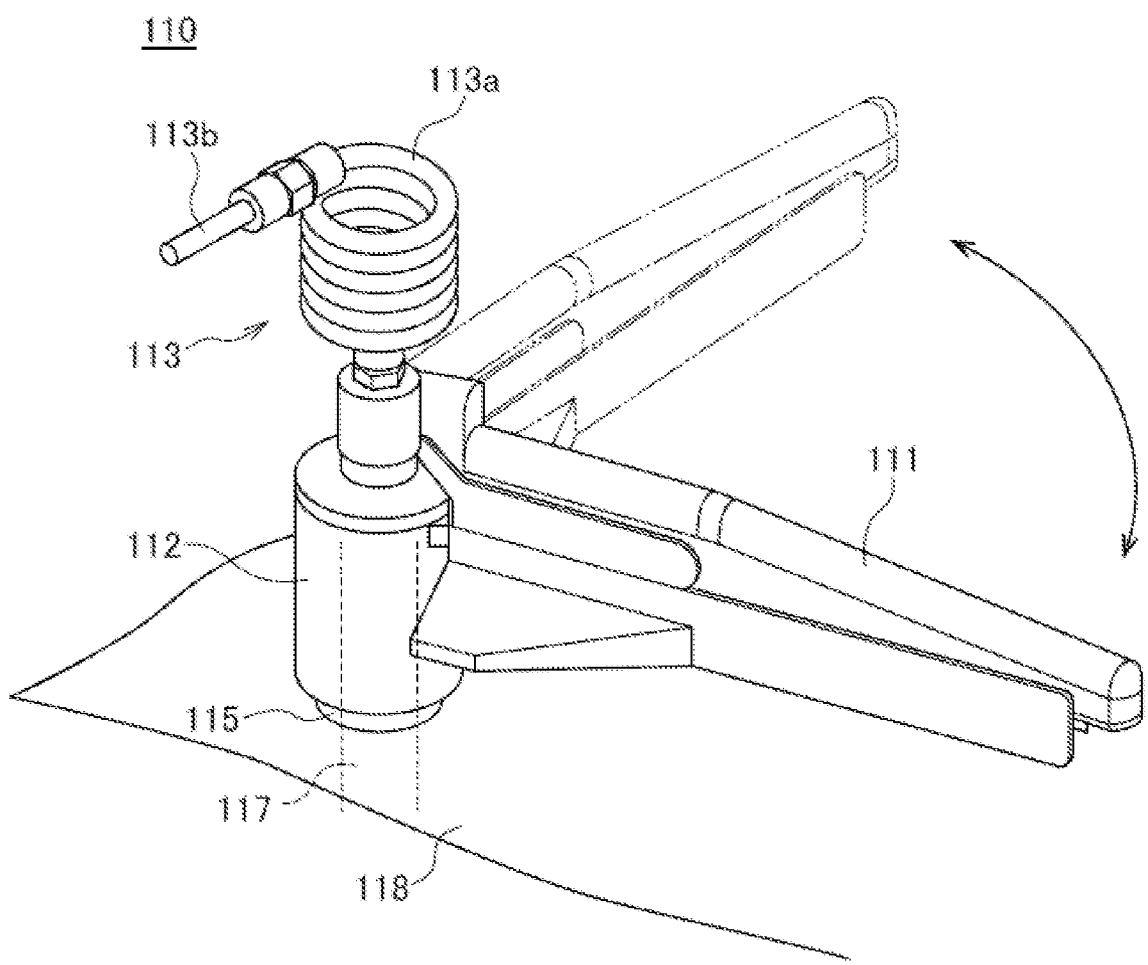
FIG. 32 is an enlarged perspective view illustrating an atomizer of the first polishing device.
Figure 33:
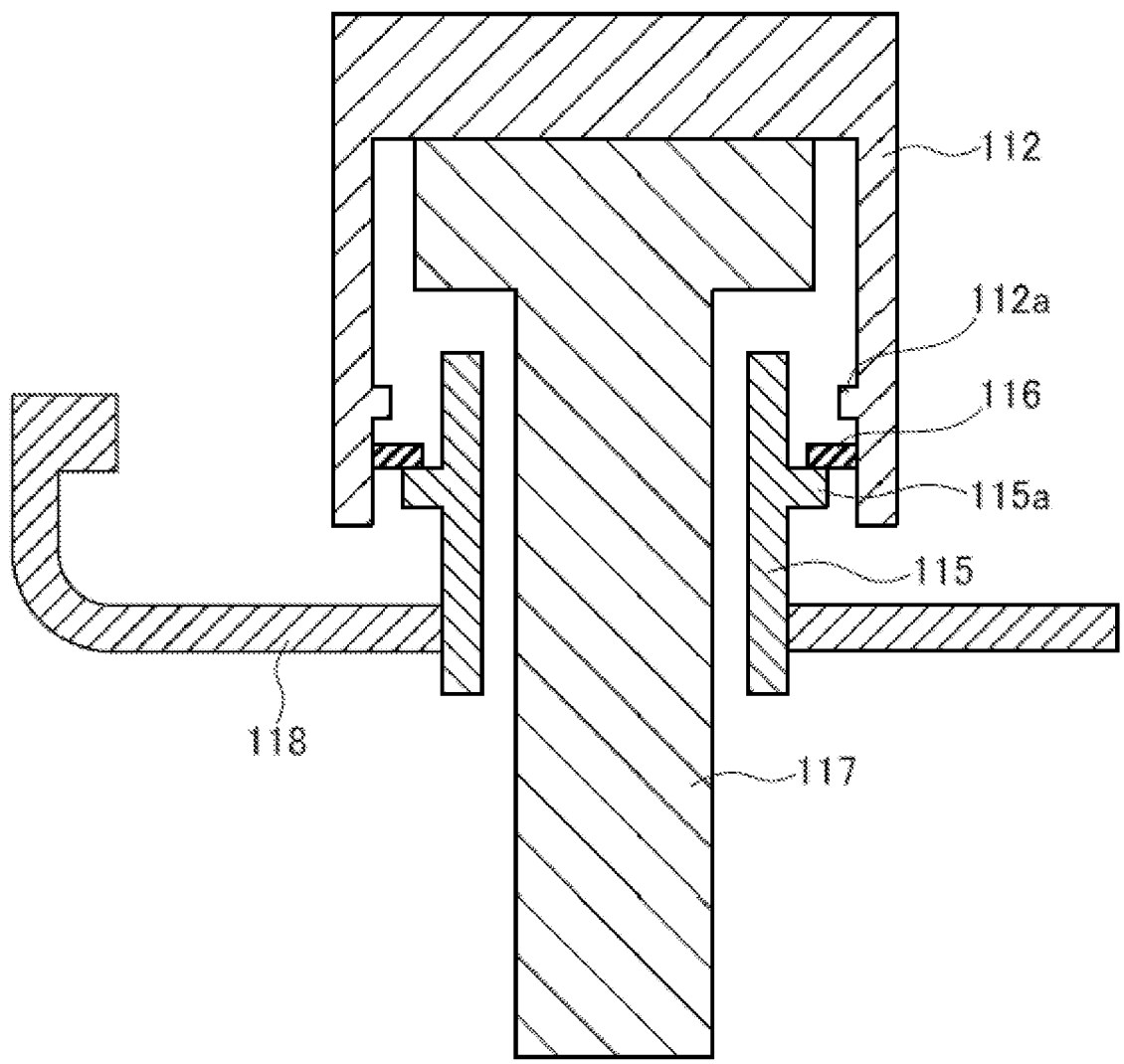
FIG. 33 is a longitudinal cross-sectional view of a swing shaft portion of the atomizer illustrated in FIG. 32.

FIG. 32 is an enlarged perspective view illustrating an atomizer 110 of the first polishing device 21a. FIG. 33 is a longitudinal cross-sectional view of a swing shaft portion of the atomizer 110 illustrated in FIG. 32.

As illustrated in FIGS. 32 and 33, the atomizer 110 has an arm 111 formed with one or more of injection holes at a lower part, a fluid passage 113 connected to the arm 111, and a swing shaft 117 configured to support the arm 111.

The arm 111 is, as shown in FIG. 32, turnable (swingable) around an axis of the swing shaft 117, between a cleaning position and a retracted position. A movable angle of the arm 111 is, for example, about 60°. The arm 111 is normally at the cleaning position, and arranged along the radial direction of the polishing surface of the polishing pad 102a. The swing shaft 117 is connected with a rotating mechanism (not shown), and the rotating mechanism turns the arm 111.

The fluid passage 113 has a coil tube 113a connected to the arm 111, and a fluid-supply pipe 113b connected to the coil tube 113a. An end part of the fluid-supply pipe 113b is fixed to a wall surface of the housing. The coil tube 113a has a wound coil-like shape. The coil tube 113a may be wound along the axis of the swing shaft 117. Although an end part on the arm 111 side of the coil tube 113a is also swung when the arm 111 swung between the cleaning position and the retracted position, the swing of the end part is absorbed inside the coil tube 113a, and is not be transmitted to an end part on the fluid-supply pipe 113b side. This can reduce stress applied to the fluid-supply pipe 113b in swinging of the arm 111.

As illustrated in FIGS. 32 and 33, an abrasive-liquid receiving tray 118 is disposed below the arm 111, and a bottom surface of the abrasive-liquid receiving tray 118 is vertically provided with a cylindrical first swing-shaft cover 115.

The swing shaft 117 is provided passing inside the first swing-shaft cover 115 from below the abrasive-liquid receiving tray 118 and projecting above the abrasive-liquid receiving tray 118, and an upper end of the swing shaft 117 is surrounded by a cylindrical second swing-shaft cover 112.

As illustrated in FIG. 33, inside the second swing-shaft cover 112 is inserted with a ring 116, along an inner peripheral surface of the second swing-shaft cover 112. An inner diameter of the ring 116 is formed to be larger than an outer diameter of the first swing-shaft cover 115 and smaller than an outer diameter of a seat part 115a, and the first swing-shaft cover 115 is positioned to pass through the ring 116. On an outer peripheral surface of the first swing-shaft cover 115, the seat part 115a is provided projecting radially outward, and the ring 116 is placed and supported on the seat part 115a. Since the inner diameter of the ring 116 is larger than the outer diameter of the first swing-shaft cover 115, the ring 116 can be radially moved with respect to the first swing-shaft cover 115. Moreover, the inner peripheral surface of the second swing-shaft cover 112 may be provided with a rib 112a projecting radially inside, for preventing lifting of the ring 116.

Here, the swing shaft 117 and the second swing-shaft cover 112, which are components on the atomizer 110 side, are assembled such that high position accuracy can be ensured. Whereas, the abrasive-liquid receiving tray 118 and the first swing-shaft cover 115, which are abrasive-liquid receiving components, are standard resin-processed products, and are not expected to have high position accuracy. Accordingly, there may be a misalignment between center axes of the first and second swing-shaft covers 115 and 112.

Against this, in this embodiment, the ring 116 is inserted along the inner peripheral surface of the second swing-shaft cover 112, and the ring 116 is placed on the seat part 115a provided on the outer peripheral surface of the first swing-shaft cover 115, so that the ring 116 seals a gap between the outer peripheral surface of the first swing-shaft cover 115 and the inner peripheral surface of the second swing-shaft cover 112, even when there is a misalignment between the center axes of the first and second swing-shaft covers 115 and 112. This can prevent mist from entering inside the second swing-shaft cover 112, from below the second swing shaft cover 112.

As can be seen, with reference to FIG. 1, by considering that the slurry is used in polishing, the polishing part 12 is the dirtiest (most contaminated) area. Therefore, in this embodiment, the first polishing device 21a, the second polishing device 21b, the third polishing device 21c, and the fourth polishing device 21d are evacuated from a periphery of each polishing table so as to prevent particles in the polishing part 12 from scattering outside. Further, a pressure inside the polishing part 12 is made more negative than that of outside the apparatus, the cleaning part 13, the loading/unloading part 11, and the transporting part 14 at periphery, preventing scatter of the particles. Normally, there are provided an exhaust duct (not shown) below the polishing table respectively, and a filter (not shown) above the polishing table, and cleaned air is jetted through the exhaust duct and the filter, to form a downflow.

As illustrated in FIG. 1, the top ring 25a of the first polishing device 21a is moved between a polishing position and a first substrate-transport position TP1 by a swing operation of a top-ring head, and the wafer is transferred to the first polishing device 21a at the first substrate-transport position TP1. Similarly, a top ring 25b of the second polishing device 21b is moved between a polishing position and a second substrate-transport position TP2 by a swing operation of a top-ring head, and the wafer is transferred to the second polishing device 21b at the second substrate-transport position TP2; a top ring 25c of the third polishing device 21c is moved between a polishing position and a third substrate-transport position TP3 by a swing operation of a top-ring head, and the wafer is transferred to the third polishing device 21c at the third substrate-transport position TP3; and a top ring 25d of the fourth polishing device 21d is moved between a polishing position and a fourth substrate-transport position TP4 by a swing operation of a top-ring head, and the wafer is transferred to the fourth polishing device 21d at the fourth substrate-transport position TP4.

The polishing-part transport mechanism 22 has a first transport unit 24a configured to transport the wafer W to the first polishing unit 20a, a second transport unit 24b configured to transport the wafer W to the second polishing unit 20b, and a transport robot 23 disposed between the first and the second transport units 24a and 24b, and configured to transfer the wafer between the transporting part 14, and the first and second transport units 24a and 24b. In the illustrated example, the transport robot 23 is disposed in a substantially center of a housing of the substrate processing apparatus 10.

Figure 5:
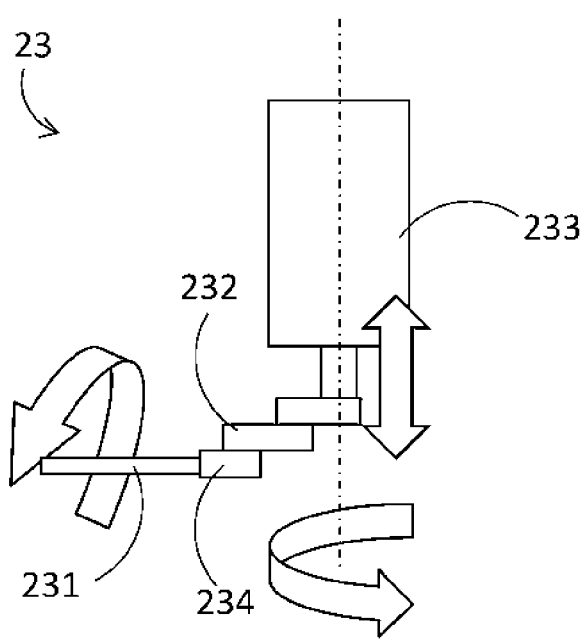
FIG. 5 is a side view of a transport robot of the substrate processing apparatus illustrated in FIG. 1.

FIG. 5 is a side view illustrating the transport robot 23. As illustrated in FIG. 5, the transport robot 23 has a hand 231 configured to hold the wafer W, a reversing mechanism 234 configured to vertically reverse the hand 231, an arm 232 configured to support the hand 231 and capable of being extended and retracted, and a robot main body 233 including an arm-vertical-moving mechanism configured to vertically move the arm 232, and an arm-rotating mechanism configured to rotate the arm 232 around a vertical axis. The robot main body 233 is mounted to be suspended with respect to a ceiling frame of the polishing part 12.

In this embodiment, the hand 231 can have access to the slide stage 42 from the carry-out port 41b of the transporting part 14. The hand 231 can also have access to the first and second transport units 24a and 24b of the polishing part 12. Consequently, wafers W successively transported from the transporting part 14 to the polishing part 12 are distributed to the first transport unit 24a and the second transport unit 24b by the transport robot 23.

Figure 6:
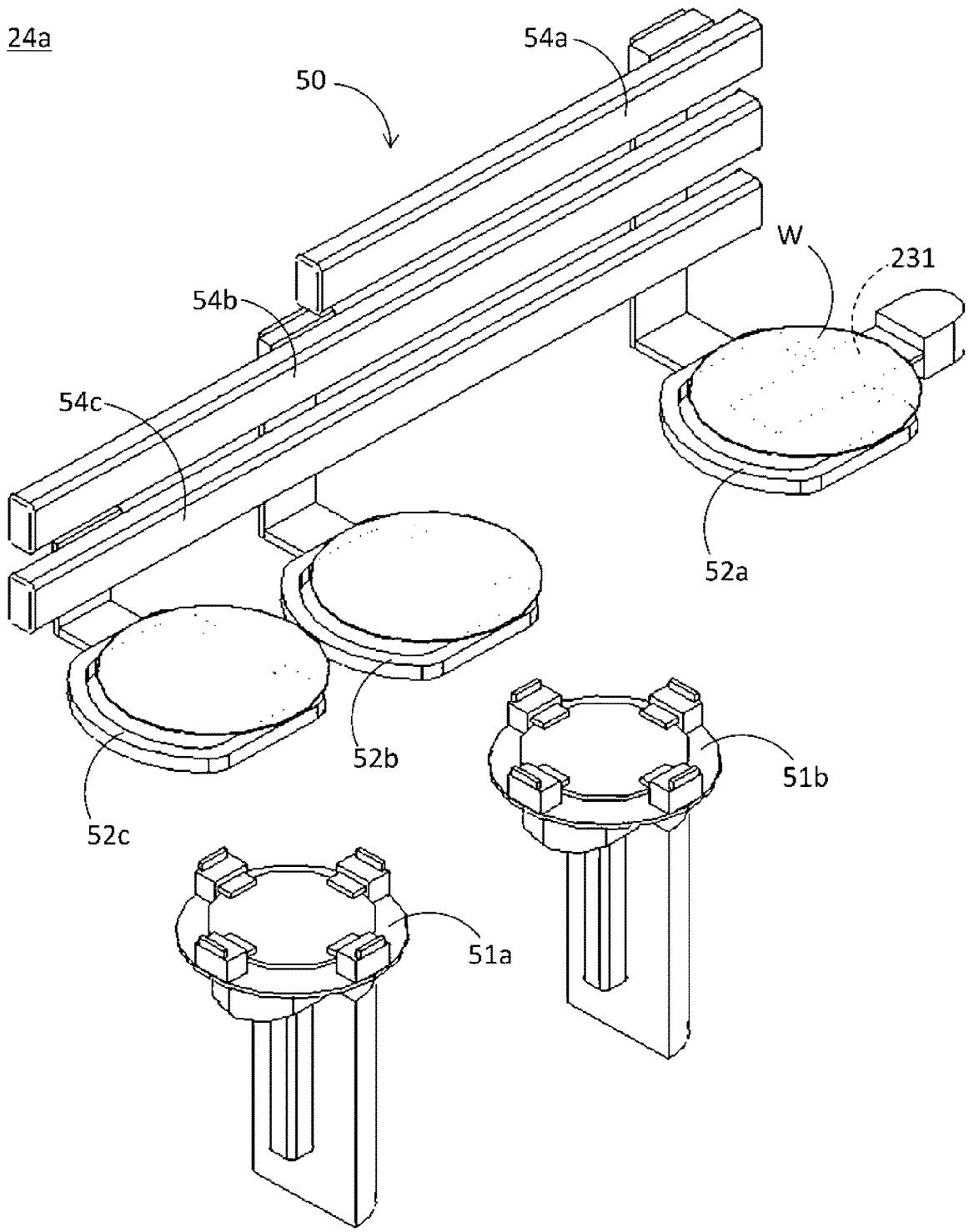
FIG. 6 is a perspective view illustrating first transport mechanism of the substrate processing apparatus illustrated in FIG. 1.

Since the second transport unit 24b has a similar configuration as the first transport unit 24a, the first transport unit 24a is described below. FIG. 6 is a perspective view illustrating the first transport unit 24a.

As illustrated in FIG. 6, the first transport unit 24a has a first pusher 51a disposed at the first substrate-transport position TP1 for the first polishing device 21a, and configured to vertically move; a second pusher 51b disposed at the second substrate-transport position TP2 for the second polishing device 21b, and configured to vertically move; and an exchanger 50 having a first stage 52a, a second stage 52b, and a third stage 52c that are configured to horizontally move between the first substrate-transport position TP1 and the second substrate-transport position TP2, independently from each other.

Among these, the first pusher 51a transfers the wafer W held by any of the first to third stages 52a to 52c to the top ring 25a of the first polishing device 21a, and transfers the wafer W polished at the first polishing device 21a to any of the first to third stages 52a to 52c. Moreover, the second pusher 51b transfers the wafer W held by any of the first to third stages 52a to 52c to the top ring 25b of the second polishing device 21b, and transfers the wafer W polished at the second polishing device 21b to any of the first to third stages 52a to 52c. Thus, the first pusher 51a and the second pusher 51b function as a transfer mechanism that transfers the wafer W between the exchanger 50 and each of the top rings. Since the second pusher 51b has a similar structure as the first pusher 51a, only the first pusher 51a is described in the description below.

Figure 7:
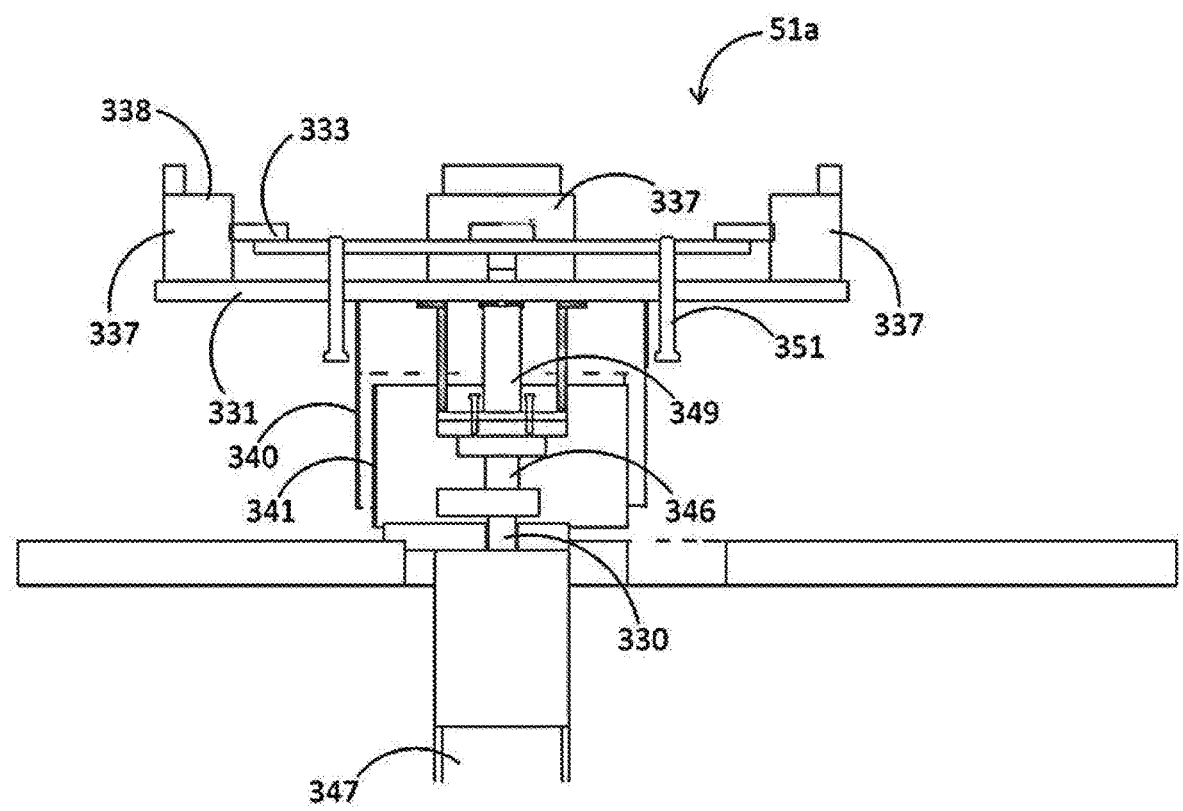
FIG. 7 is a longitudinal cross-sectional view illustrating a first pusher of the first transport mechanism illustrated in FIG. 6.

FIG. 7 is a longitudinal cross-sectional view illustrating the first pusher 51a. As illustrated in FIG. 7, the first pusher 51a is provided with a guide stage 331 configured to hold the top ring of the first polishing device 21a, and a push stage 333 configured to hold a wafer W. On an outermost periphery of the guide stage 331, four top ring guides 337 are installed. An upper-stage part 338 of each of the top ring guides 337 is an access part to a lower surface of a guide ring (that surrounds the outer periphery of the wafer W, and is not shown) of the top ring. The upper-stage part 338 is formed with a taper (preferably about 25° to 35°) for introducing of the top ring. In unloading a wafer, a wafer edge is directly received by the top ring guide 337.

On a back surface of the guide stage 331, a guide sleeve 340 having waterproofness is installed. Inside the guide sleeve 340, a center sleeve 341 for waterproofing of the pusher is installed.

In order to provide a positioning mechanism to the top ring guide 337, there is disposed a linear way 346 configured to move in directions of horizontal X axis and Y axis, to center the guide stage 331. The guide stage 331 is fixed to the linear way 346. This linear way 346 has a structure capable of being returned to a center position by pressurization. This structure realizes centering of the guide stage 331. Alternatively, the linear way 346 is capable of being returned to the center position only by a spring inside the linear way 346, without pressurization.

The linear way 346 is fixed to a shaft 330, and the shaft 330 is connected to a cylinder 347 having a ball spline mechanism. By driving a motor, which is not shown, the cylinder 347 is driven, and the guide stage 331 is vertically moved via the shaft 330.

The push stage 333 is disposed above the guide stage 331, and the center of the push stage 333 is provided with an electric actuator 349 configured to vertically move the push stage 333 with respect to the guide stage 331. The push stage 333 is vertically moved by the electric actuator 349, and loads a wafer W to the top ring. In this embodiment, the push stage 333 is driven by the electric actuator 349, allowing the push stage 333 to be positioned at a desired height position. This enables, as a preliminary operation, setting of the push stage 333 into a standby state immediately below the wafer W in receiving the wafer W at the push stage 333, enabling reduction of time required for a receiving operation. An end of the push stage 333 is disposed with a compression spring 351 for positioning.

In order to prevent reverse contamination to a wafer from slurry or the like attached to a pusher, there is separately installed a cleaning nozzle for cleaning dirt. In some cases, there is separately installed a wafer presence/absence sensor for checking presence/absence of a wafer on the pusher.

As illustrated in FIG. 6, the exchanger 50 has the first stage 52a, the second stage 52b, and the third stage 52c that are vertically arranged in multiple stages. In the illustrated example, the first stage 52a is arranged at a lower stage, the second stage 52b is arranged at a middle stage, and the third stage 52c is arranged at an upper stage. Although the first stage 52a, the second stage 52b, and the third stage 52c are moved on a same axis passing the first and second substrate-transport positions TP1 and TP2 in a plan view, the first stage 52a, the second stage 52b, and the third stage 52c are freely movable without interfering with each other, since their installed heights are different.

As illustrated in FIG. 6, the first stage 52a is provided with a first stage drive mechanism 54a configured to linearly move the first stage 52a in a uniaxial direction, the second stage 52b is provided with a second stage drive mechanism 54b configured to linearly move the second stage 52b in the uniaxial direction, and the third stage 52c is provided with a third stage drive mechanism 54c configured to linearly move the third stage 52c in the uniaxial direction. As the first to third stage drive mechanisms 54a to 54c, for example, an electric actuator, or a motor drive mechanism using a ball screw is used. The first to third stages 52a to 52c are movable in different timings and different directions, by receiving power from different drive mechanisms, respectively first to third stage drive mechanisms 54a to 54c.

Figure 10:
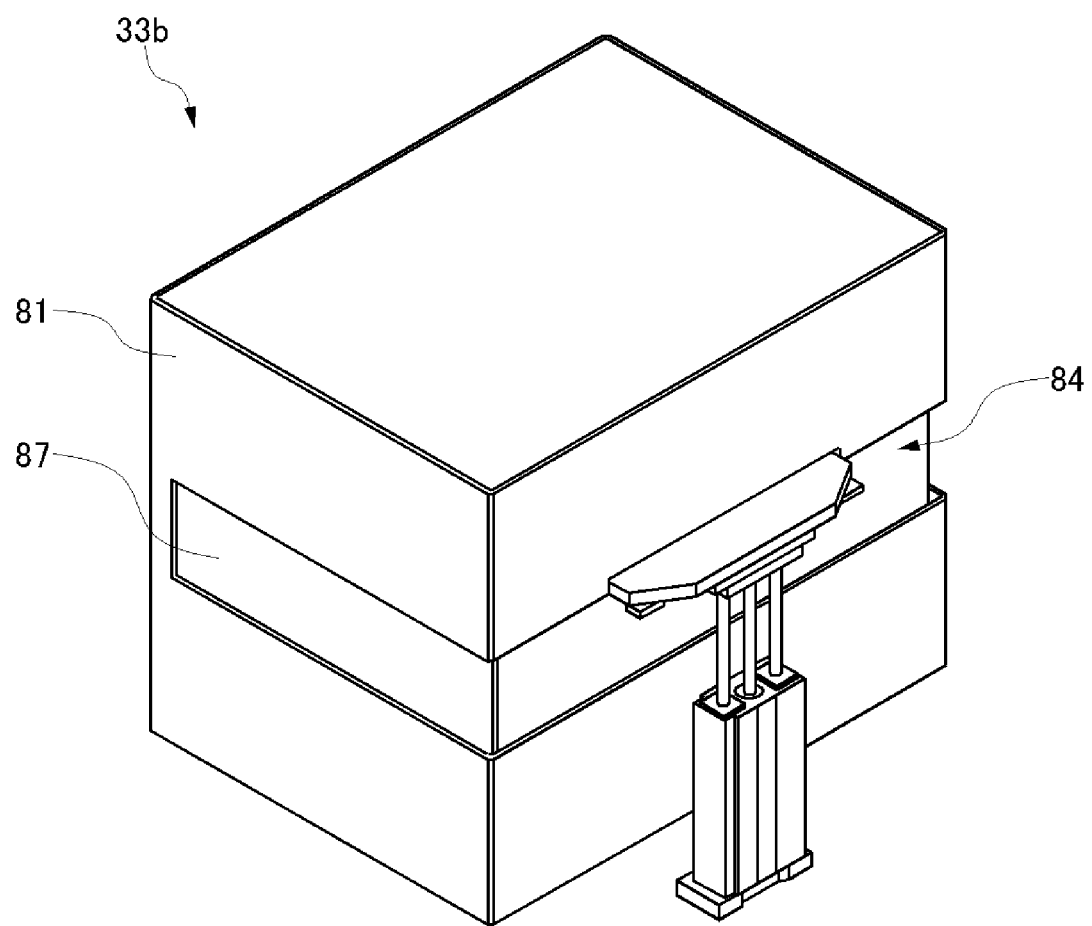
FIG. 10 is a perspective view illustrating a second wafer station of the cleaning part illustrated in FIG. 2.

Since the second stage 52b and the third stage 52c have a similar configuration as the first stage 52a, the first stage 52a is described below. FIG. 10 is a plan view illustrating the first stage 52a.

As illustrated in FIG. 6, the first stage 52a has a U-shape in plan view, having an opening on one side in a direction of linear-moving with the first stage drive mechanism 54a (right depth side in FIG. 6). Thus, when the first stage 52a is disposed at the first substrate-transport position TP1, the first pusher 51a can vertically move to pass inside the first stage 52a. Even when the first pusher 51a is passing inside the first stage 52a, the first stage 52a can move to another side in the direction of linear-moving (left front side in FIG. 6).

Although not shown, the first stage 52a is provided with four pins projecting upward. Thus, the wafer that is placed on the first stage 52a is supported on the first stage 52a with its outer peripheral edge guided and positioned by the four pins. These pins are formed of a resin such as a polypropylene (PP), a polychlorotrifluoroethylene (PCTFE), or a polyetheretherketone (PEEK).

Next, an example of an operation of the first pusher 51a and the exchanger 50 that are configured as described above is described.

Firstly, in loading a wafer, the first stage 52a of the exchanger 50 transports a wafer W to above the first pusher 51a. When the top ring 25a of the first polishing device 21a does not hold a wafer W while being located at a wafer-loading position (the first substrate-transport position TP1) above the first pusher 51a, the cylinder 347 lifts up a set of components around the guide stage 331. While being lifted, the guide stage 331 passes inside the first stage 52a. At this time, the guide stage 331 centers the wafer W with a taper of the top ring guide 337 at the same time as passing, and holds a pattern surface (except an edge) of the wafer W with the push stage 333.

While the push stage 333 holds the wafer W, the top ring guide 337 ascends without stopping, and the guide ring is taken in by a taper 338a of the top ring guide 337. When the guide stage 331 is centered to the top ring by positioning with the linear way 346 that is freely movable in X and Y directions, and the upper-stage part 338 of the top ring guide 337 comes in contact with the lower surface of the guide ring, lifting of the guide stage 331 is finished.

Contacting and fixing of the upper-stage part 338 of the top ring guide 337 to the lower surface of the guide ring prevent further lifting of the guide stage 331. At this time, the push stage 333 is further lifted up by the electric actuator 349. At this time, the push stage 333 holds the pattern surface (except the edge) of the wafer W and transports the wafer W to the top ring. After the top ring completes suction of the wafer W, the first pusher 51a starts descending, and the operation is completed at the end of the descending.

In this embodiment, since the first stage 52a has the U-shape in plan view, having the opening on one side in the direction of linear-moving (right depth side in FIG. 6), the first stage 52a can move to another side in the moving direction (left front side in FIG. 6), even before the first pusher 51a starts descending. This eliminates necessity of waiting for the first pusher 51a to descend in moving the first stage 52a, improving a throughput of the process.

Next, in unloading a wafer, the top ring transports the wafer W to a wafer-unloading position above the first pusher 51a. When the first stage 52a of the exchanger 50 is not mounted with a wafer while being located above the first pusher 51a, the cylinder 347 lifts up the set of components around the guide stage 331, and the guide ring is taken in with the taper of the top ring guide 337. When the guide stage 331 is centered to the top ring by positioning with the linear way 346, and the upper-stage part 338 of the top ring guide 337 comes into contact with the lower surface of the guide ring, and the lifting of the guide stage 331 is finished.

While the electric actuator 349 lifts the push stage 333, the push stage 333 is prevented from being positioned higher than the wafer holding part of the top ring guide 337. When the lifting by the electric actuator 349 is finished, the wafer W is released from the top ring. At this time, a lower taper of the top ring guide 337 centers the wafer W, the top ring guide 337 holds an edge portion. When the first pusher 51a holds the wafer W, the first pusher 51a starts descending. In descending, the guide sleeve 340 and the center sleeve 341 perform centering of the guide stage 331 that has moved its center position to be centered to the top ring. While descending, the first pusher 51a transfers the wafer W to the first stage 52a with an edge portion of the wafer W, and the operation is completed at the end of descending.

<Cleaning Part>

As illustrated in FIGS. 1 and 2, the cleaning part 13 is an area for cleaning a polished wafer, and has a first cleaning unit 30a and a second cleaning unit 30b that are vertically arranged in two stages. The transporting part 14 described above is disposed between the first cleaning unit 30a and the second cleaning unit 30b. The vertically superposed arrangement of the first cleaning unit 30a, the transporting part 14, and the second cleaning unit 30b provides an advantage of a small footprint.

As illustrated in FIGS. 1 and 2, the first cleaning unit 30a has a plurality of (four in the illustrated example) cleaning modules 311a, 312a, 313a, and 314a, a wafer station 33a, and a cleaning-part transport mechanism. 32a configured to transport a wafer W between the wafer station 33a and each of the cleaning modules 311a to 314a. The plurality of cleaning modules 311a to 314a and the wafer station 33a are arranged in series along the longitudinal direction of the substrate processing apparatus 10. Each upper portion of the cleaning modules 311a to 314a is provided with a filter fan unit (not shown) having a clean air filter, and the filter fan unit always downwardly blows clean air, from which particles have been removed. Inside the first cleaning unit 30a is always maintained at a higher pressure than the polishing part 12, in order to prevent an inflow of particles from the polishing part 12.

Similarly, the second cleaning unit 30b has a plurality of (four in the illustrated example) cleaning modules 311b, 312b, 313b, and 314b, a wafer station 33b, and a cleaning-part transport mechanism 32b configured to transport a wafer W between the wafer station 33b and each of the cleaning modules 311b to 314b. The plurality of cleaning modules 311b to 314b and the wafer station 33b are arranged in series along the longitudinal direction of the substrate processing apparatus 10. Each upper portion of the cleaning modules 311b to 314b is provided with a filter fan unit (not shown) having a clean air filter, and the filter fan unit always downwardly blows clean air, from which particles have been removed. Inside the second cleaning unit 30b is always maintained at a higher pressure than the polishing part 12, in order to prevent an inflow of particles from the polishing part 12.

As described later (FIGS. 27 to 28E, and descriptions related to these), pre-cleaning modules 39a and 39b may be further provided in addition to cleaning modules 311a to 314a and 311b to 314b respectively.

Figure 8:
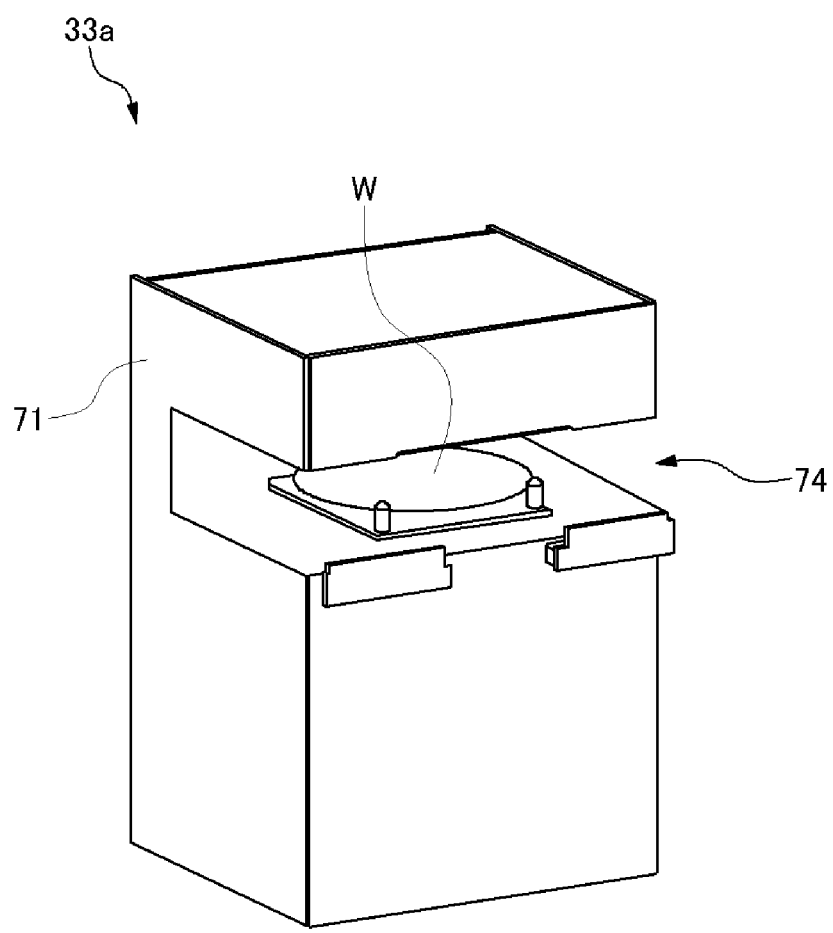
FIG. 8 is a perspective view illustrating a first wafer station of the cleaning part illustrated in FIG. 2.
Figure 9:
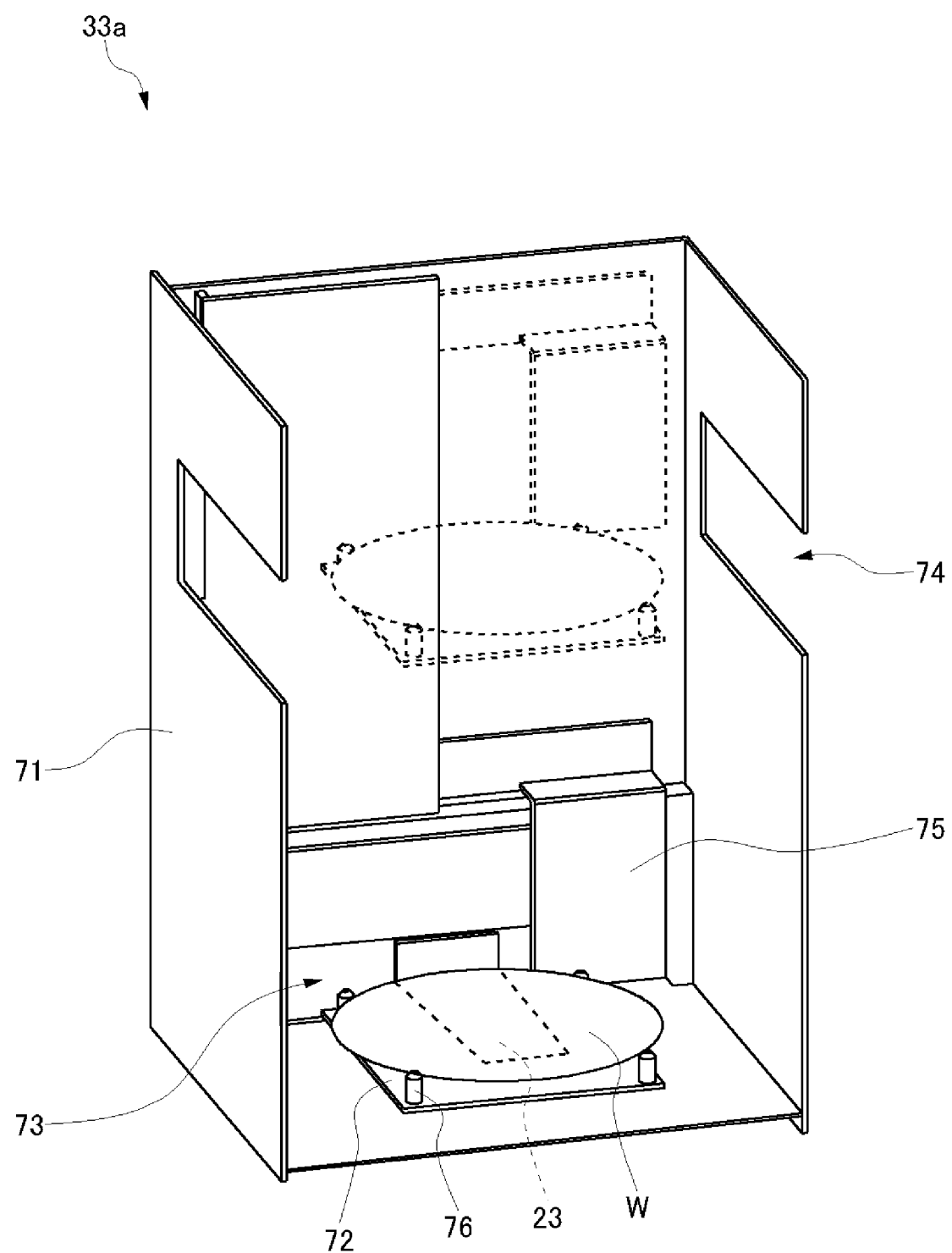
FIG. 9 is an exploded perspective view illustrating an internal configuration of the first wafer station illustrated in FIG. 8.

FIG. 8 is a perspective view illustrating the wafer station 33a of the first cleaning unit 30a. FIG. 9 is an exploded perspective view illustrating an internal configuration of this wafer station 33*a*. As illustrated in FIGS. 8 and 9, the wafer station 33*a* has a casing 71 having a substantially rectangular parallelepiped shape, a stage 72 disposed inside the casing 71 and configured to hold a wafer W, and a drive mechanism 75 configured to vertically move the stage 72.

Among these, the casing 71 has a bottom plate, four side plates, and a top plate. As illustrated in FIG. 9, a lower end section of a side plate facing the polishing part 12, among the four side plates, is formed with a carry-in port 73 that is communicated with the polishing part 12. The carry-in port 73 can be opened and closed by a shutter, which is not shown. As illustrated in FIG. 9, the transport robot 23 of the polishing part 12 can have access to inside the casing 71 from the carry-in port 73.

Additionally, as illustrated in FIG. 8, there is formed an arm-passage opening 74 for passing arms of the cleaning-part transport mechanism 32*a* at a height position, which is higher than the carry-in port 73, of the other three side plates (i.e. a side plate facing the cleaning-part transport mechanism. 32*a*, which is described later, and side plates on left and right) among the four side plates. The arm-passage opening 74 can be opened and closed by a shutter, which is not shown. As illustrated in FIGS. 8 and 9, the cleaning-part transport mechanism 32*a* of the first cleaning unit 30*a* can have access to inside the casing 71 from the arm-passage opening 74.

As the drive mechanism 75, for example, a motor drive mechanism using a ball screw or an air cylinder is used. The stage 72 is fixed to a movable part of the drive mechanism 75, and moved vertically between a height positions facing the carry-in port 73 and facing the arm-passage opening 74, by power applied from the drive mechanism 75 (refer to FIG. 9).

On an outer periphery of the stage 72, four pins 76 projecting upward are provided. Thus, the wafer W that is placed on the stage 72 is supported on the stage 72 with its outer peripheral edge guided and positioned by the four pins 76. These pins 76 are formed of a resin such as a polypropylene (PP), a polychlorotrifluoroethylene (PCTFE), or a polyetheretherketone (PEEK).

Figure 11:
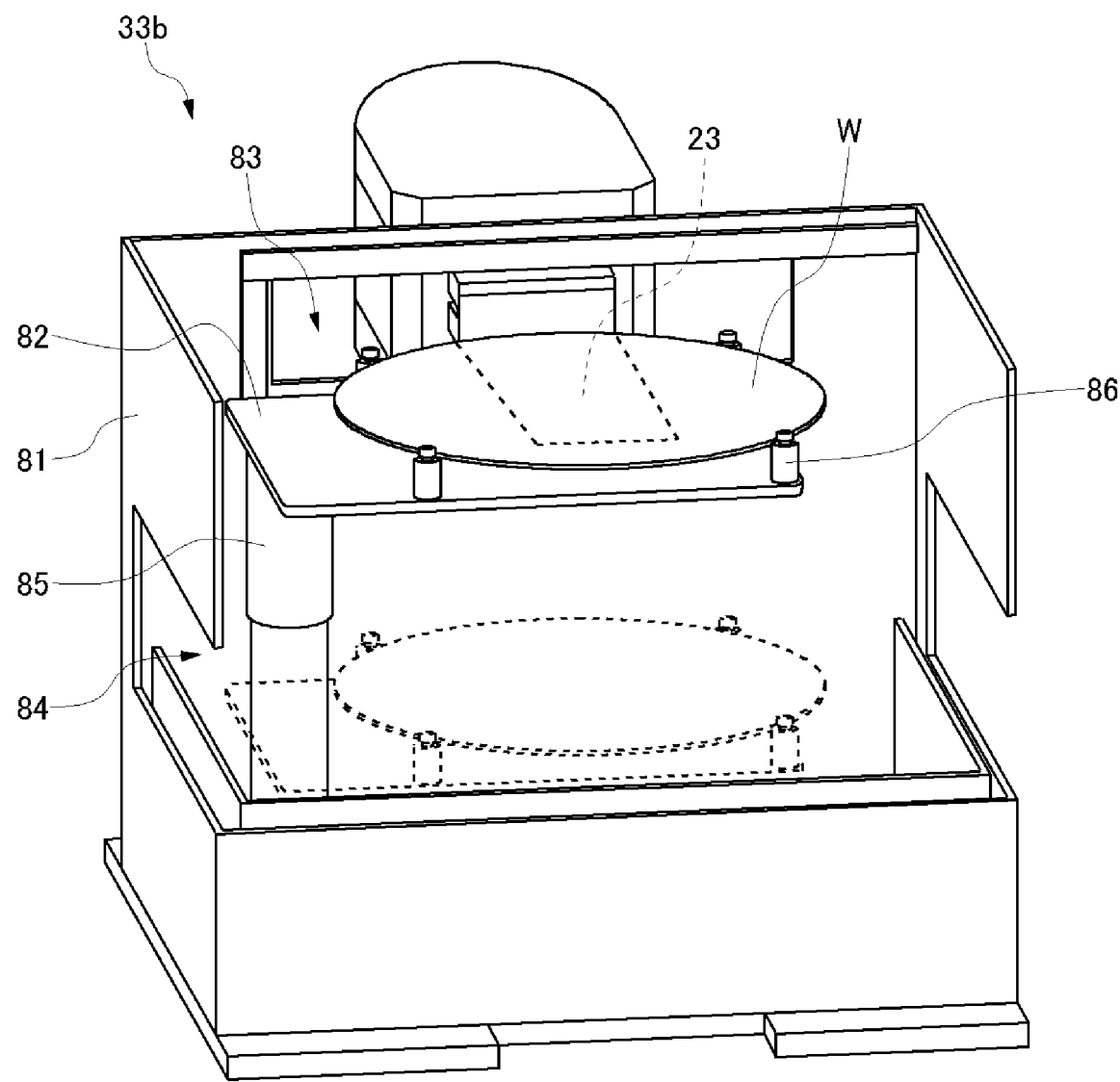
FIG. 11 is an exploded perspective view illustrating an internal configuration of the second wafer station illustrated in FIG. 10.

FIG. 10 is a perspective view illustrating the wafer station 33*b* of the second cleaning unit 30*b*. FIG. 11 is an exploded perspective view illustrating an internal configuration of this wafer station 33*b*. As illustrated in FIGS. 10 and 11, the wafer station 33*b* has a casing 81 having a substantially rectangular parallelepiped shape, a stage 82 disposed inside the casing 81 and configured to hold a wafer W, and a drive mechanism 85 configured to vertically move the stage 82.

Among these, the casing 81 has a bottom plate, four side plates, and a top plate. As illustrated in FIG. 11, an upper end section of a side plate facing the polishing part 12, among the four side plates, is formed with a carry-in port 83 that is communicated with the polishing part 12. The carry-in port 83 can be opened and closed by a shutter, which is not shown. As illustrated in FIG. 11, the transport robot 23 of the polishing part 12 can have access to inside the casing 81 from the carry-in port 83.

Additionally, as illustrated in FIG. 10, there is formed an arm-passage opening 84 for passing arms of the cleaning-part transport mechanism 32*b* at a height position, which is lower than the carry-in port 83, of the other three side plates (i.e. a side plate opposite to the polishing part 12, and side plates on left and right) among the four side plates. The arm-passage opening 84 can be opened and closed by a shutter 87. As illustrated in FIG. 11, the cleaning-part transport mechanism 32*b* of the second cleaning unit 30*b* can have access to inside the casing 81 from the arm-passage opening 84.

As the drive mechanism 85, for example, a motor drive mechanism using a ball screw, or an air cylinder is used. The stage 82 is fixed to a movable part of the drive mechanism 85, and moved vertically between a height positions facing the carry-in port 83 and facing the arm-passage opening 84, by power applied from the drive mechanism 85 (refer to FIG. 11).

On an outer periphery of the stage 82, four pins 86 projecting upward are provided. Thus, the wafer that is placed on the stage 82 is supported on the stage 82 with its outer peripheral edge guided and positioned by the four pins 86. These pins 86 are formed of a resin such as a polypropylene (PP), a polychlorotrifluoroethylene (PCTFE), or a polyetheretherketone (PEEK).

Since the cleaning modules 311*b* to 314*b* of the second cleaning unit 30*b* have similar configurations as the cleaning modules 311*a* to 314*a* of the first cleaning unit 30*a*, the cleaning modules 311*a* to 314*a* of the first cleaning unit 30*a* are described below.

As illustrated in FIGS. 1 and 2, the four cleaning modules 311*a* to 314*a* (hereinafter also referred to as primary to quaternary cleaning modules) are arranged in series in this order from the wafer station 33*a*. Each of the cleaning modules 311*a* to 314*a* has a cleaner, which is not shown, and a casing 91 configured to cover the cleaner.

As the cleaner of the primary cleaning module 311*a* and the secondary cleaning module 312*a*, for example, there can be used a roll-type cleaner that cleans front and back surfaces of a wafer by rotating roll type sponges vertically arranged, and pressing the sponges to the front and back surfaces of the wafer. As the cleaner of the tertiary cleaning module 313*a*, for example, there can be used a pencil-type cleaner that cleans by pressing a hemispherical sponge to a wafer while rotating the sponge. As the cleaner of the quaternary cleaning module 314*a*, for example, there can be used a pencil-type cleaner that can perform rinse cleaning of the back surface of a wafer, and cleans the front surface of the wafer by pressing a hemispherical sponge while rotating the sponge. This cleaner of the quaternary cleaning module 314*a* is provided with a stage configured to rotate a chucked wafer at a high speed, and has a function of drying a cleaned wafer by rotating the wafer at a high speed (spin-drying function). It should be noted that, in addition to the roll-type cleaner or the pencil-type cleaner described above, the cleaner of each of the cleaning modules 311*a* to 314*a* may be additionally provided with a megasonic-type cleaner that cleans by applying supersonic to cleaning liquid.

Each casing of the cleaning modules 311*a* to 314*a* has a bottom plate, four side plates, and a top plate, as with the casing 71 of the wafer station 33*a*. Among the four side plates, a side plate facing the cleaning-part transport mechanism 32*a*, and side plates on left and right are provided with an arm-passage opening 94 for passing arms of the cleaning-part transport mechanism 32*a* (see FIGS. 13A to 13E). The arm-passage opening 94 can be opened and closed by a shutter 97. A height position of this arm-passage opening 94 is at a same height as the height position of the arm-passage opening 74 of the wafer station 33*a*. The cleaning-part transport mechanism 32*a* can have access to inside the casing 91 from the arm-passage opening 94.

Since the cleaning-part transport mechanism 32*b* of the second cleaning unit 30*b* has a similar configuration as the cleaning-part transport mechanism 32*a* of the first cleaning unit 30a, the cleaning-part transport mechanism 32a of the first cleaning unit 30a is described below.

Figure 12:
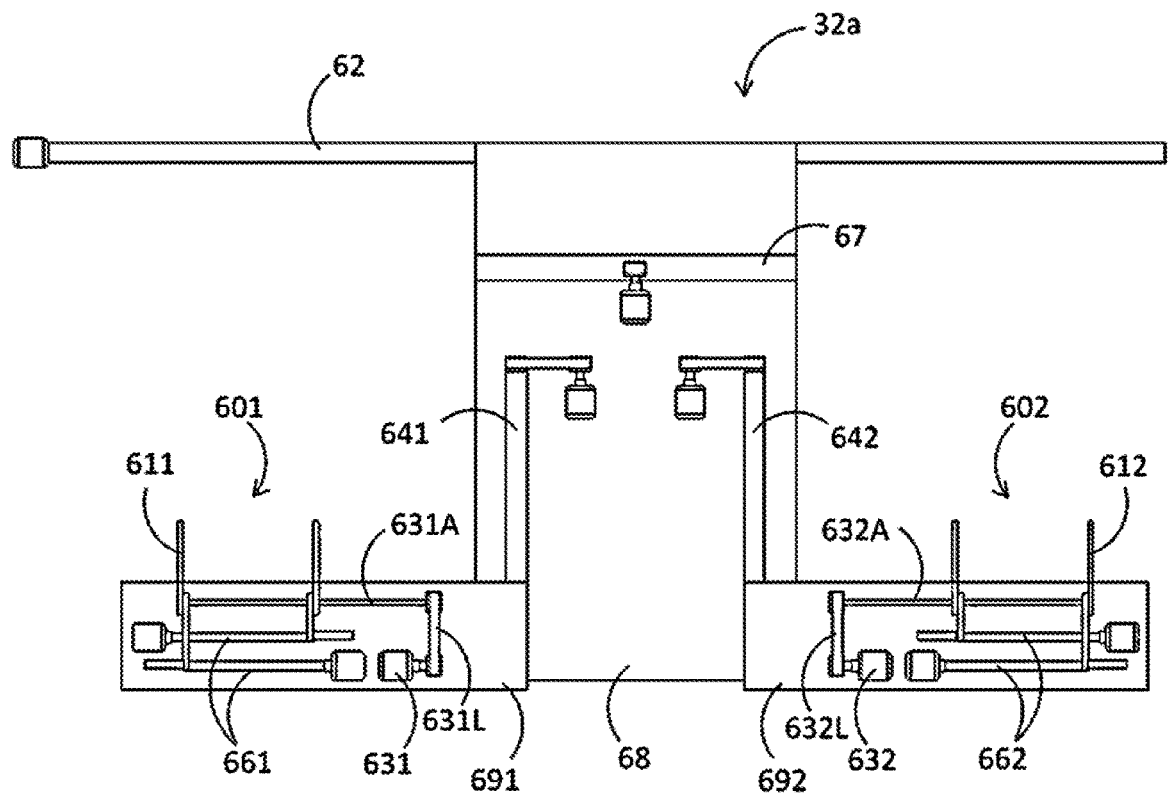
FIG. 12 is a perspective view illustrating a cleaning-part transport mechanism of a first cleaning unit of the cleaning part illustrated in FIG. 2.

FIG. 12 is a perspective view illustrating the cleaning-part transport mechanism 32a of the first cleaning unit 30a. As illustrated in FIG. 12, the cleaning-part transport mechanism 32a has a first wafer-holding mechanism 601 and a second wafer-holding mechanism 602 each configured to hold a wafer W, and an arm-transport mechanism 62 configured to move the first wafer-holding mechanism 601 and the second wafer-holding mechanism 602 linearly along an arrangement direction of the plurality of cleaning modules 311a to 314a. In this embodiment, namely, the number of the wafer-holding mechanisms 601 and 602 is less than the number of the cleaning modules 311a to 314a.

In this embodiment, for example, the first wafer-holding mechanism 601 and the second wafer-holding mechanism 602 can be properly used according to cleanliness of the wafer W. For example, among the primary to quaternary cleaning modules 311a to 314a, while the first wafer-holding mechanism 601 is used at the primary cleaning module 311a and the secondary cleaning module 312a of a first half of the cleaning process, the second wafer-holding mechanism 602 is used at the tertiary cleaning module 313a and the quaternary cleaning module 314a of a second half of the cleaning process, which can prevent contamination of the wafer W at the second half of the cleaning process due to contact with the first wafer-holding mechanism 601.

More specifically, the first wafer-holding mechanism 601 has a pair of openable/closable first arms 611 configured to hold a wafer, a first vertical-moving mechanism 641 configured to vertically move the pair of first arms 611, a first rotating mechanism 631 configured to rotate the pair of first arms 611 around a rotating shaft 631A that is in parallel with an opening/closing direction, and a first opening/closing mechanism 661 configured to open and close the pair of first arms 611 in a direction mutually approaching or a direction mutually separating.

Similarly, the second wafer-holding mechanism 602 has a pair of openable/closable second arms 612 configured to hold a wafer, a second vertical-moving mechanism 642 configured to vertically move the pair of second arms 612, a second rotating mechanism 632 configured to rotate the pair of second arms 612 around a rotating shaft 632A that is in parallel with an opening/closing direction, and a second opening/closing mechanism 662 configured to open and close the pair of second arms 612 in a direction mutually approaching or a direction mutually separating.

As the arm-transport mechanism 62, for example, a motor drive mechanism using a ball screw is used. As indicated in FIG. 12, the ball screw of the arm-transport mechanism 62 is provided to extend above the cleaning modules 311a to 314a, in the arrangement direction of the cleaning modules 311a to 314a.

To a ball screw of the arm-transport mechanism 62, a main frame 68 is mounted. The main frame 68 is mounted to be suspended downward from a ball screw of the arm-transport mechanism 62, and facing side surfaces of the cleaning modules 311a to 314a. By driving the motor connected to the ball screw of the arm-transport mechanism 62, the main frame 68 is linearly moved along the arrangement direction of the cleaning modules 311a to 314a, while facing the side surfaces of the cleaning modules 311a to 314a.

In the illustrated example, the main frame 68 has a depth-directional moving mechanism 67 for adjusting a position in the depth direction (a direction perpendicular to both the arrangement direction and the vertical direction of the cleaning modules 311a to 314a). As the depth-directional moving mechanism 67, for example, a motor drive mechanism using a rack and pinion is used. A position of the main frame 68 in the depth direction is adjusted by driving the depth-directional moving mechanism 67.

The first vertical-moving mechanism 641 and the second vertical-moving mechanism 642 are provided on the main frame 68. As the first vertical-moving mechanism 641 and the second vertical-moving mechanism 642, for example, a motor drive mechanism using a ball screw is used. As illustrated in FIG. 12, the ball screw of the first vertical-moving mechanism 641 is mounted to vertically extend at a left end part of the main frame 68, and the ball screw of the second vertical-moving mechanism 642 is mounted to vertically extend at a right end part of the main frame 68.

The ball screw of the first vertical-moving mechanism 641 is mounted with a first sub-frame 691 configured to support the pair of first arms 611. The first sub-frame 691 is provided adjacent to the main frame 68 on the left side of the main frame 68, and facing the side surfaces of the cleaning modules 311a to 314a. By driving the motor connected to the ball screw of the first vertical-moving mechanism 641, the first sub-frame 691 is linearly moved along the vertical direction.

Similarly, the ball screw of the second vertical-moving mechanism 642 is mounted with a second sub-frame 692 configured to support the pair of second arms 612. The second sub-frame 692 is provided adjacent to the main frame 68 on the right side of the main frame 68, and can face the side surfaces of the cleaning modules 311a to 314a. By driving the motor connected to the ball screw of the second vertical-moving mechanism 642, the second sub-frame 692 is linearly moved along the vertical direction.

Since the first sub-frame 691 and the second sub-frame 692 have a substantially similar structure, except being symmetric with respect to the main frame 68, the second sub-frame 692 is described below.

As illustrated in FIG. 12, the pair of second arms 612 are arranged in parallel with each other, and each base end of the second arms 612 is attached to the rotating shaft 632A rotatably provided on the second sub-frame 692. On the second sub-frame 692, there is provided the second rotating mechanism 632 configured to rotate the pair of second arms 612 around the rotating shaft 632A. As the second rotating mechanism 632, for example, motor drive mechanism is used. The rotating shaft of this second rotating mechanism 632 is connected to the rotating shaft 632A via a link member 632L. A rotational force of the second rotating mechanism 632 is transmitted to the rotating shaft 632A via the link member 632L, and the pair of second arms 612 are rotated around the rotating shaft 632A.

Moreover, on the second sub-frame 692, there is provided the second opening/closing mechanism 662 configured to open and close the pair of second arms 612 in a direction mutually separating or a direction mutually approaching. As the second opening/closing mechanism 662, for example, an air cylinder is used. When the second opening/closing mechanism 662 closes the pair of second arms 612, a peripheral edge of the wafer W is sandwiched and held between the pair of second arms 612.

Figure 14:
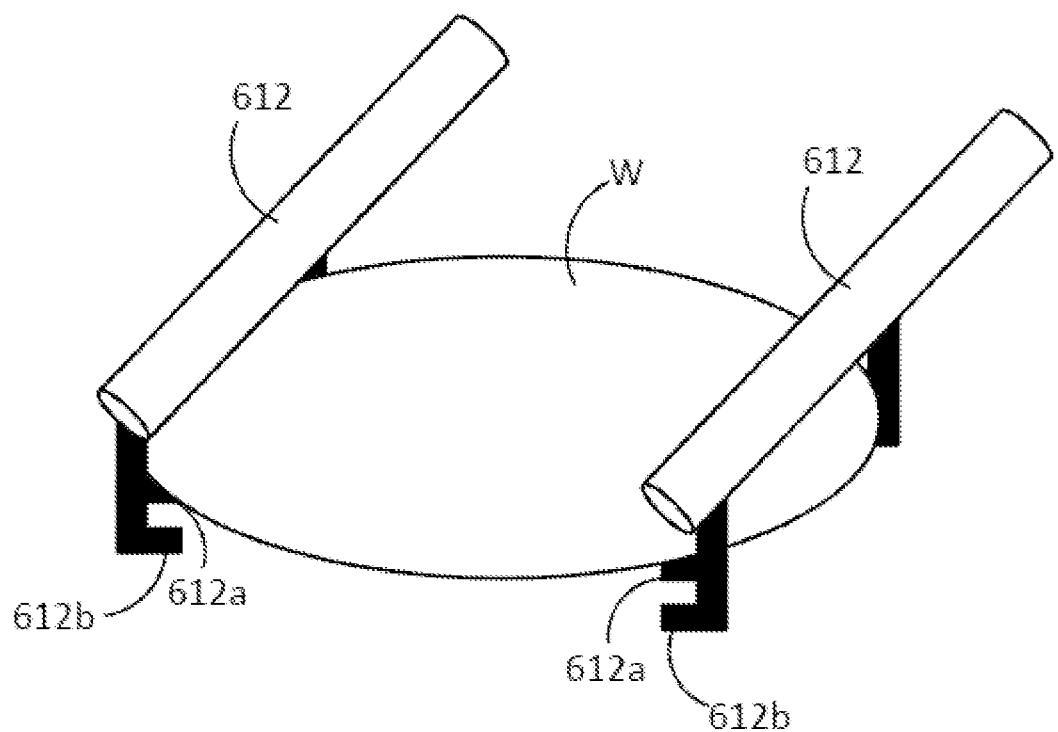
FIG. 14 is a perspective view illustrating a state where a substrate is held by the second wafer-holding mechanism of the cleaning-part transport mechanism illustrated in FIG. 12, with an upper chuck top.
Figure 15:
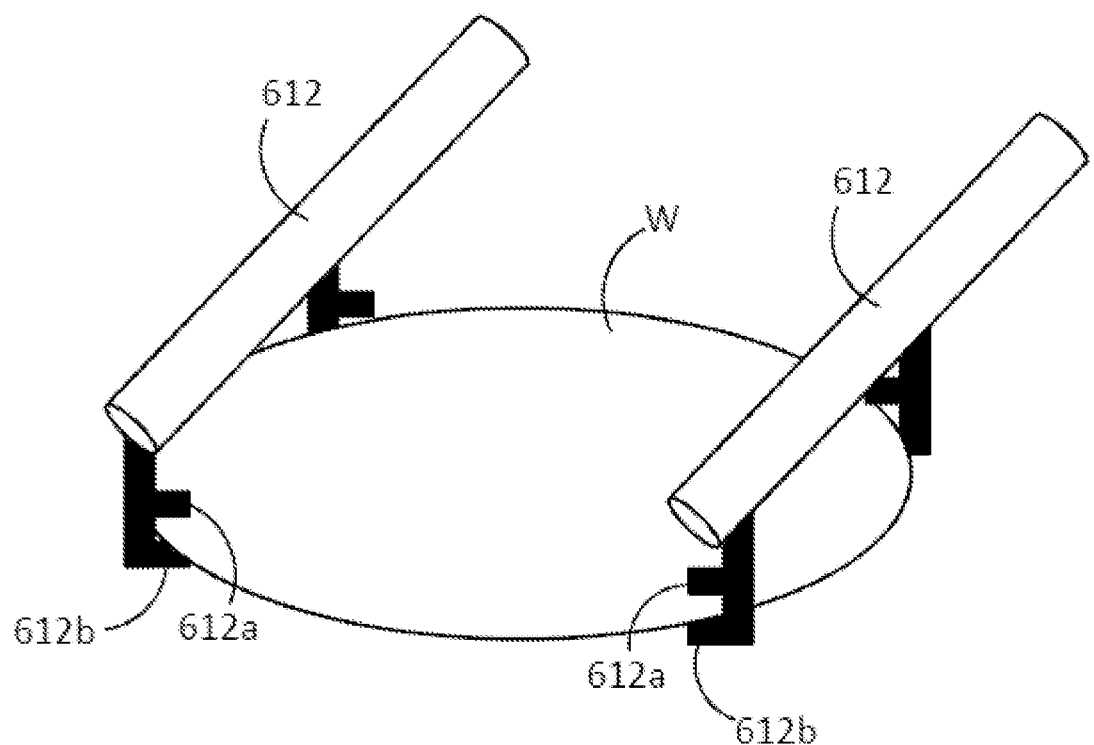
FIG. 15 is a perspective view illustrating a state where a substrate is held by the second wafer-holding mechanism of the cleaning-part transport mechanism illustrated in FIG. 12, with a lower chuck top.

As illustrated in FIGS. 14 and 15, the pair of second arms 612 are provided with chuck tops 612a and 612b capable of abutting to an outer periphery of the wafer W, vertically in two stages. For example, while an upper chuck top 612a holds the wafer W with relatively high cleanliness, a lower chuck top 612b holds the wafer with relatively low cleanliness, which can prevent contamination of the wafer W with high cleanliness due to contact with the lower chuck top 612b.

Next, an example of an operation of the pair of second arms 612 is described with reference to FIGS. 13A to 13E. As described above, each of the cleaning modules is partitioned by the casing 91 so as to prevent an external splash of fluid to be used during cleaning of the wafer W, and the arm-passage opening 94 is formed on a side surface of the casing 91. The arm-passage opening 94 is provided with the shutter 97 that can be opened and closed.

Figure 13A:
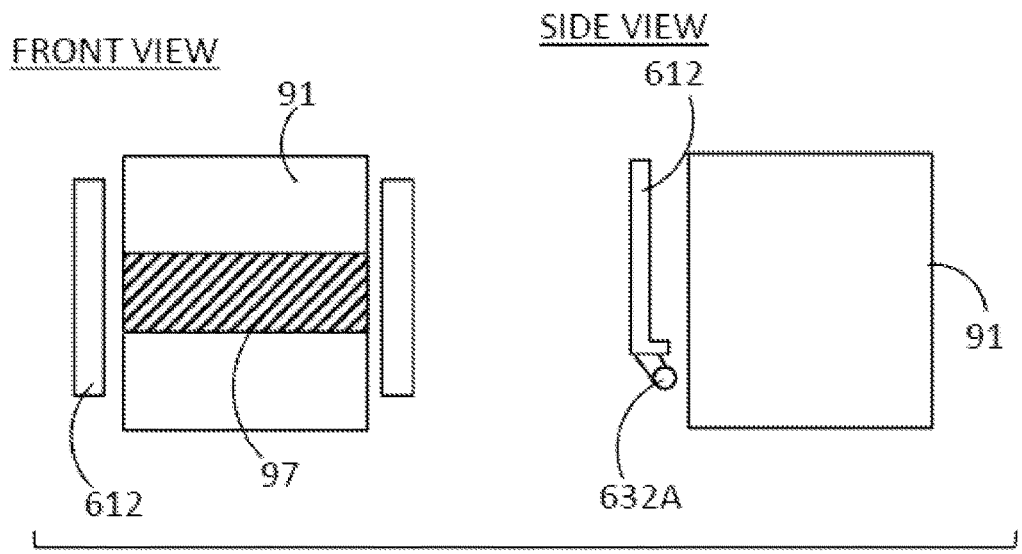
FIG. 13A is an exemplary view for explaining an operation of a second wafer-holding mechanism of the cleaning-part transport mechanism illustrated in FIG. 12.

When the cleaned wafer W is taken out from the casing 91, as illustrated in FIG. 13A, the pair of second arms 612 with their tips directed upward are moved to a standby position adjacent to the casing 91 by driving the arm-transport mechanism 62. In this embodiment, even when the shutter 97 of the casing 91 is closed, the pair of second arms 612 can be moved to the standby position adjacent to the casing 91 by directing the tips of the pair of second arms 612 upward. This can provide a quicker start timing of wafer-taking-out operation, and an improved throughput of entire process.

Figure 13B:
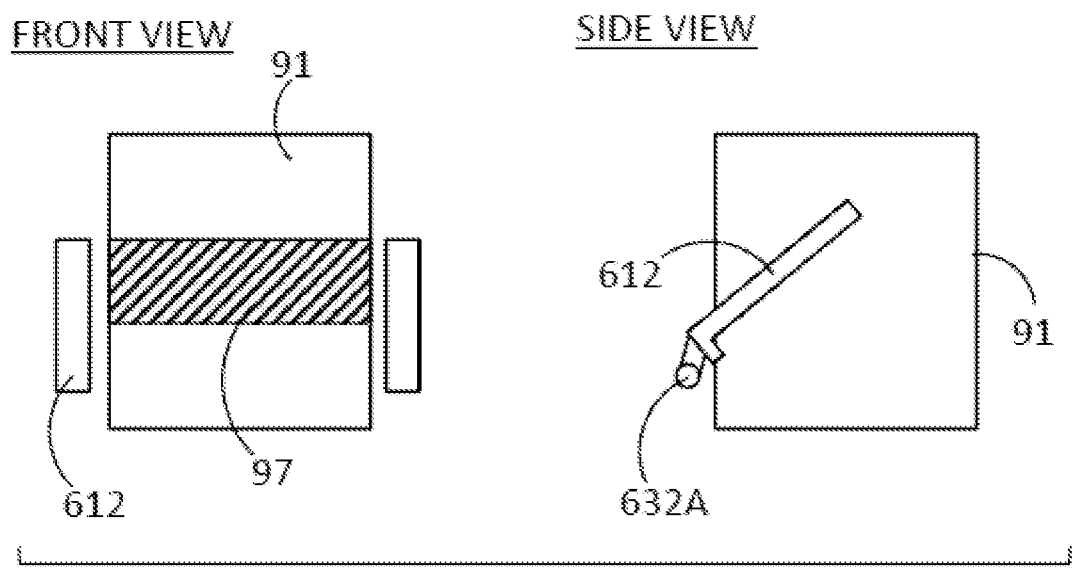
FIG. 13B is an exemplary view for explaining an operation of the second wafer-holding mechanism of the cleaning-part transport mechanism illustrated in FIG. 12.
Figure 13C:
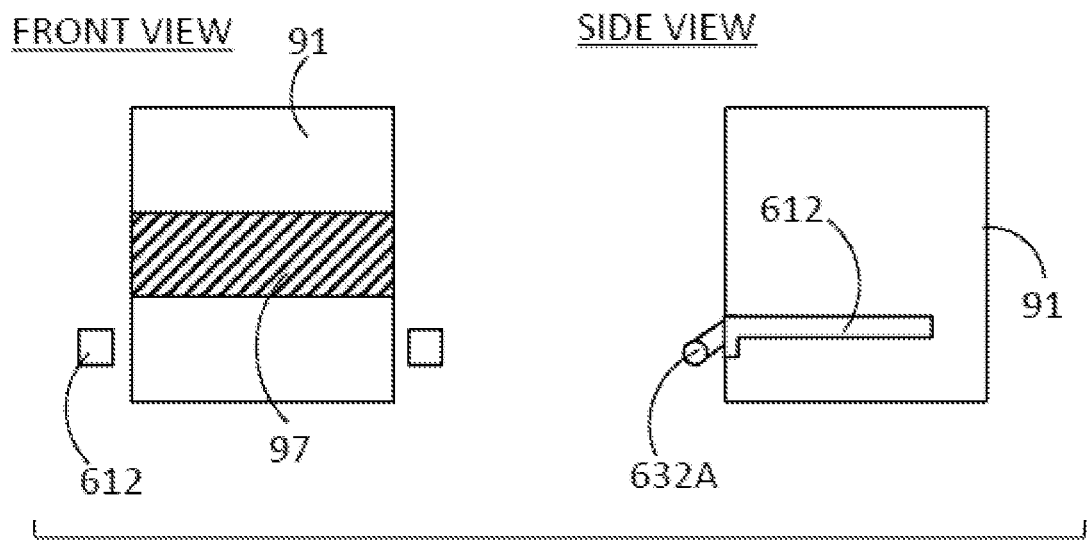
FIG. 13C is an exemplary view for explaining an operation of the second wafer-holding mechanism of the cleaning-part transport mechanism illustrated in FIG. 12.

Next, as illustrated in FIGS. 13B and 13C, by driving the second rotating mechanism 632, the pair of second arms 612 are rotated around the rotating shaft 632A. In the illustrated example, the pair of second arms 612 are rotated clockwise by 90 degrees around the rotating shaft 632A in a side view, and the tips of the pair of second arms 612 are directed laterally.

Figure 13D:
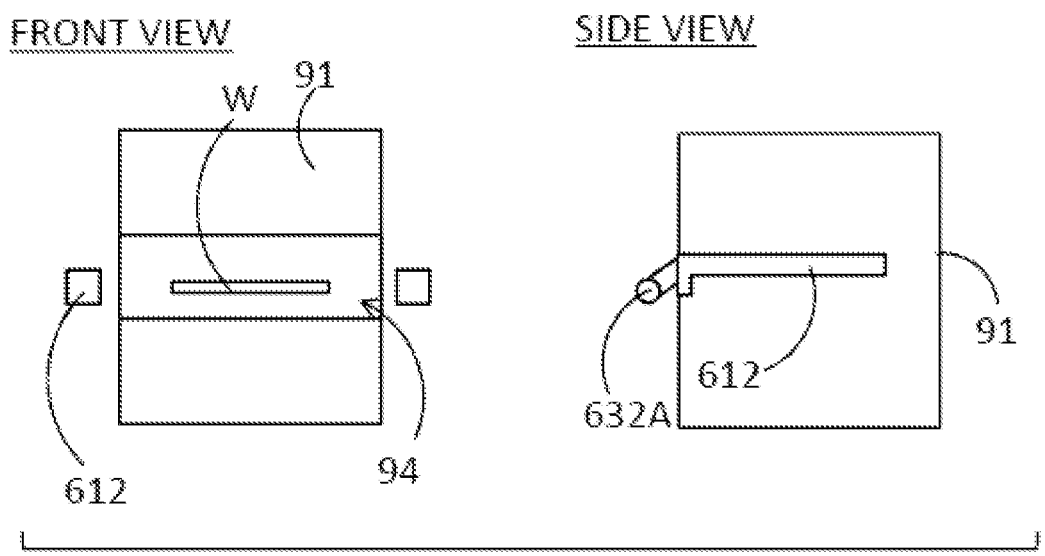
FIG. 13D is an exemplary view for explaining an operation of the second wafer-holding mechanism of the cleaning-part transport mechanism illustrated in FIG. 12.

Next, as illustrated in FIG. 13D, by driving the second vertical-moving mechanism 642, the pair of second arms 612 are lifted to a height position same as that of the arm-passage opening 94. At this time, the shutter 97 is retracted to open the arm-passage opening 94.

Figure 13E:
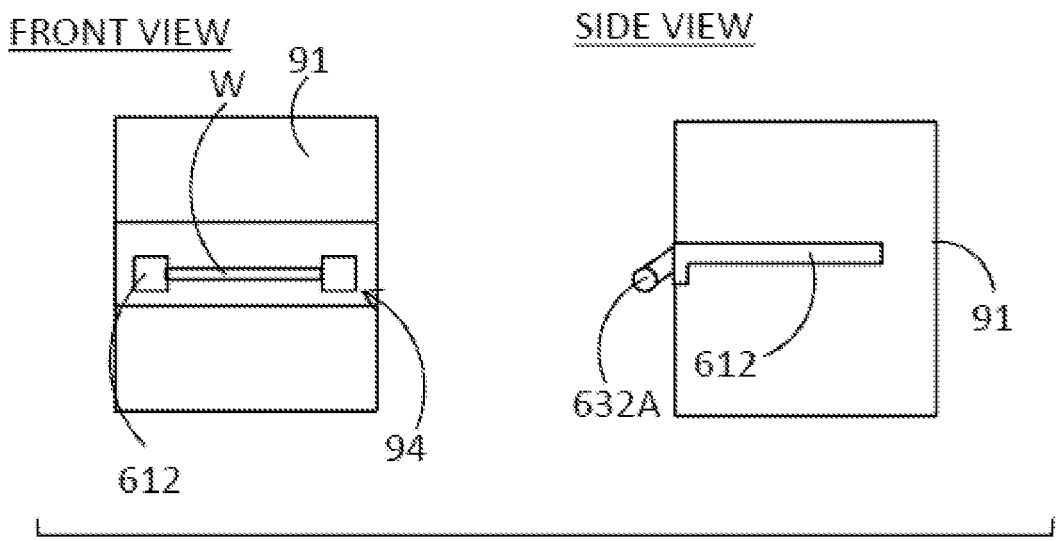
FIG. 13E is an exemplary view for explaining an operation of the second wafer-holding mechanism of the cleaning-part transport mechanism illustrated in FIG. 12.

Next, as illustrated in FIG. 13E, by driving the second opening/closing mechanism 662, the pair of second arms 612 are closed in the mutually approaching direction, and inserted into the casing 91 through the arm-passage opening 94 to hold the wafer W in the casing 91. Then, by driving the arm-transport mechanism 62, the pair of second arms 612 holding the wafer W are moved to the next cleaning module.

When a wafer W before cleaning is carried into the casing 91, the above-described operations illustrated in FIGS. 13A to 13E are performed in reverse order. Namely, as illustrated in FIG. 13E, by driving the arm-transport mechanism 62, the pair of second arms 612 holding the wafer W are moved into the casing 91 through the arm-passage opening 94.

Next, as illustrated in FIG. 13D by driving the second opening/closing mechanism 662, the pair of second arms 612 are opened in the mutually separating direction, and taken out from the casing 91 through the arm-passage opening 94.

Next, as illustrated in FIG. 13C, by driving the second vertical-moving mechanism 642, the pair of second arms 612 are lowered to a height position that is lower than that of the arm-passage opening 94. At this time, the shutter 97 closes the arm-passage opening 94, and a cleaning process of the wafer W is started inside the casing 91.

Next, as illustrated in FIGS. 13B and 13A, by driving the second rotating mechanism 632, the pair of second arms 612 are rotated around the rotating shaft 632A. In the illustrated example, the pair of second arms 612 are rotated counterclockwise by 90 degrees around the rotating shaft 632A in a side view, and the tips of the pair of second arms 612 are directed upward. Then, by driving the arm-transport mechanism 62, the pair of second arms 612 with their tips directed upward are moved to the next cleaning module. In this embodiment, it is possible to reduce a space required above the pair of second arms 612 since the second vertical-moving mechanism 642 lowers the pair of second arms 612 when the second rotating mechanism 632 rotates the pair of second arms 612 so as to direct their tips upward.

At each of the cleaning modules 311a to 314a and 311b to 314b, a plurality of the wafers W can be cleaned in parallel. With reference to FIGS. 29A to 29I, there is described an example of an operation of the cleaning-part transport mechanism 32a when a plurality of the wafers W are cleaned in parallel at the primary to tertiary cleaning modules 311a to 313a of the first cleaning unit 30a.

Figure 29A:
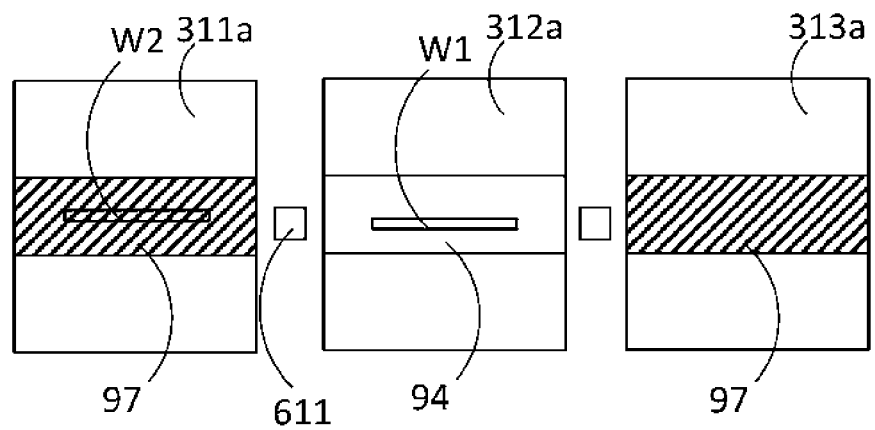
FIG. 29A is an exemplary view for explaining an example of an operation of the cleaning-part transport mechanism when a plurality of wafers are cleaned in parallel at the cleaning modules.

Firstly, as illustrated in FIG. 29A, it is assumed that the shutter 97 is closed and a second wafer W2 is being subjected to first-stage cleaning at the primary cleaning module 311a, while second-stage cleaning for a first wafer W1 is finished and the arm-passage opening 94 is opened at the secondary cleaning module 312a. In this case, the pair of first arms 611 are moved to a standby position for the secondary cleaning module 312a, and tips of the pair of first arms 611 are directed laterally.

Figure 29B:
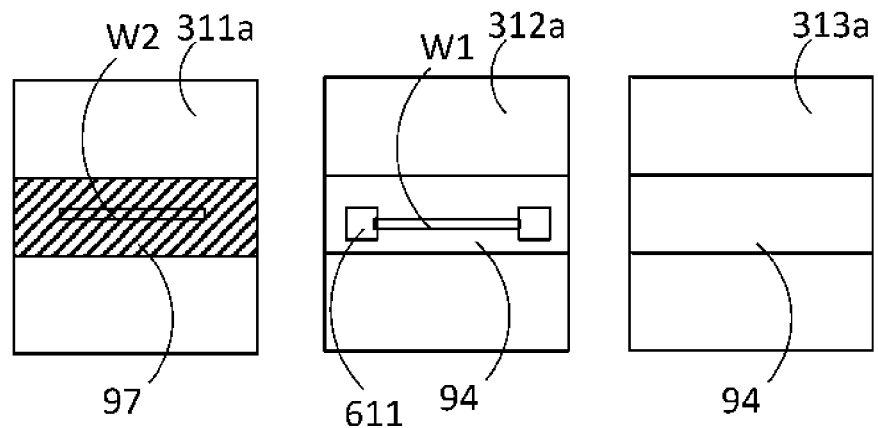
FIG. 29B is an exemplary view for explaining an example of an operation of the cleaning-part transport mechanism when the plurality of wafers are cleaned in parallel at the cleaning modules.

Then, as illustrated in FIG. 29B, the pair of first arms 611 are closed so as to mutually approach, to hold the first wafer W1 in the secondary cleaning module 312a. Further, the shutter 97 of the tertiary cleaning module 313a is retracted to open the arm-passage opening 94.

Figure 29C:
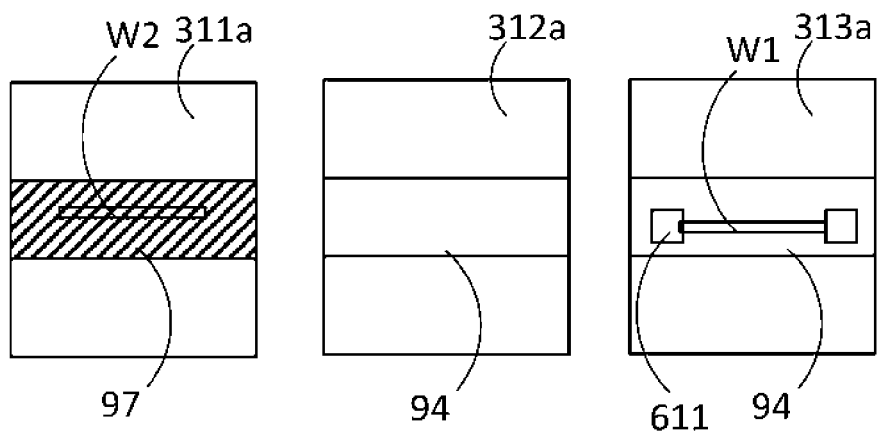
FIG. 29C is an exemplary view for explaining an example of an operation of the cleaning-part transport mechanism when the plurality of wafers are cleaned in parallel at the cleaning modules.

Next, as illustrated in FIG. 29C, the first wafer W1 held by the pair of first arms 611 is moved from the secondary cleaning module 312a to the tertiary cleaning module 313a through the arm-passage opening 94.

Figure 29D:
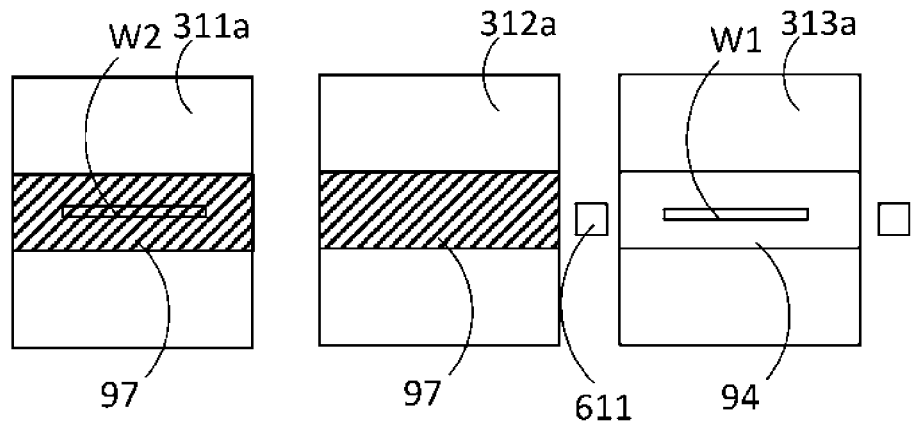
FIG. 29D is an exemplary view for explaining an example of an operation of the cleaning-part transport mechanism when the plurality of wafers are cleaned in parallel at the cleaning modules.

Then, as illustrated in FIG. 29D, the pair of first arms 611 are opened so as to mutually separate, and taken out on right and left of the tertiary cleaning module 313a. In the secondary cleaning module 312a, the shutter 97 is closed to prevent drying.

Figure 29E:
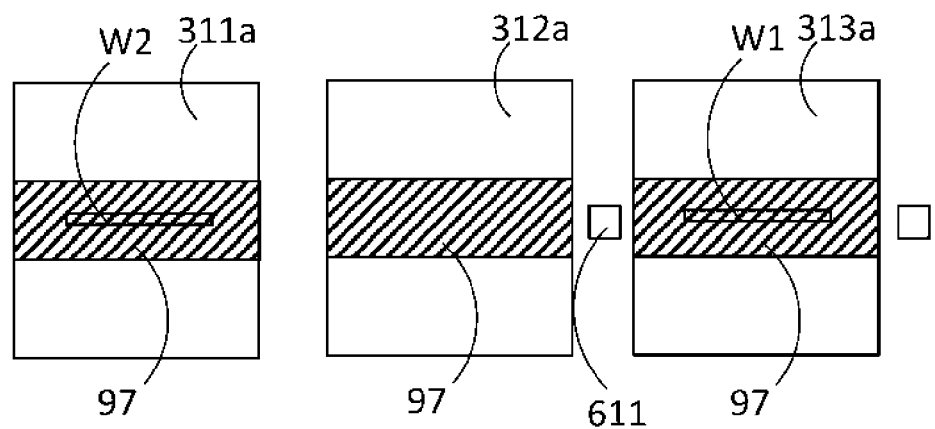
FIG. 29E is an exemplary view for explaining an example of an operation of the cleaning-part transport mechanism when the plurality of wafers are cleaned in parallel at the cleaning modules.

Next, as illustrated in FIG. 29E, the shutter 97 of the tertiary cleaning module 313a is closed, and the first wafer W1 is subjected to third-stage cleaning at the tertiary cleaning module 313a.

Figure 29F:
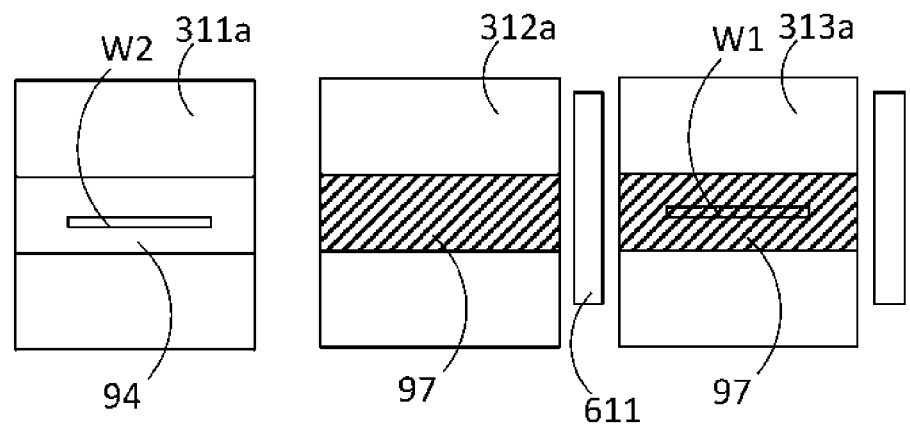
FIG. 29F is an exemplary view for explaining an example of an operation of the cleaning-part transport mechanism when the plurality of wafers are cleaned in parallel at the cleaning modules.

Next, as illustrated in FIG. 29F, after the first-stage cleaning for the second wafer W2 is finished at the primary cleaning module 311a, the shutter 97 of the primary cleaning module 311a is retracted to open the arm-passage opening 94. At this time, the pair of first arms 611 are rotated by the rotating mechanism, and the tips of the pair of first arms 611 are directed upward.

Figure 29G:
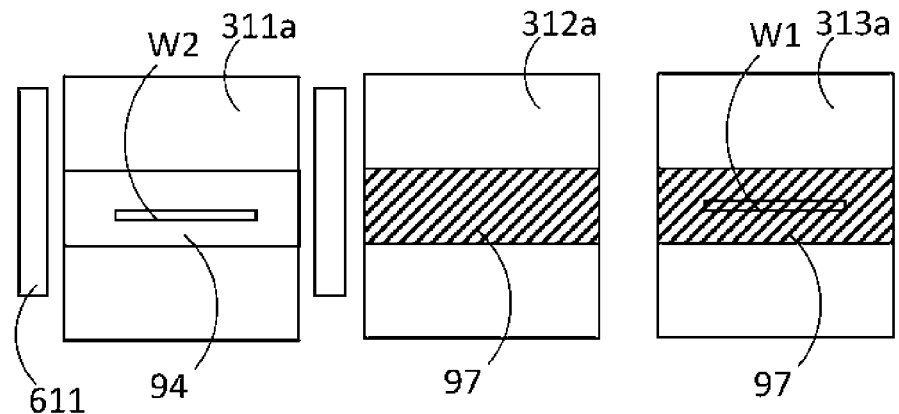
FIG. 29G is an exemplary view for explaining an example of an operation of the cleaning-part transport mechanism when the plurality of wafers are cleaned in parallel at the cleaning modules.

Then, as illustrated in FIG. 29G, the pair of first arms 611 are moved so as to avoid (skip) the tertiary cleaning module 313a and the secondary cleaning module 312a, in which the shutters 97 are closed, and disposed at a standby position of the primary cleaning module 311a.

Figure 29H:
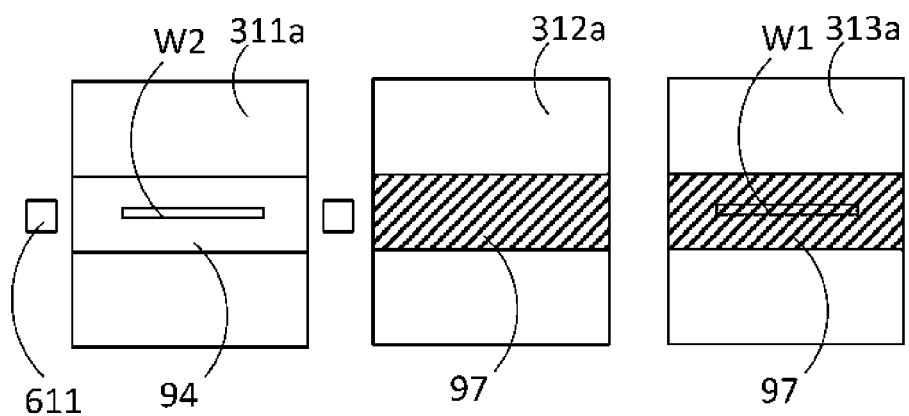
FIG. 29H is an exemplary view for explaining an example of an operation of the cleaning-part transport mechanism when the plurality of wafers are cleaned in parallel at the cleaning modules.
Figure 29I:
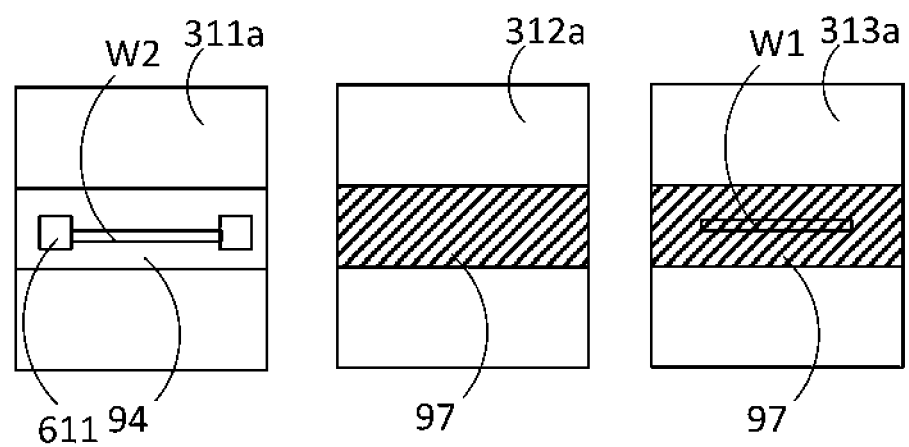
FIG. 29I is an exemplary view for explaining an example of an operation of the cleaning-part transport mechanism when the plurality of wafers are cleaned in parallel at the cleaning modules.

Next, as illustrated in FIG. 29H, the pair of first arms 611 are rotated by the rotating mechanism, and the tips of the pair of first arms 611 are directed laterally. Then, as illustrated in FIG. 29I, the pair of first arms 611 are closed so as to mutually approach, to hold the second wafer W2 in the primary cleaning module 311a. Then, the second wafer W2 held by the pair of first arms 611 is transported to the secondary cleaning module 312a, to be subjected to the second-stage cleaning.

As described above, in this embodiment, a plurality of the wafers W can be cleaned in parallel at each of the cleaning modules 311a to 314a and 311b to 314b, enabling improvement in a throughput of entire process.

Next, with reference to FIGS. 30A to 30I, there is described a modified example of an operation of the cleaning-part transport mechanism 32a when a plurality of the wafers W are cleaned in parallel at the primary to tertiary cleaning modules 311a to 313a of the first cleaning unit 30a.

Figure 30A:
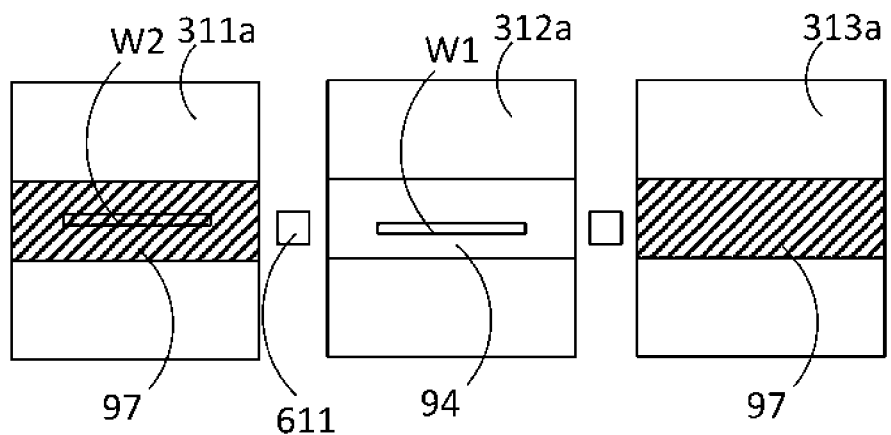
FIG. 30A is an exemplary view for explaining a modified example of an operation of the cleaning-part transport mechanism when a plurality of wafers are cleaned in parallel at the cleaning modules.

Firstly, as illustrated in FIG. 30A, it is assumed that the shutter 97 is closed and the second wafer W2 is being subjected to first-stage cleaning at the primary cleaning module 311a, while second-stage cleaning for the first wafer W1 is finished and the arm-passage opening 94 is opened at the secondary cleaning module 312a. In this case, the pair of first arms 611 are moved to a standby position for the secondary cleaning module 312a, and tips of the pair of first arms 611 are directed laterally.

Figure 30B:
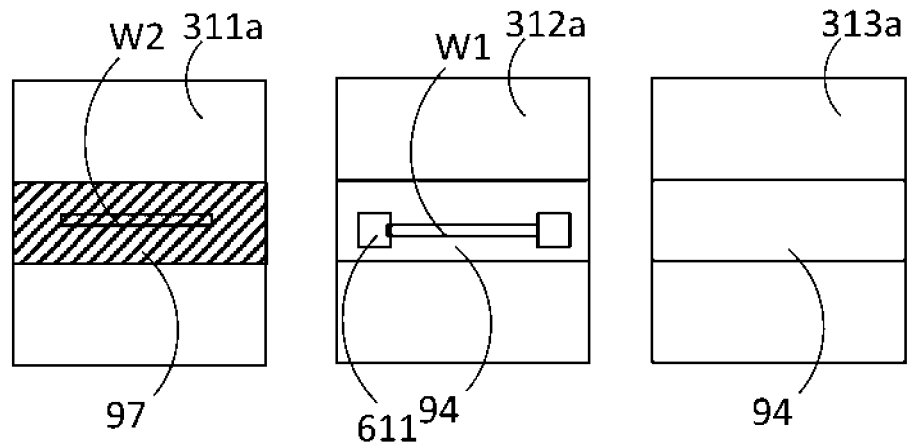
FIG. 30B is an exemplary view for explaining a modified example of an operation of the cleaning-part transport mechanism when the plurality of wafers are cleaned in parallel at the cleaning modules.

Then, as illustrated in FIG. 30B, the pair of first arms 611 are closed so as to mutually approach, to hold the first wafer W1 in the secondary cleaning module 312a. Further, the shutter 97 of the tertiary cleaning module 313a is retracted to open the arm-passage opening 94.

Figure 30C:
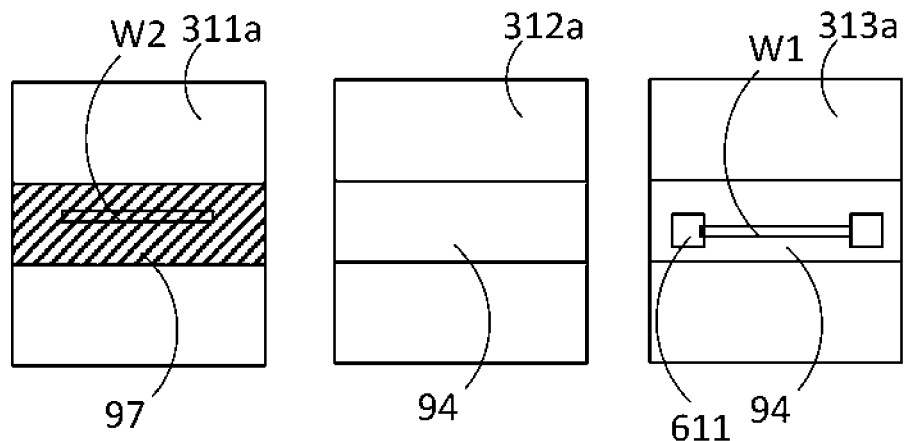
FIG. 30C is an exemplary view for explaining a modified example of an operation of the cleaning-part transport mechanism when the plurality of wafers are cleaned in parallel at the cleaning modules.

Next, as illustrated in FIG. 30C, the first wafer W1 held by the pair of first arms 611 is moved from the secondary cleaning module 312a to the tertiary cleaning module 313a through the arm-passage opening 94.

Figure 30D:
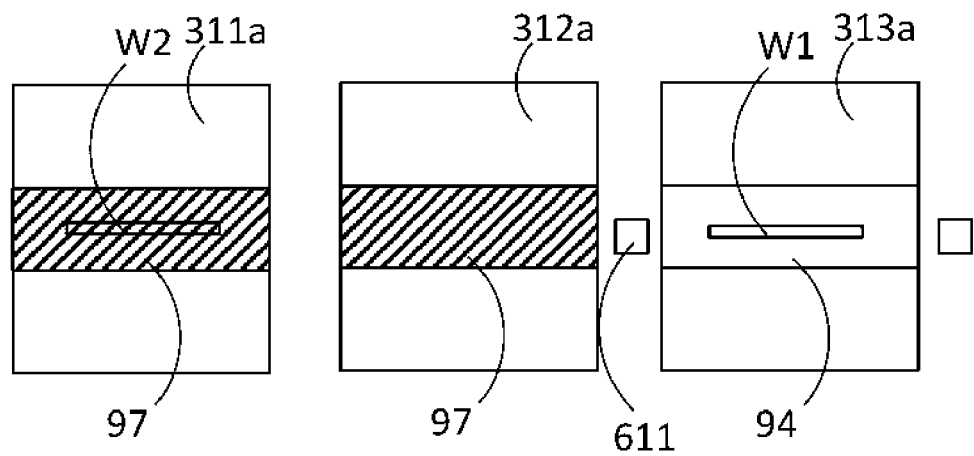
FIG. 30D is an exemplary view for explaining a modified example of an operation of the cleaning-part transport mechanism when the plurality of wafers are cleaned in parallel at the cleaning modules.

Then, as illustrated in FIG. 30D, the pair of first arms 611 are opened so as to mutually separate, and taken out on right and left of the tertiary cleaning module 313a. The shutter 97 of the secondary cleaning module 312a is closed.

Figure 30E:
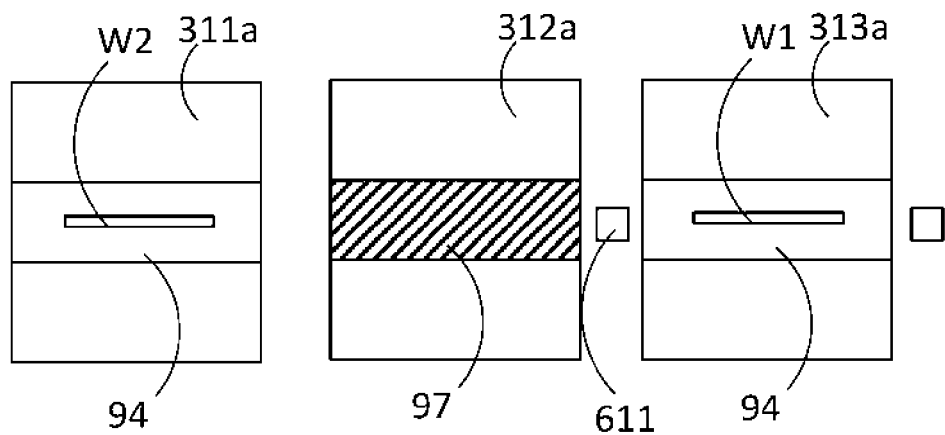
FIG. 30E is an exemplary view for explaining a modified example of an operation of the cleaning-part transport mechanism when the plurality of wafers are cleaned in parallel at the cleaning modules.

Next, as illustrated in FIG. 30E, when the first-stage cleaning for the second wafer W2 is finished at the primary cleaning module 311a before the third-stage cleaning is started for the first wafer W1 at the tertiary cleaning module 313a, the shutter 97 of the primary cleaning module 311a is retracted to open the arm-passage opening 94.

Figure 30F:
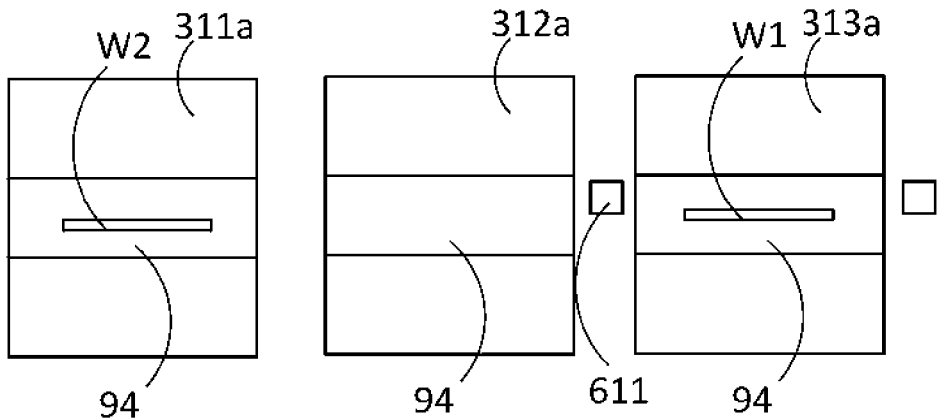
FIG. 30F is an exemplary view for explaining a modified example of an operation of the cleaning-part transport mechanism when the plurality of wafers are cleaned in parallel at the cleaning modules.

At this time, as illustrated in FIG. 30F, the pair of first arms 611 are lifted to a height position that is higher than the first wafer W1. Further, the shutter 97 of the secondary cleaning module 312a is retracted to open the arm-passage opening 94.

Figure 30G:
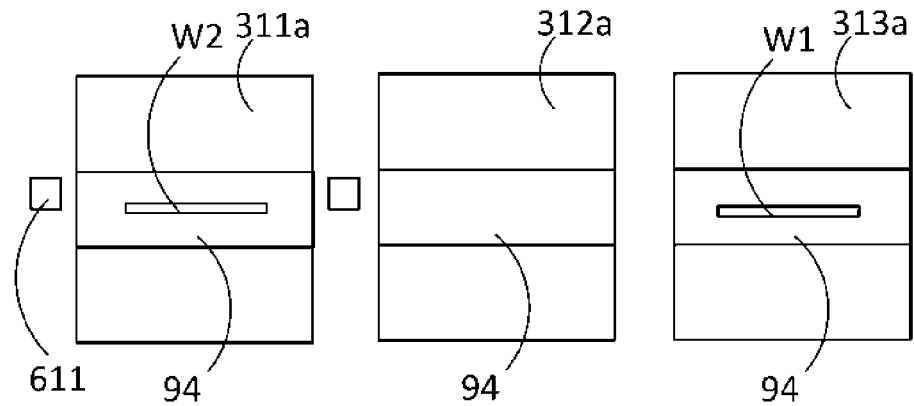
FIG. 30G is an exemplary view for explaining a modified example of an operation of the cleaning-part transport mechanism when the plurality of wafers are cleaned in parallel at the cleaning modules.

Then, as illustrated in FIG. 30G, the pair of first arms 611, with their tips directed laterally, are moved passing the arm-passage openings 94 of the tertiary cleaning module 313a and the secondary cleaning module 312a, and disposed at a standby position of the primary cleaning module 311a.

Figure 30H:
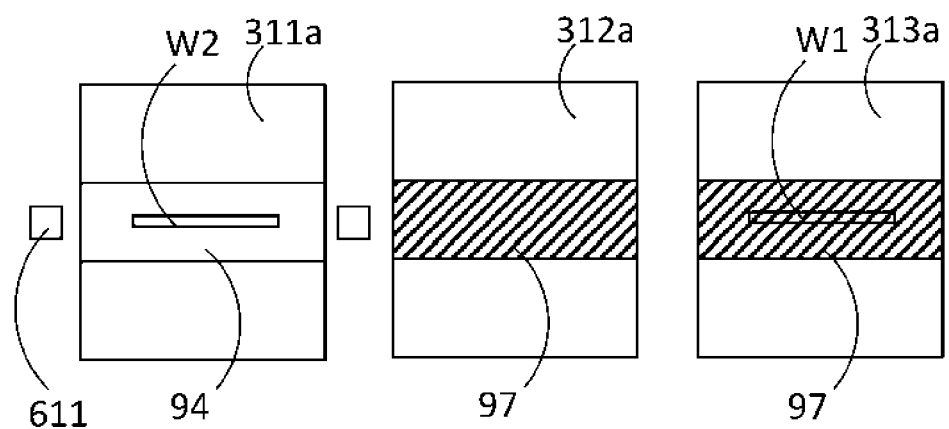
FIG. 30H is an exemplary view for explaining a modified example of an operation of the cleaning-part transport mechanism when the plurality of wafers are cleaned in parallel at the cleaning modules.

Next, as illustrated in FIG. 30H, the pair of first arms 611 are lowered to a height position same as that of the second wafer W2. Whereas, at the tertiary cleaning module 313a, the shutter 97 is closed and the third-stage cleaning is started for the first wafer W1. In the secondary cleaning module 312a, the shutter 97 is closed to prevent drying.

Figure 30I:
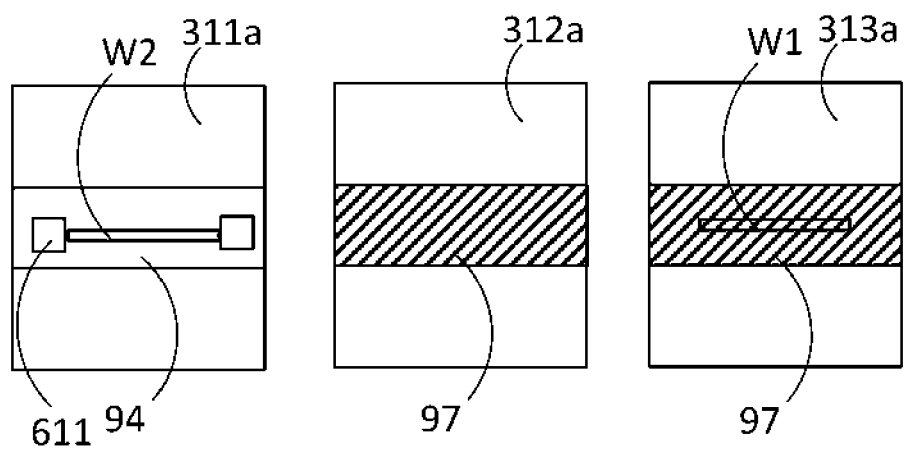
FIG. 30I is an exemplary view for explaining a modified example of an operation of the cleaning-part transport mechanism when the plurality of wafers are cleaned in parallel at the cleaning modules.

Then, as illustrated in FIG. 30I, the pair of first arms 611 are closed so as to mutually approach, to hold the second wafer W2 in the primary cleaning module 311a. Then, the second wafer W2 held by the pair of first arms 611 is transported to the secondary cleaning module 312a, to be subjected to the second-stage cleaning.

According to the modified example described above, an operation for rotating the pair of first arms 611 can be omitted, in moving the pair of first arms 611 from the tertiary cleaning module 313a to the primary cleaning module 311a. Accordingly, a throughput of entire process can be further improved.

Whereas, as in illustrated examples in FIGS. 29A to 29I, when the pair of first arms 611 are rotated and moved so as to avoid (skip) the tertiary cleaning module 313a and the secondary cleaning module 312a, in which the shutters 97 are closed, the pair of first arms 611 do not pass over the first wafer W1 in the tertiary cleaning module 313a. This can prevent a surface of the first wafer W1 from being stuck with cleaning liquid dropping from the pair of first arms 611.

Moreover, the third-stage cleaning for the first wafer W1 can be started earlier at the tertiary cleaning module 313a.

Each of the cleaning modules 311a to 314a and 311b to 314b has a detector (not shown) configured to detect a failure. When a failure occurs in any of the cleaning modules 311a to 314a and 311b to 314b, the detector detects the failure and transmits a signal to the control part 15. The control part 15 selects a cleaning line to avoid the failed cleaning module, and switches a current cleaning line to the newly selected cleaning line.

Figure 22A:
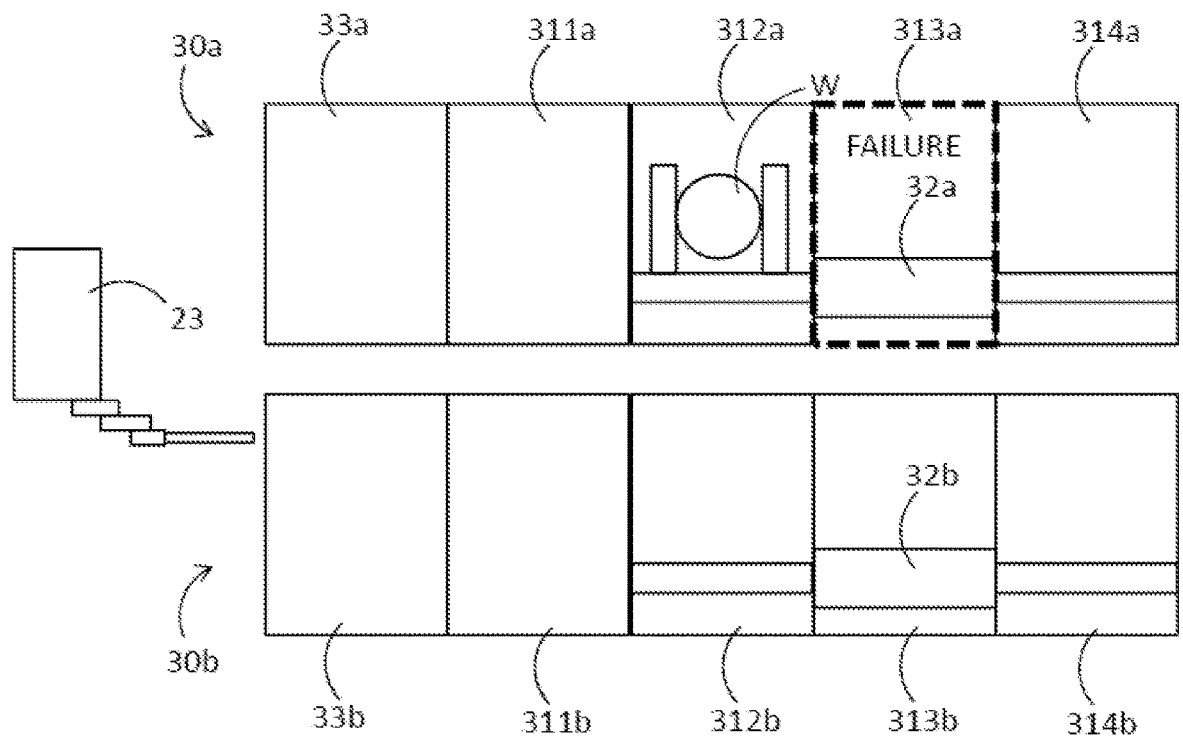
FIG. 22A is an exemplary view for explaining an operation when abnormality occurs in the first cleaning unit.
Figure 22B:
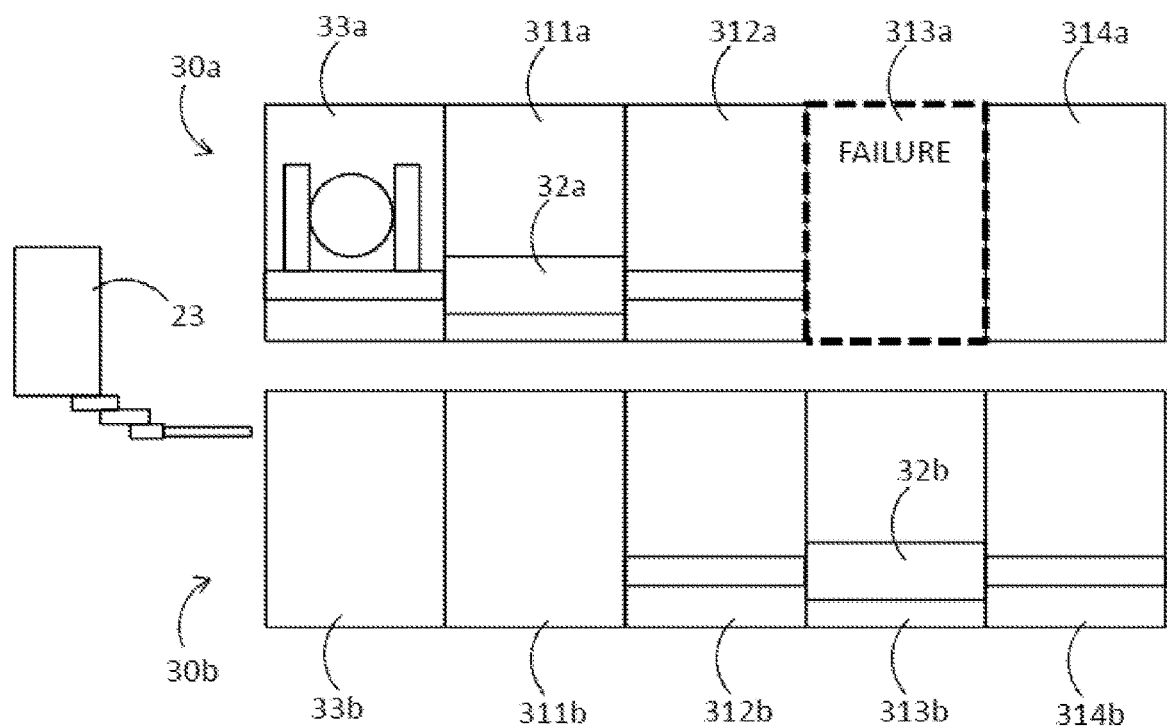
FIG. 22B is an exemplary view for explaining an operation when abnormality occurs in the first cleaning unit.

More specifically, as illustrated in FIG. 22A, for example, when abnormality occurs in the tertiary cleaning module 313a of the first cleaning unit 30a, the first arms 611 of the cleaning-part transport mechanism 32a hold the wafer W located in the secondary cleaning module 312a. Then, as illustrated in FIG. 22B, with the tips of the second arms 612 of the cleaning-part transport mechanism 32a directed upward, the wafer held by the first arms 611 is transported to the first wafer station 33a, by driving the arm-transport mechanism 62. At this time, even when the shutter 97 of the tertiary cleaning module 313a is failed and kept closed, the second arms 612 can avoid (skip) the tertiary cleaning module 313a, to move without being interfered with the shutter 97, since the tips of the second arms 612 are directed upward.

Figure 22C:
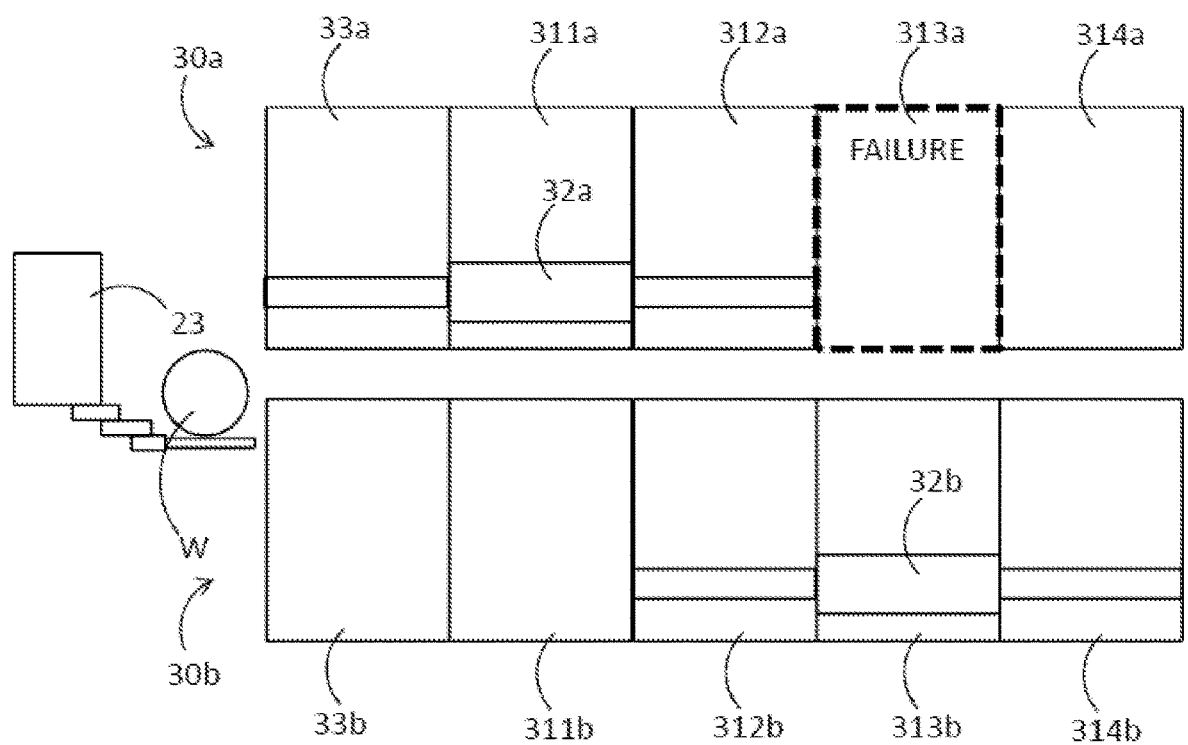
FIG. 22C is an exemplary view for explaining an operation when abnormality occurs in the first cleaning unit.
Figure 22D:
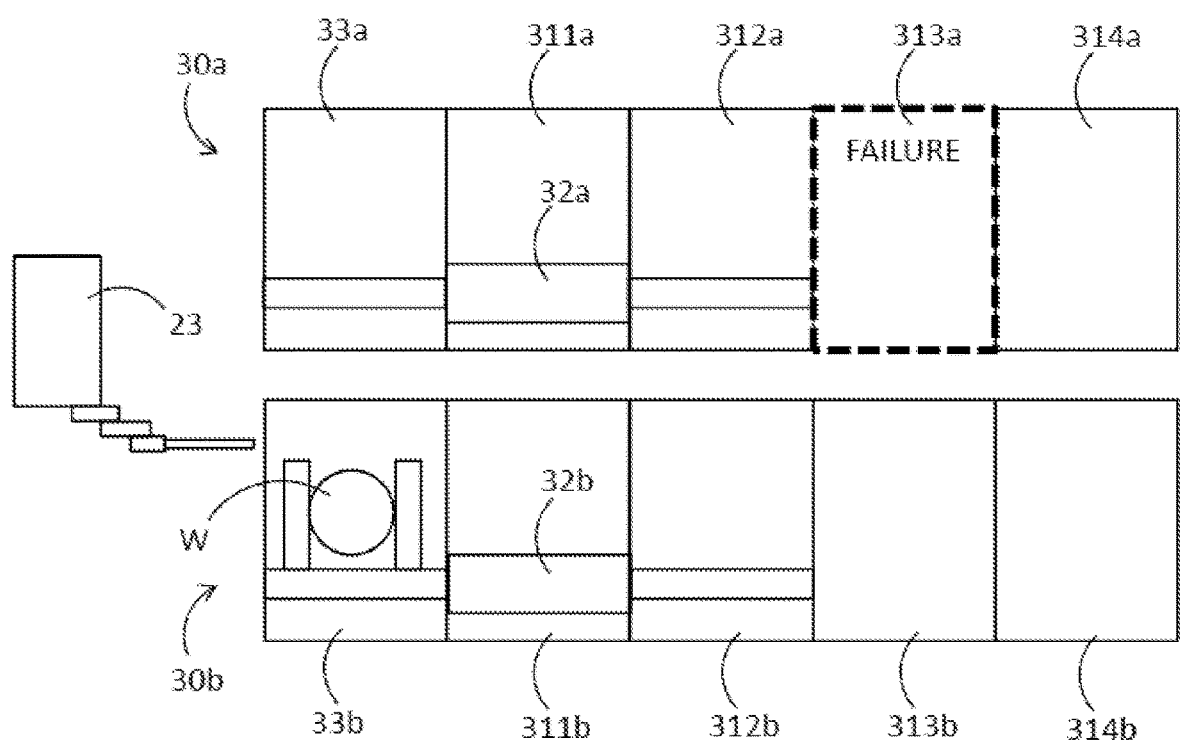
FIG. 22D is an exemplary view for explaining an operation when abnormality occurs in the first cleaning unit.
Figure 22E:
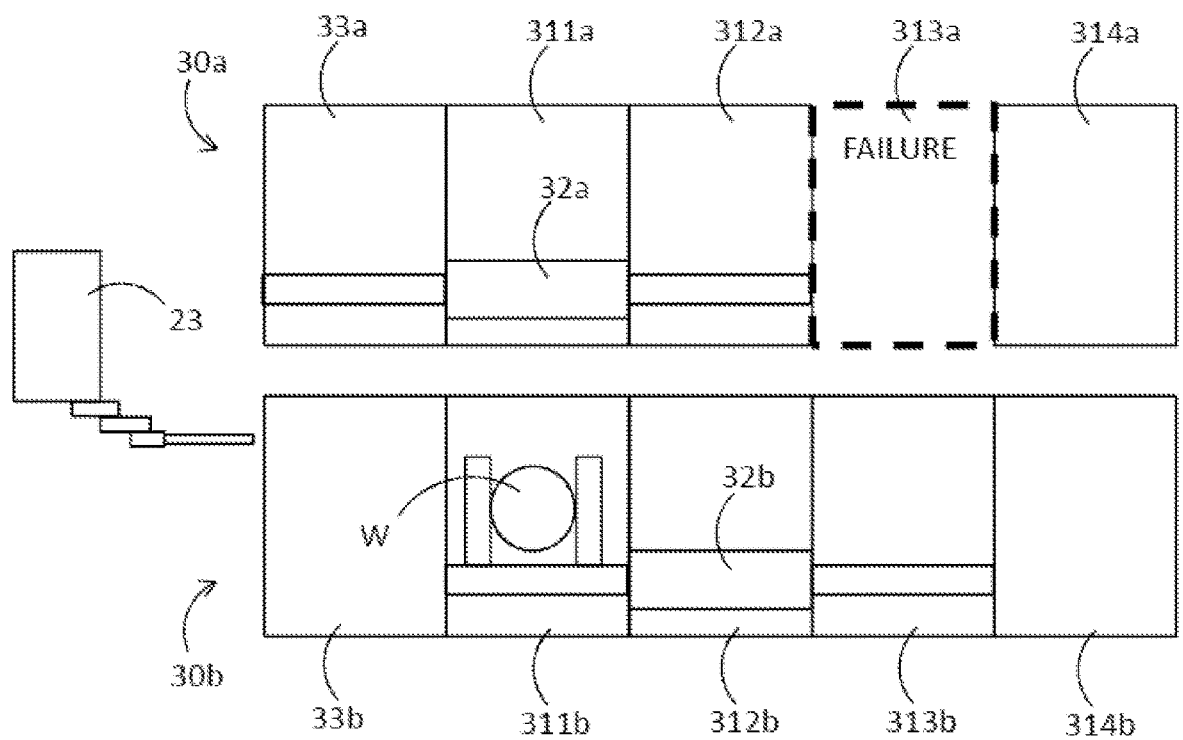
FIG. 22E is an exemplary view for explaining an operation when abnormality occurs in the first cleaning unit.

Next, as illustrated in FIGS. 22C and 22D, the transport robot 23 of the polishing part 12 takes out the wafer W from the first wafer station 33a, and transfers the wafer W to the second wafer station 33b. The wafer W transferred to the second wafer station 33b is held by the first arms 611 of the cleaning-part transport mechanism 32b. Then, as illustrated in FIG. 22E, by driving the arm-transport mechanism 62, the wafer W held by the first arms 611 is transported to the primary cleaning module 311a, to be cleaned.

Thus, in this embodiment, even when abnormality occurs in any of the plurality of first cleaning modules 311a to 314a, the wafer W located in the first cleaning modules 311a to 314a is transported to the second cleaning modules 311b to 314b, to be cleaned, so that the wafer W located in the first cleaning modules 311a to 314a can be saved. Similarly, even when abnormality occurs in any of the plurality of second cleaning modules 311b to 314b, the wafer W located in the second cleaning modules 311b to 314b is transported to the first cleaning modules 311a to 314a, to be cleaned, so that the wafer W located in the second cleaning modules 311b to 314b can be saved.

As illustrated in FIG. 12, in this embodiment, the first wafer-holding mechanism 601 and the second wafer-holding mechanism 602 are disposed in a suspended state below the arm-transport mechanism 62. Consequently, a maintenance space for the first wafer-holding mechanism 601 and the second wafer-holding mechanism 602 is enlarged. This can reduce time required for maintenance.

<Pre-Cleaning Module>

Figure 27:
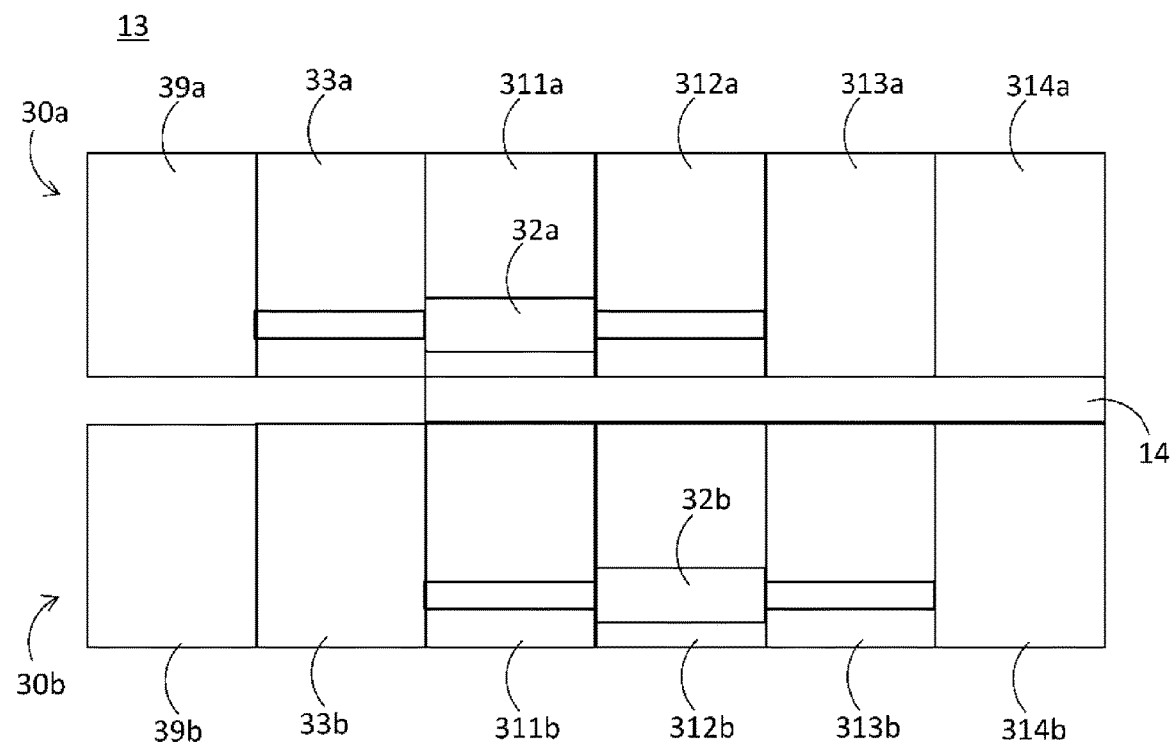
FIG. 27 is a side view illustrating a cleaning part having a pre-cleaning module.

As illustrated in FIG. 27, the first cleaning unit 30a of the cleaning part 13 may further have the pre-cleaning module 39a arranged on a same line as the plurality of cleaning modules 311a to 314a, and configured to clean the wafer W before polishing, in which the cleaning-part transport mechanism 32a transports the wafer W between the pre-cleaning module 39a and each of the cleaning modules 311a to 314a. In the illustrated example, the pre-cleaning module 39a is arranged adjacent to the first wafer station 33a, on an opposite side to the cleaning modules 311a to 314a with respect to the first wafer station 33a.

Similarly, the second cleaning unit 30b may further have the pre-cleaning module 39b arranged on a same line as the plurality of cleaning modules 311b to 314b, and configured to clean the wafer W before polishing, in which the cleaning-part transport mechanism 32b transports the wafer W between the pre-cleaning module 39b and each of the cleaning modules 311b to 314b. In the illustrated example, the pre-cleaning module 39b is arranged adjacent to the second wafer station 33b, on an opposite side to the cleaning modules 311b to 314b with respect to the second wafer station 33b.

Each of the pre-cleaning modules 39a and 39b has a cleaner, which is not shown, and the casing 91 configured to cover the cleaner. As the cleaner of the pre-cleaning modules 39a and 39b, for example, there can be used a wet etching apparatus that removes a natural oxide film from a surface of the wafer W before polishing, or a buffing apparatus that removes coarse particles, which causes scratch, from a surface of the wafer W before polishing.

Since a wafer transport operation of the second cleaning unit 30b to the pre-cleaning module 39b is similar to a wafer transport operation of the first cleaning unit 30a to the pre-cleaning module 39a, the wafer transport operation of the first cleaning unit 30a to the pre-cleaning module 39a is described below.

Figure 28A:
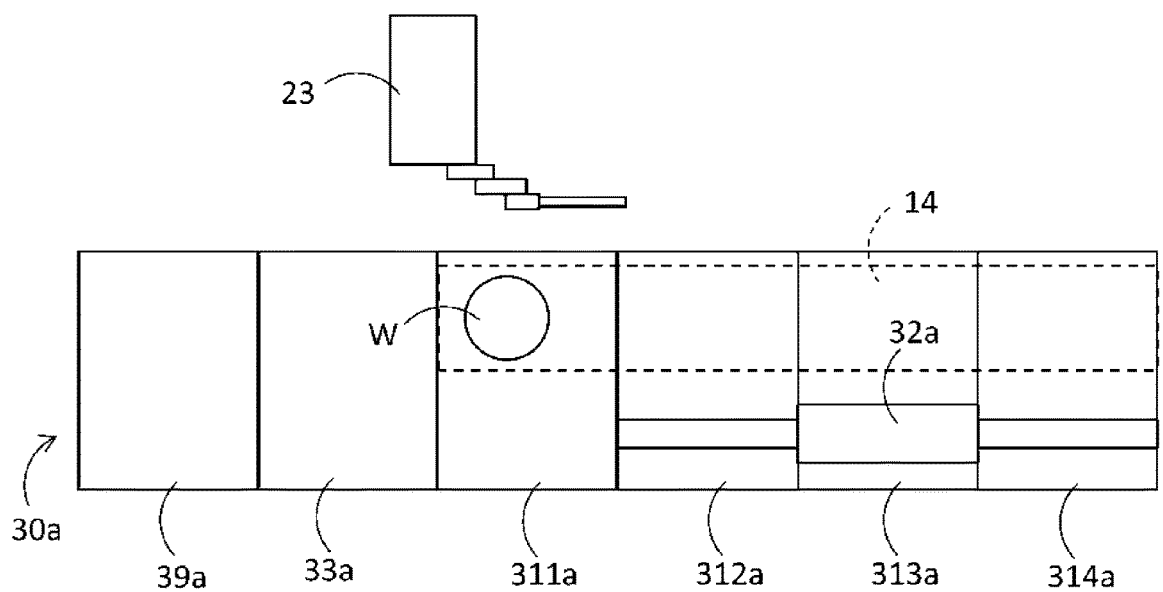
FIG. 28A is an exemplary view for explaining a wafer transport operation to a cleaning module of the cleaning part in FIG. 27.

Firstly, as illustrated in FIG. 28A, a wafer W before polishing is transported by the slide stage 42 of the transporting part 14 along the longitudinal direction, and stopped at a position where the transport robot 23 of the polishing part 12 can have access.

Figure 28B:
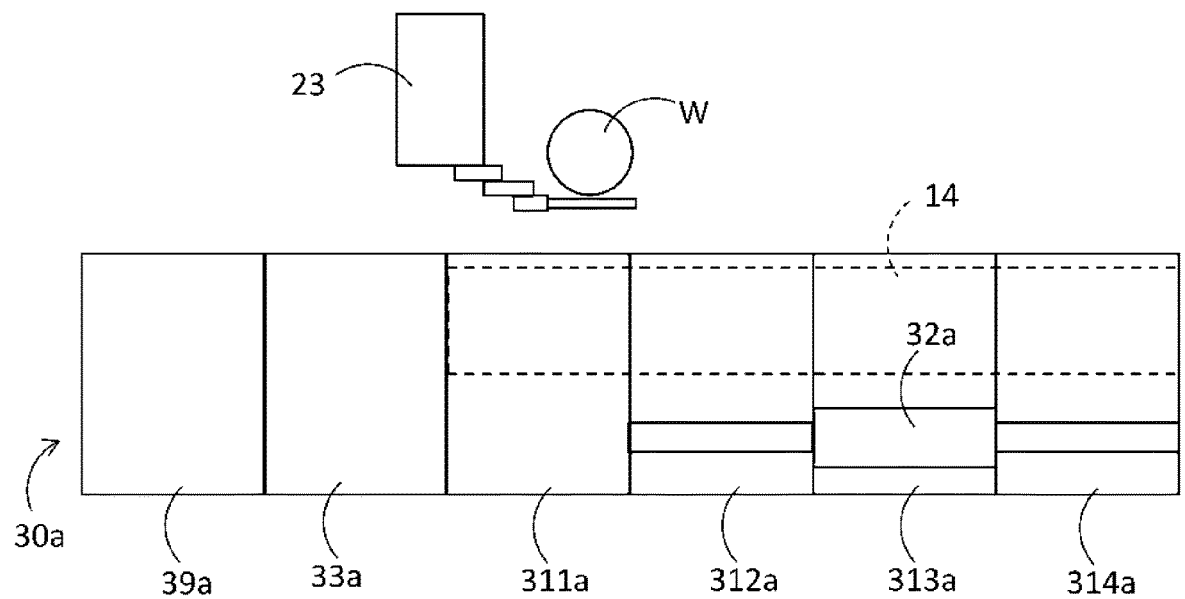
FIG. 28B is an exemplary view for explaining a wafer transport operation to the cleaning module of the cleaning part in FIG. 27.
Figure 28C:
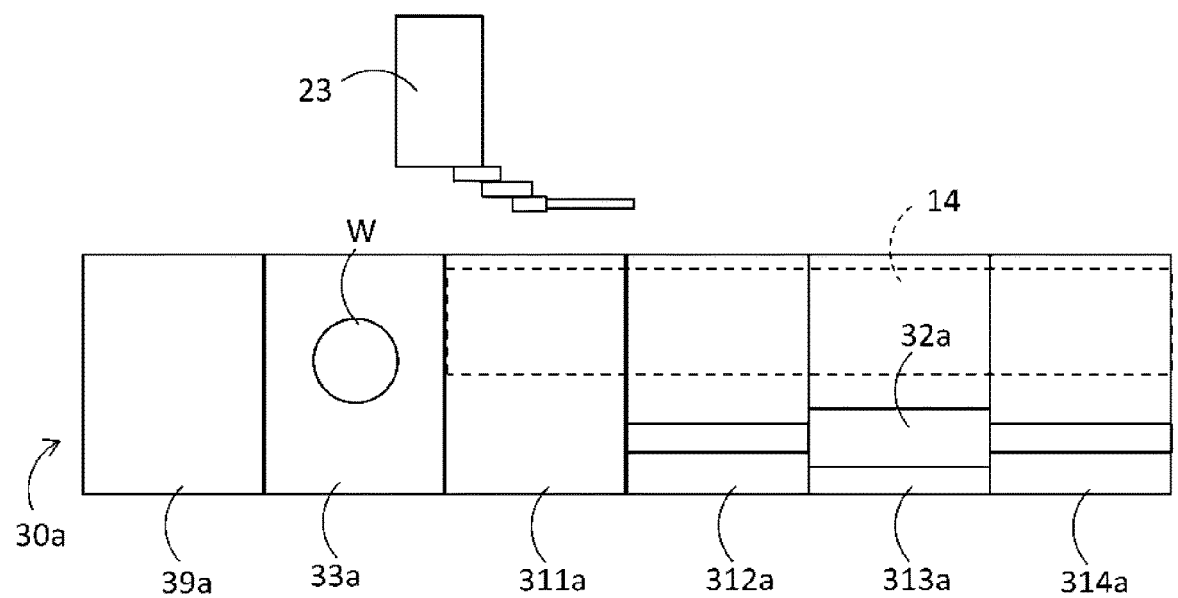
FIG. 28C is an exemplary view for explaining a wafer transport operation to the cleaning module of the cleaning part in FIG. 27.

Next, as illustrated in FIG. 28B, the transport robot 23 of the polishing part 12 takes out the wafer W from the transporting part 14. Then, as illustrated in FIG. 28C, the wafer W held by the transport robot 23 is transferred to the wafer station 33a.

Figure 28D:
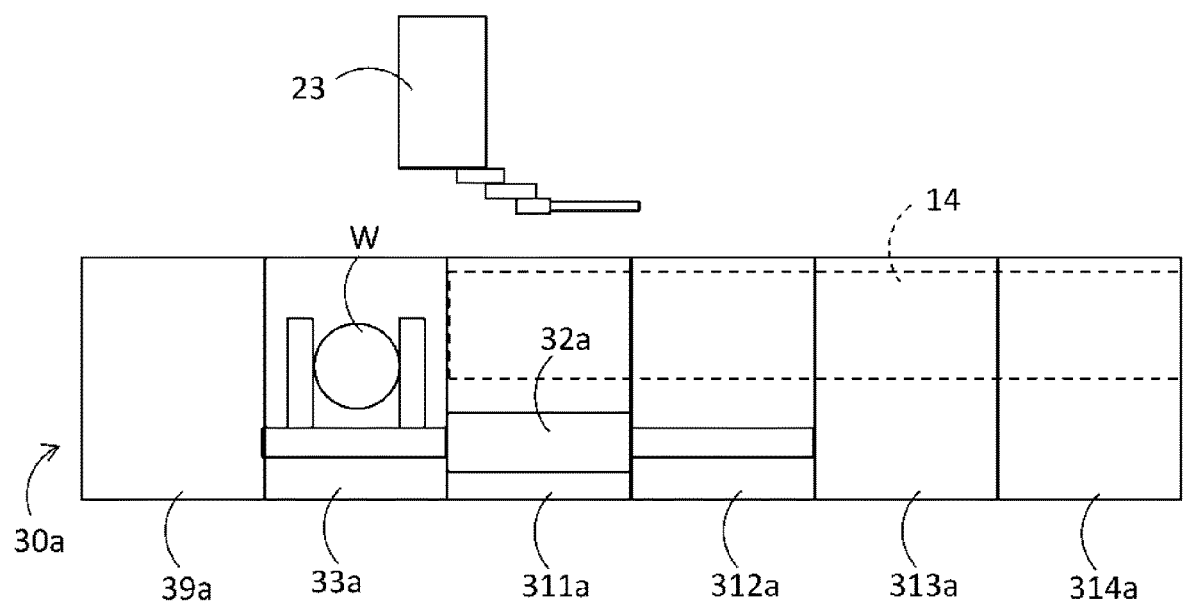
FIG. 28D is an exemplary view for explaining a wafer transport operation to the cleaning module of the cleaning part in FIG. 27.
Figure 28E:
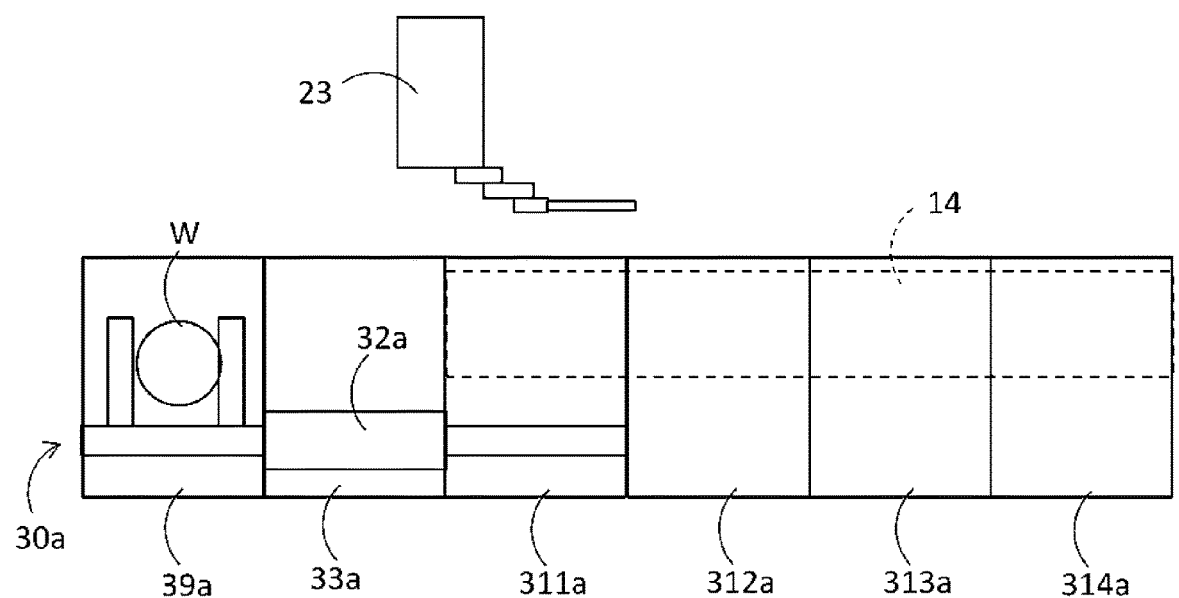
FIG. 28E is an exemplary view for explaining a wafer transport operation to the cleaning module of the cleaning part in FIG. 27.

Next, as illustrated in FIG. 28D, the wafer W located in the wafer station 33a is held by the first arms 611 of the cleaning-part transport mechanism 32a. Then, as illustrated in FIG. 28E, with the tips of the second arms 612 of the cleaning-part transport mechanism 32a directed upward, the wafer W held by the first arms 611 is transported from the first wafer station 33a to the pre-cleaning module 39a by driving the arm-transport mechanism 62, to be cleaned.

The wafer W cleaned at the pre-cleaning module 39a is held again by the first arms 611 of the cleaning-part transport mechanism 32a. Then, as illustrated in FIG. 28C, the wafer W held by the first arms 611 is transported from the pre-cleaning module 39a to the wafer station 33a, by driving the arm-transport mechanism 62. Then, as illustrated in FIG. 28B, by the transport robot 23 of the polishing part 12, the wafer W is taken out from the wafer station 33a, and transported to the first polishing unit 20a or the second polishing unit 20b, via the first transport unit 24a or the second transport unit 24b, to be polished.

More specifically, when each of the pre-cleaning module 39a and the primary cleaning module 311a has a buff processing apparatus that polishes and/or scrubs a surface of a wafer W by relatively moving the wafer W and a buff pad while bringing the buff pad into contact with the wafer W, and interposing slurry between the wafer W and the buff pad (e.g., an apparatus disclosed in FIG. 1 of JP 2016-43471 A or the like); the secondary cleaning module 312a has a roll-type cleaner that cleans a front surface and a back surface of a wafer W by rotating roll type sponges vertically arranged, and pressing the sponges to the front and back surfaces of the wafer (e.g., an apparatus disclosed in FIG. 32 of JP 2010-50436 A or the like); the tertiary cleaning module 313a has a pencil-type cleaner that cleans by pressing a hemispherical sponge to a wafer W while rotating the sponge (e.g., an apparatus disclosed in FIG. 10 of JP 2000-173966 A or the like); and the quaternary cleaning module 314a has an IPA drying device that dries a wafer W by spraying isopropyl alcohol (IPA) steam on a surface of the wafer W while rotating the wafer W (e.g., an apparatus disclosed in FIGS. 33 to 39 of JP 2010-50436 A or the like), a wafer W before polishing is, after being subjected to buffing at the pre-cleaning module 39a, transported to the first polishing unit 20a or the second polishing unit 20b, to be polished; then, subjected to buffing at the primary cleaning module 311a; cleaned by the roll type sponges at the secondary cleaning module 312a; cleaned by the pencil-type sponge at the tertiary cleaning module 313a; subjected to IPA steam drying at the quaternary cleaning module 314a; and then, taken out to the loading/unloading part 11.

Additionally, when the pre-cleaning module 39a has the buff processing apparatus; each of the primary cleaning module 311a and the secondary cleaning module 312a has the roll-type cleaner; the tertiary cleaning module 313a has the pencil-type cleaner; and the quaternary cleaning module 314a has the IPA drying device, a wafer W before polishing is, after being subjected to buffing at the pre-cleaning module 39a, transported to the first polishing unit 20a or the second polishing unit 20b, to be polished; then, successively cleaned by the roll type sponges at the primary cleaning module 311a and the secondary cleaning module 312a; cleaned by the pencil-type sponge at the tertiary cleaning module 313a; subjected to IPA steam drying at the quaternary cleaning module 314a; and then, taken out to the loading/unloading part 11.

Additionally, when each of the pre-cleaning module 39a, the primary cleaning module 311a, and the secondary cleaning module 312a has the roll-type cleaner; the tertiary cleaning module 313a has the pencil-type cleaner; and the quaternary cleaning module 314a has the IPA drying device, a wafer W before polishing is, after being cleaned by the roll type sponges at the pre-cleaning module 39a, transported to the first polishing unit 20a or the second polishing unit 20b, to be polished; then, successively cleaned by the roll type sponges at the primary cleaning module 311a and the secondary cleaning module 312a; cleaned by the pencil-type sponge at the tertiary cleaning module 313a; subjected to IPA steam drying at the quaternary cleaning module 314a; and then, taken out to the loading/unloading part 11.

Additionally, when each of the pre-cleaning module 39a and the primary cleaning module 311a has the roll-type cleaner; the secondary cleaning module 312a has the pencil-type cleaner; the tertiary cleaning module 313a has a two-fluid jet-type cleaner that cleans a wafer W by jetting cleaning liquid and gas toward the wafer W at high speed, to generate and splay a two-fluid jet stream at a high speed (e.g., an apparatus disclosed in FIG. 4 of JP 2010-238850 A or the like); and the quaternary cleaning module 314a has the IPA drying device, a wafer W before polishing is, after being cleaned by the roll type sponges at the pre-cleaning module 39a, transported to the first polishing unit 20a or the second polishing unit 20b, to be polished; then, cleaned by the roll type sponges at the primary cleaning module 311a; cleaned by the pencil-type sponge at the secondary cleaning module 312a; subjected to two-fluid jet cleaning at the tertiary cleaning module 313a; subjected to IPA steam drying at the quaternary cleaning module 314a; and then, taken out to the loading/unloading part 11.

<Liquid-Leakage Detection Part>

Figure 23:
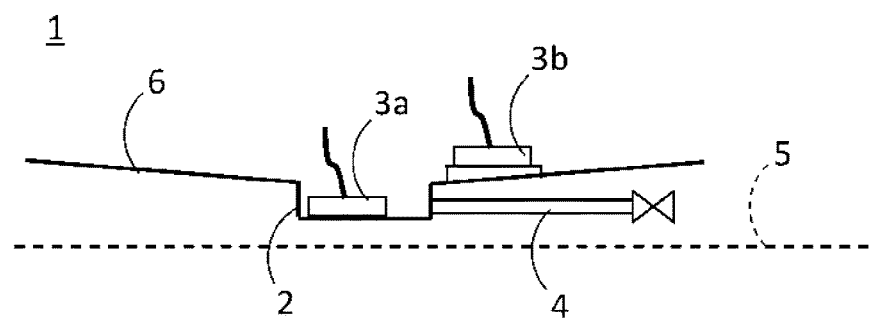
FIG. 23 is an exemplary view illustrating one example of a liquid-leakage detection part of the substrate processing apparatus illustrated in FIG. 1.

FIG. 23 is an exemplary view illustrating a liquid-leakage detection part 1 provided at a lower part of the substrate processing apparatus 10 (near a base frame). As illustrated in FIG. 23, the liquid-leakage detection part 1 has a drain pot 2, a drain pan 6 having a slope inclined toward the drain pot 2, a first installation-type liquid leakage sensor 3a installed on a bottom surface of the drain pot 2, and a second installation-type liquid leakage sensor 3b installed on the slope of the drain pan 6.

As the first installation-type liquid leakage sensor 3a and the second installation-type liquid leakage sensor 3b, for example, a photoelectric sensor is used. When detecting a liquid leakage, each of the first installation-type liquid leakage sensor 3a and the second installation-type liquid leakage sensor 3b transmits a signal to the control part 15. The control part 15 is configured to issue an alarm when receiving a signal from the first installation-type liquid leakage sensor 3a, and to stop operation of the substrate processing apparatus 10 when receiving a signal from the second installation-type liquid leakage sensor 3b.

Figure 24:
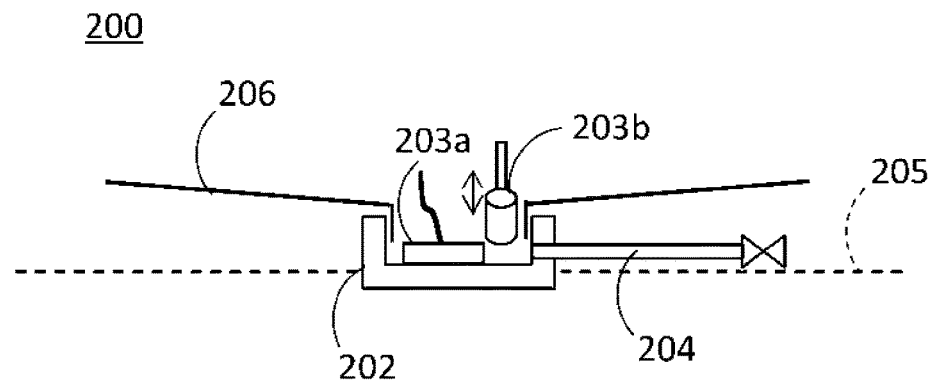
FIG. 24 is an exemplary view illustrating a conventional liquid-leakage detection part.

As illustrated in FIG. 24, in a conventional liquid-leakage detection part 200, in order to configure a two-stage-detection-type level sensor, there has been used an installation-type liquid leakage sensor 203a installed on a bottom surface of a drain pot 202, and a float-type liquid leakage sensor 203b disposed in the drain pot 202. The float-type liquid leakage sensor 203b structurally requires vertical movement for detecting a liquid leakage. Therefore, the drain pot 202 needs a depth to some extent, and the bottom surface of the drain pot 202 has projected below a lower surface 205 of the base frame of the substrate processing apparatus. In this case, in moving the substrate processing apparatus, the drain pot 202 may have been damaged when a fork of a fork lift abuts the bottom surface of the drain pot 202 to lift up.

Moreover, as illustrated in FIG. 24, in the conventional liquid-leakage detection part 200, the drain pot 202 has been formed separately from a drain pan 206 to be easily replaceable when the drain pot 202 is damaged. Accordingly, liquid may have leaked from between the drain pot 202 and the drain pan 206.

Whereas, in this embodiment, the two-stage-detection-type level sensor is configured by using two installation-type liquid leakage sensors 3a and 3b, as illustrated in FIG. 23. Therefore, a depth of the drain pot 2 can be made shallow, and the bottom surface of the drain pot 2 can be disposed above the lower surface 5 of the base frame of the substrate processing apparatus 10. This prevents damage of the drain pot 2 with a fork of a fork lift in moving the substrate processing apparatus 10.

Moreover, in this embodiment, since the depth of the drain pot 2 can be made shallow, the drain pot 2 can be integrally formed with the drain pan 6. In this case, it is possible to prevent a liquid leakage from between the drain pot 2 and the drain pan 6.

Figure 25:
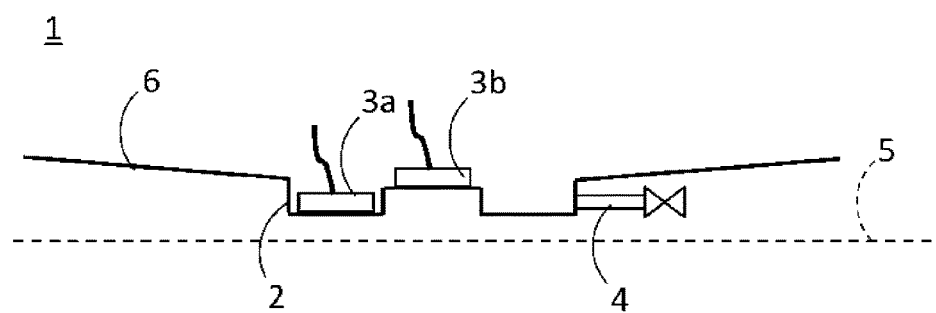
FIG. 25 is an exemplary view illustrating a modified example of the liquid-leakage detection part of the substrate processing apparatus illustrated in FIG. 1.

FIG. 25 is an exemplary view illustrating a modified example of the liquid-leakage detection part 1. In this modified example, a center portion of the bottom surface of the drain pot 2 is elevated one step, and the second installation-type liquid leakage sensor 3b is set at this portion elevated one step. According to such an aspect, in addition to providing an operation effect similar to the aspect illustrated in FIG. 23, it is possible to increase a capacity of the drain pot 2 while making its depth shallow, since the bottom surface of the drain pot 2 has a ring shape.

Figure 26:
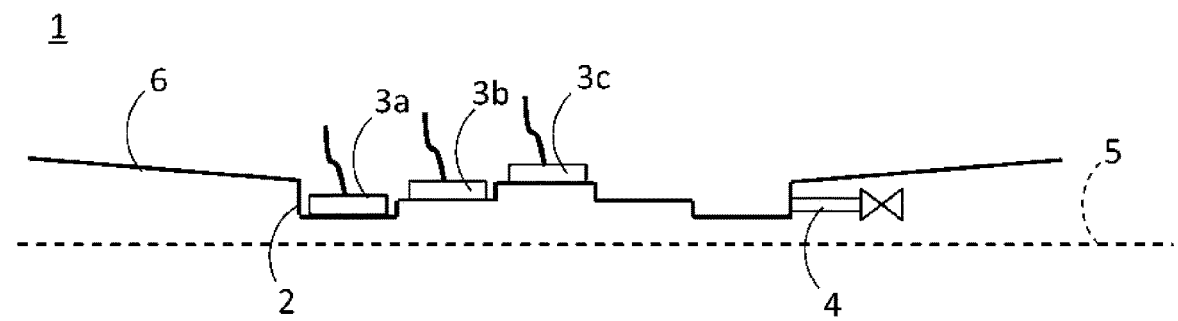
FIG. 26 is an exemplary view illustrating a modified example of the liquid-leakage detection part of the substrate processing apparatus illustrated in FIG. 1.

Additionally, as in a modified example illustrated in FIG. 26, a bottom surface of the drain pot 2 may be elevated in two steps toward a center portion, in which the second installation-type liquid leakage sensor 3b is installed at a portion elevated one step from the bottom surface, and a third installation-type liquid leakage sensor 3c is installed at a portion elevated one step from that portion. According to such an aspect, a liquid leakage can be detected in a three-step level. Likewise, the steps may be increased to four or more.

<Polishing Process Using Substrate Processing Apparatus>

Next, an example of a polishing process of a wafer W using a substrate processing apparatus 10 with such a configuration is described. The polishing process described below is performed by controlling an operation of the loading/unloading part 11, the polishing part 12, the cleaning part 13, and the transporting part 14, with the control part 15.

Figure 16A:
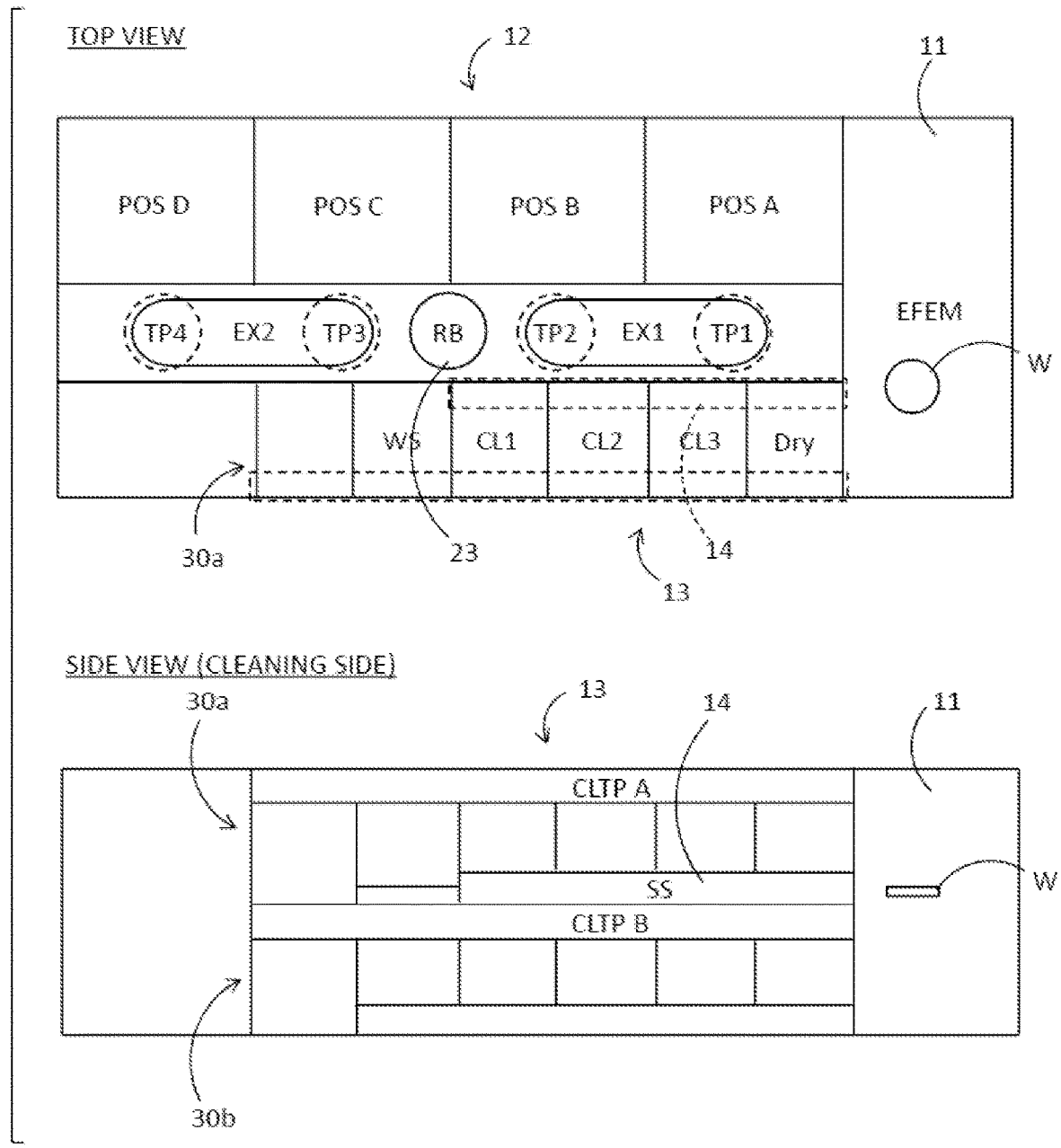
FIG. 16A is an exemplary view for explaining an operation of the transporting part.
Figure 16B:
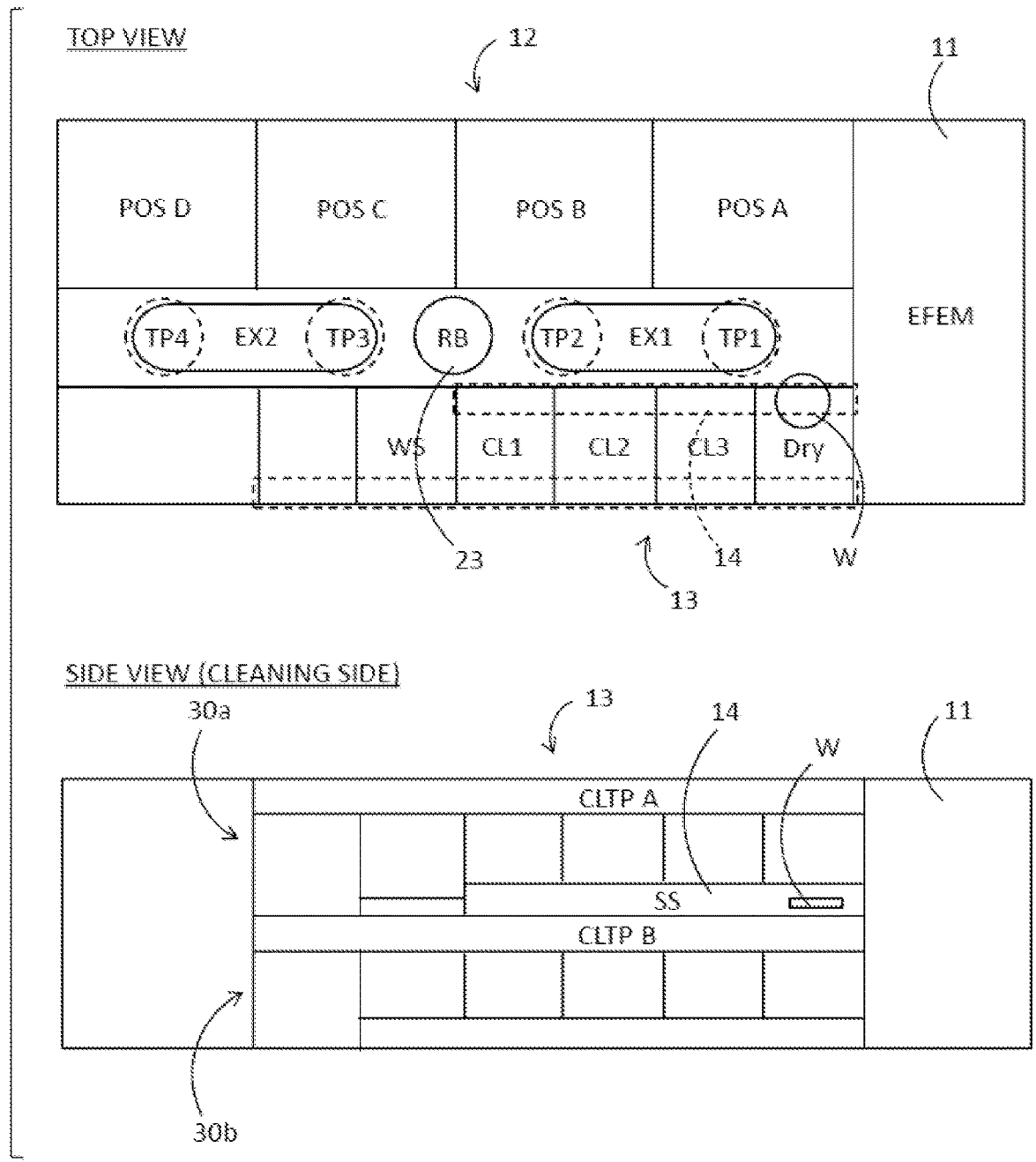
FIG. 16B is an exemplary view for explaining an operation of the transporting part.

Firstly, as illustrated in FIG. 16A, a wafer W before polishing is taken out from the wafer cassette of the front loading parts 113 by the transport robot 111 of the loading/unloading part 11, and moved to a position facing the carry-in port 41a of the transporting part 14. Then, as illustrated in FIG. 16B, after the carry-in port 41a of the transporting part 14 is opened, the wafer W held by the transport robot 111 is inserted into the cover 41 from the carry-in port 41a, and placed and supported on the slide stage 42.

Figure 16C:
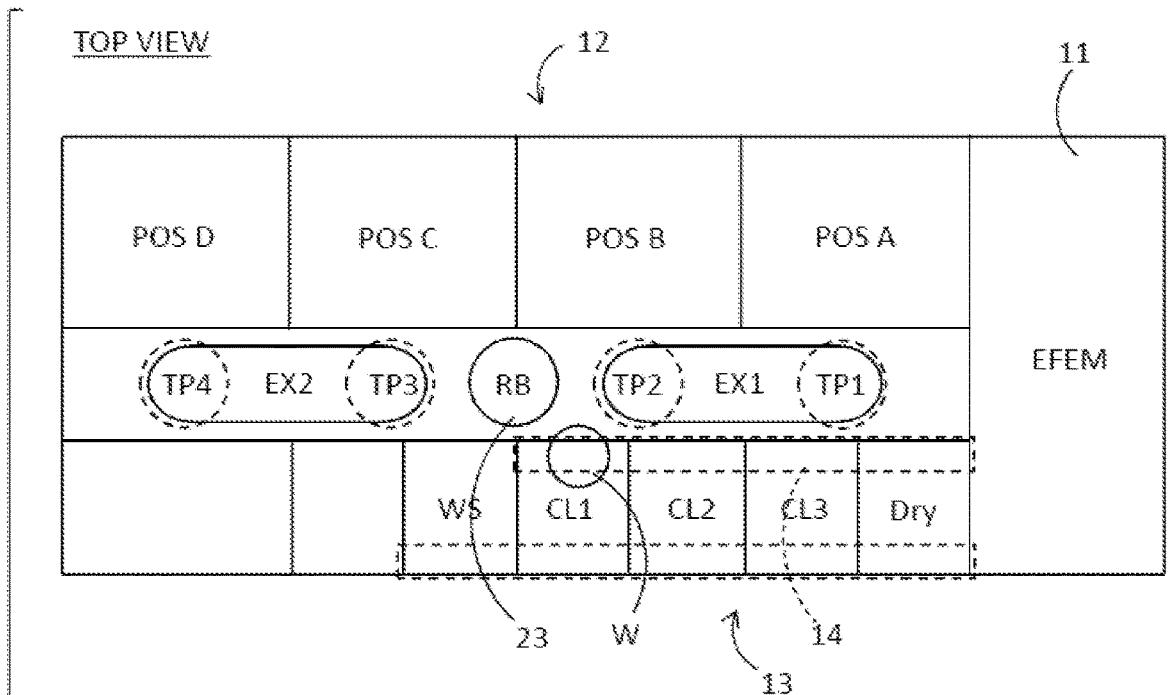
FIG. 16C is an exemplary view for explaining an operation of the transporting part.
Figure 16C:
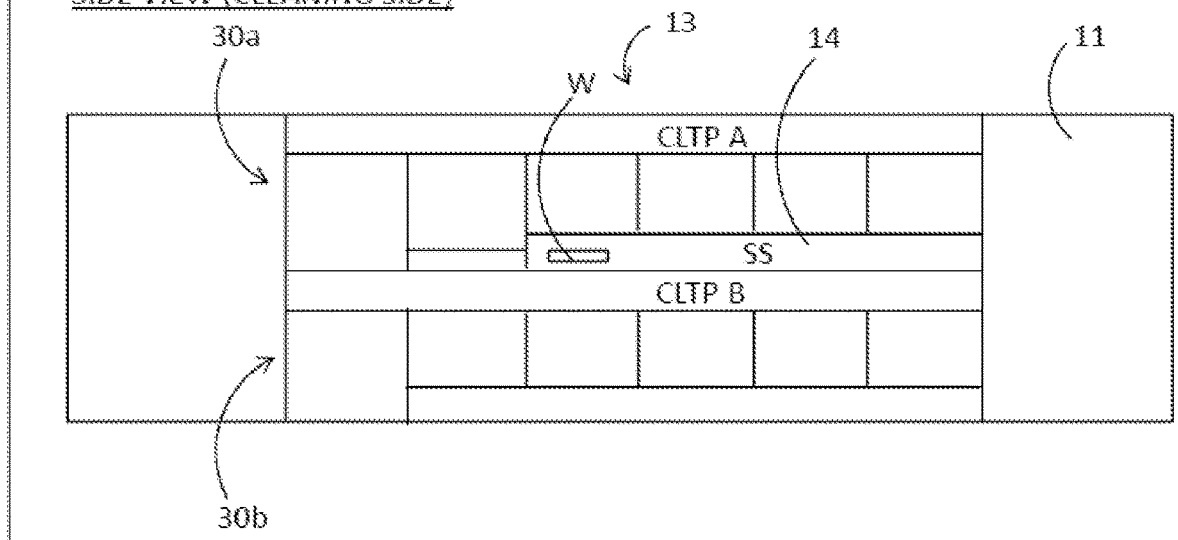

Next, as illustrated in FIG. 16C, the slide stage 42 holding the wafer W is moved to a position facing the carry-out port 41b along the longitudinal direction, by power applied from the stage-moving mechanism 43. Then, the carry-out port 41b of the transporting part 14 is opened. At this time, inside the cover 41 of the transporting part 14, an air flow flowing from the carry-in port 41a side to the carry-out port 41b is formed by the exhaust duct 44. This prevents diffusion of particles in the polishing part 12 into the loading/unloading part 11 through the transporting part 14.

Figure 17A:
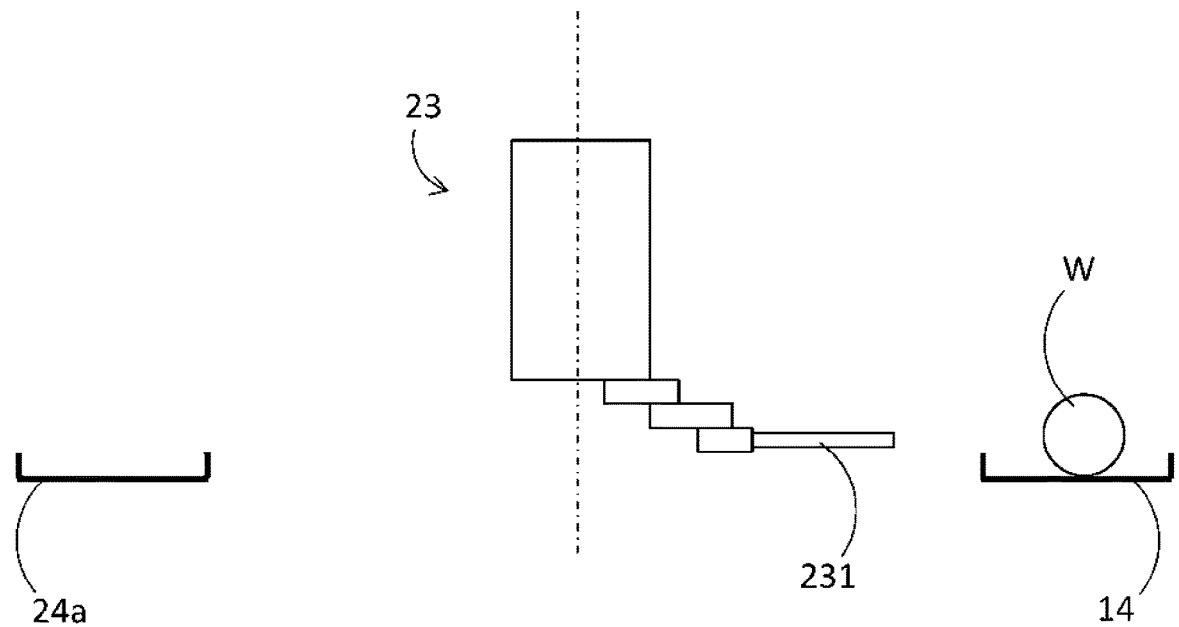
FIG. 17A is an exemplary view for explaining an operation of the transport robot.
Figure 17B:
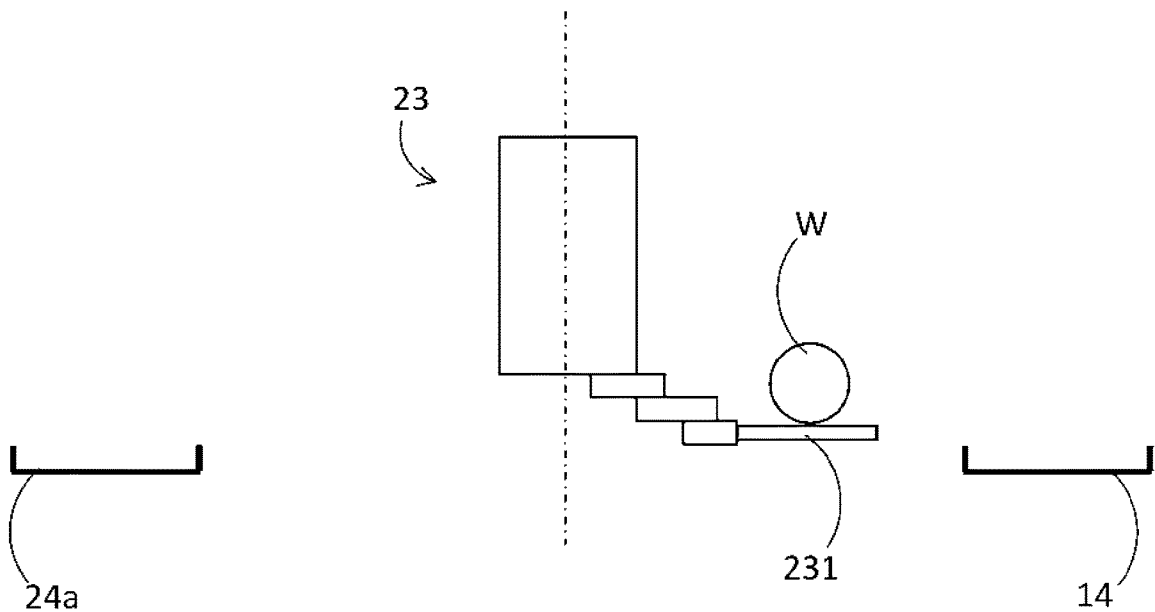
FIG. 17B is an exemplary view for explaining an operation of the transport robot.
Figure 17C:
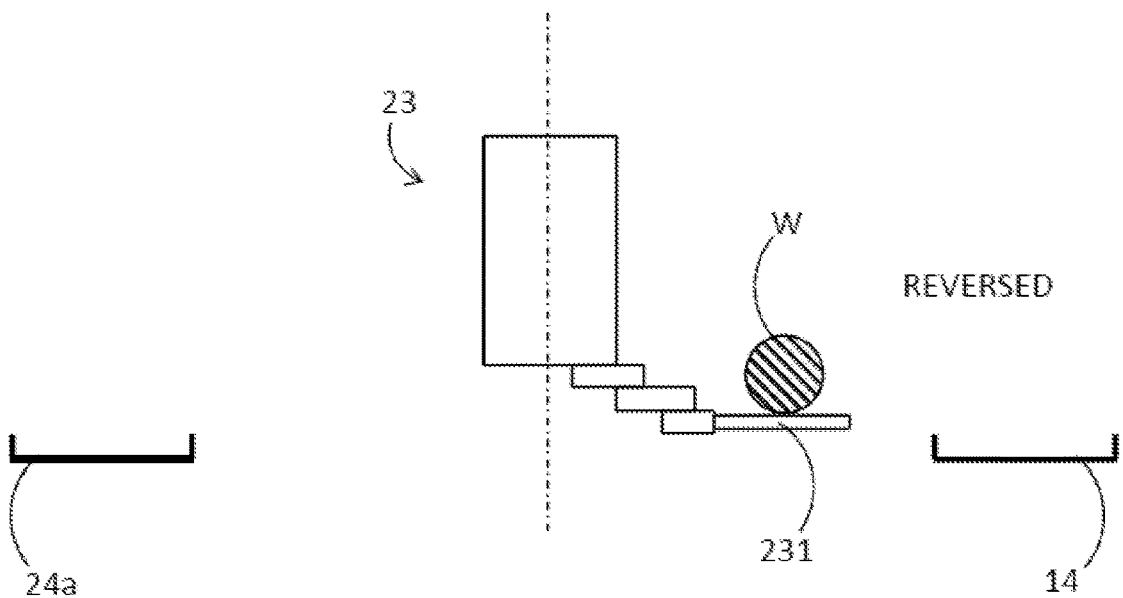
FIG. 17C is an exemplary view for explaining an operation of the transport robot.

As illustrated in FIG. 17A, with the hand 231 of the transport robot 23 of the polishing part 12 positioned at a height position same as that of the carry-out port 41b of the transporting part 14, the arm 232 of the transport robot 23 is extended. The hand 231 supported at a tip of the arm is inserted into the cover 41 through the carry-out port 41b, and inserted below the wafer W held on the slide stage 42. Next, the hand 231 is lifted, and the wafer W is transferred from the slide stage 42 to the hand 231. Then, as illustrated in FIG. 17B, the arm 232 is contracted to take out the wafer W held on the hand 231, from the transporting part 14 to the polishing part 12. After that, as illustrated in FIG. 17C, the hand 231 is vertically reversed together with the wafer W, by the reversing mechanism 234 of the transport robot 23. In the drawings, each of gray shaded wafers W indicates the vertically reversed wafer.

Figure 17D:
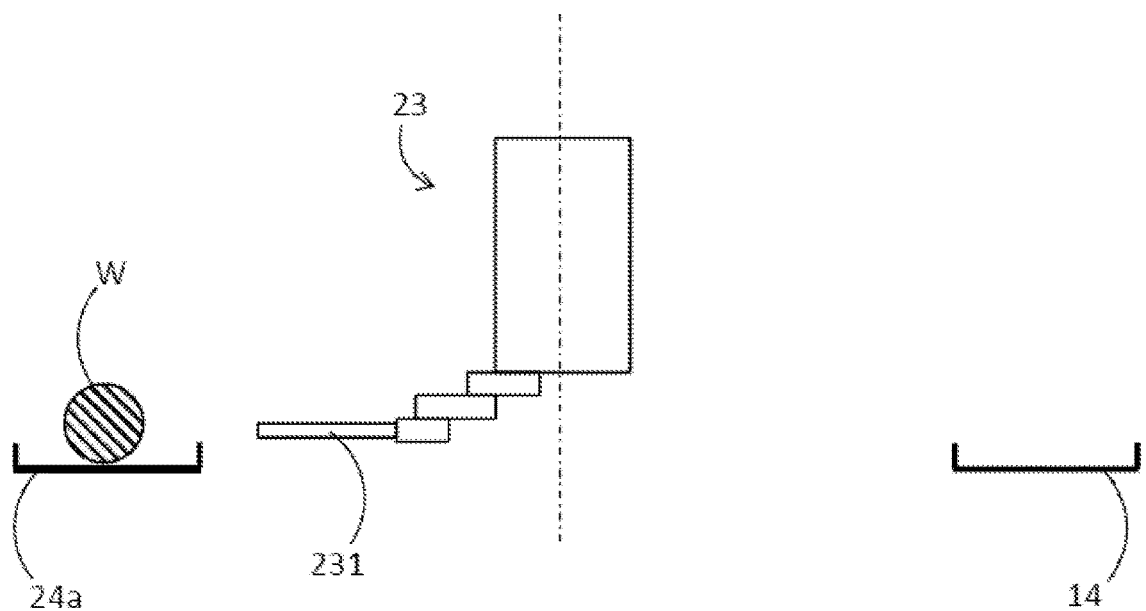
FIG. 17D is an exemplary view for explaining an operation of the transport robot.

Next, as illustrated in FIG. 17D, the arm 232 is rotated around an axis of the robot main body 233, and the hand 231 is directed to the first transport unit 24a side. Then, the arm 232 is extended, and the wafer W held by the hand 231 is transferred to the first transport unit 24a and transported from the first transport unit 24a to the first polishing unit 20a. When the first polishing unit 20a is congested or the like, the wafer W held by the hand 231 may be transferred to the second transport unit 24b, and the substrate may be carried into the second polishing unit 20b from the second transport unit 24b. In this embodiment, the wafers W transported from the transporting part 14 to the polishing part 12 are distributed to the first transport unit 24a and the second transport unit 24b by the transport robot 23, and a wafer W is carried into the first polishing unit 20a from the first transport unit 24a, while a wafer W is carried into the second polishing unit 20b from the second transport unit 24b. Thus, the first polishing unit 20a and the second polishing unit 20b do not share a carry-in path, eliminating congestion in carrying a substrate into the first polishing unit 20a and the second polishing unit 20b. Accordingly, a throughput of entire process is improved.

Since a wafer-transferring operation by the second transport unit 24b is similar to a wafer-transferring operation by the first transport unit 24a, the wafer-transferring operation by the first transport unit 24a is described below.

Figure 18A:
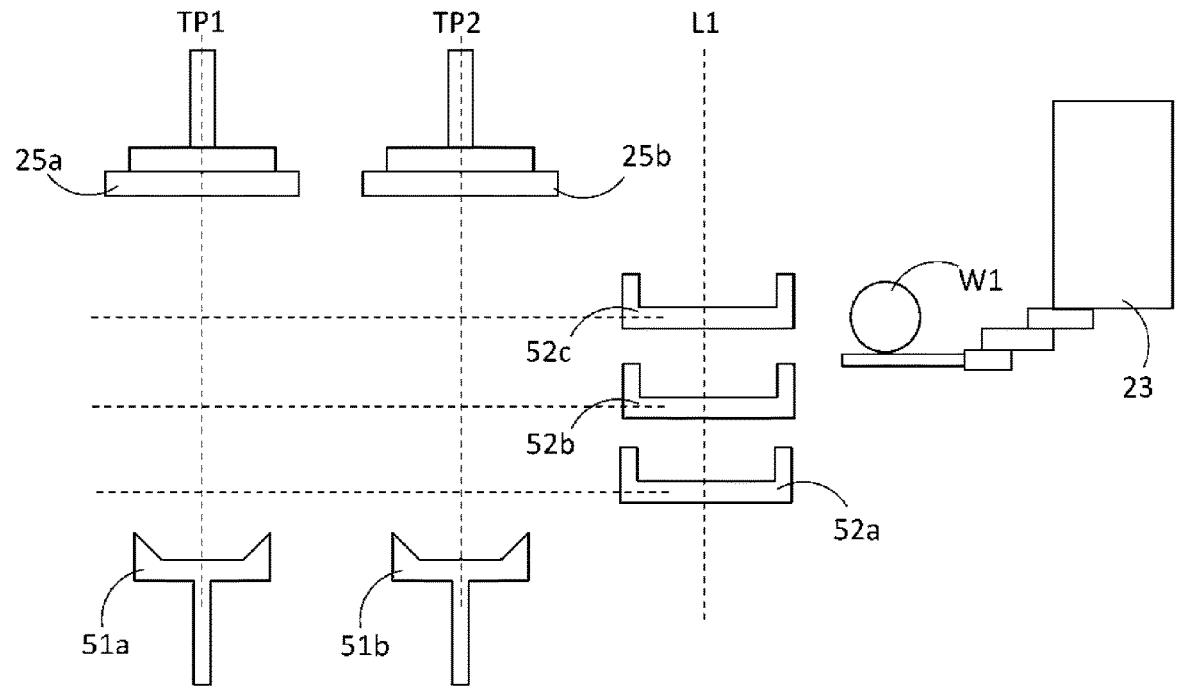
FIG. 18A is an exemplary view for explaining an operation of the first transport mechanism.
Figure 18B:
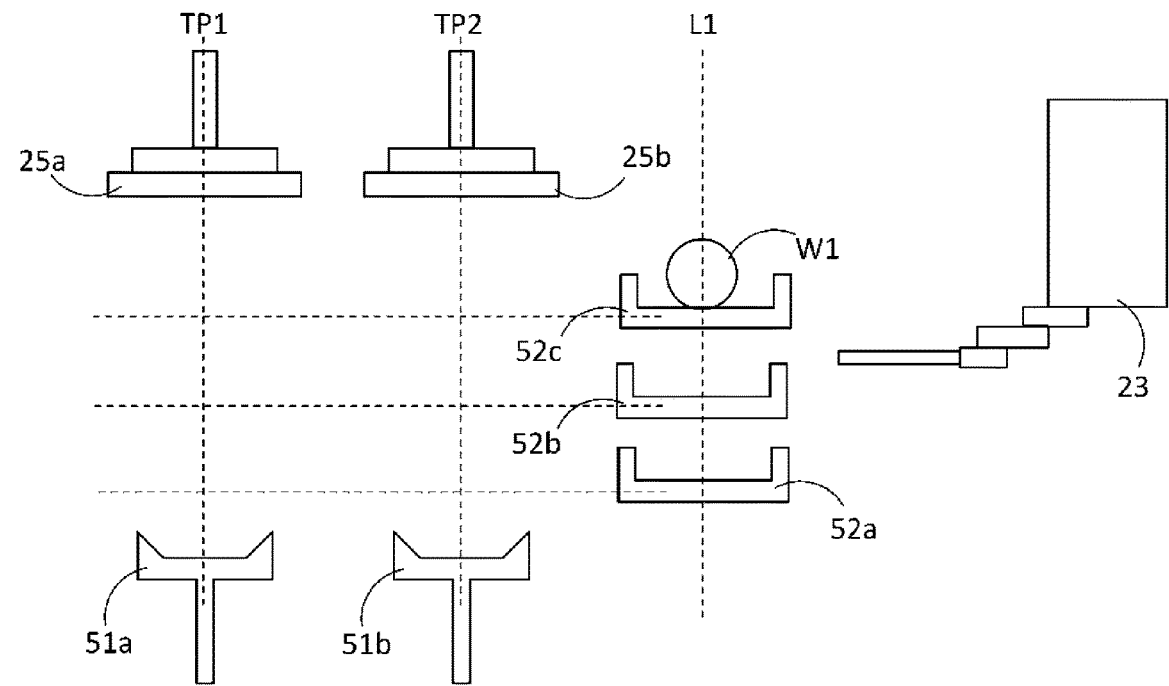
FIG. 18B is an exemplary view for explaining an operation of the first transport mechanism.
Figure 18C:
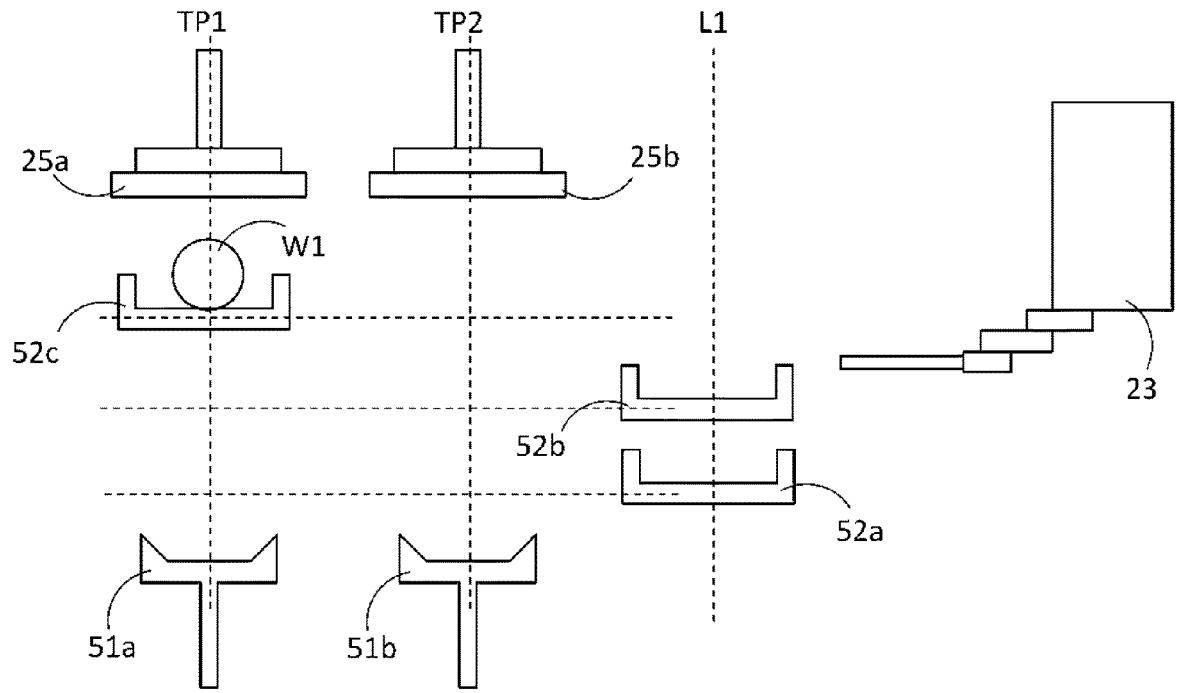
FIG. 18C is an exemplary view for explaining an operation of the first transport mechanism.

When one wafer is successively (in series) processed at the first polishing device 21a and the second polishing device 21b, as illustrated in FIGS. 18A and 18B, the first wafer W1 before polishing held by the transport robot 23 is transferred to the third stage 52c, of the exchanger 50, disposed at a standby position L1. Then, as illustrated in FIG. 18C, the third stage 52c holding the first wafer W1 is moved from the standby position L1 to the first substrate-transport position TP1.

Figure 18D:
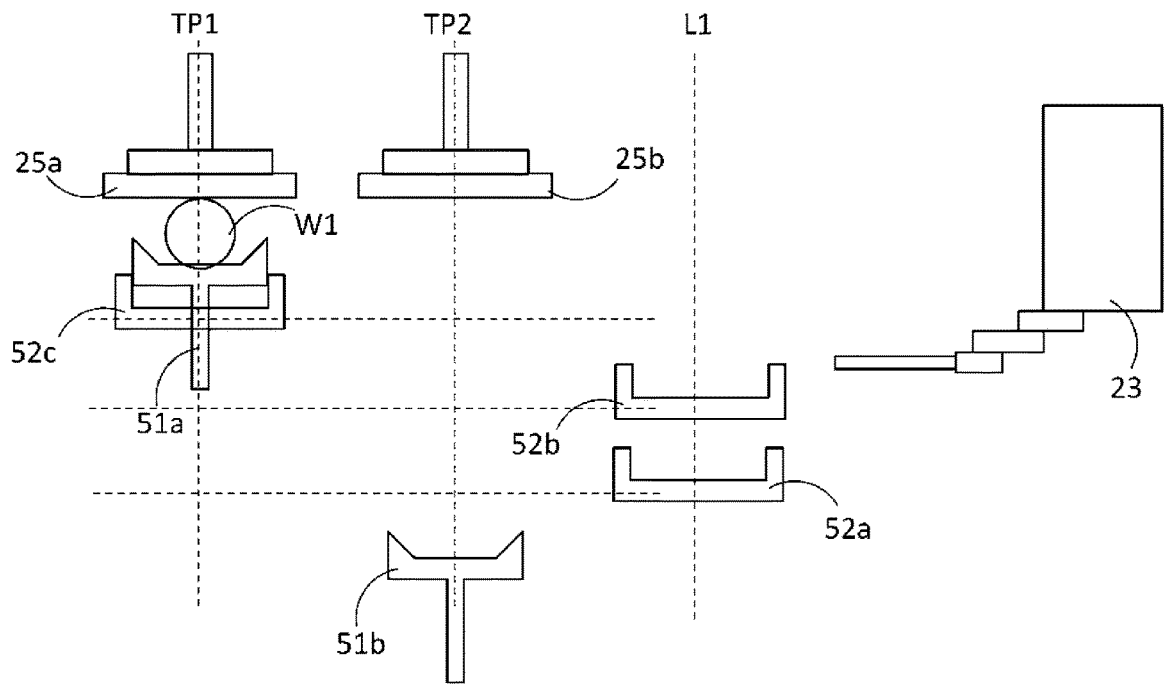
FIG. 18D is an exemplary view for explaining an operation of the first transport mechanism.
Figure 18E:
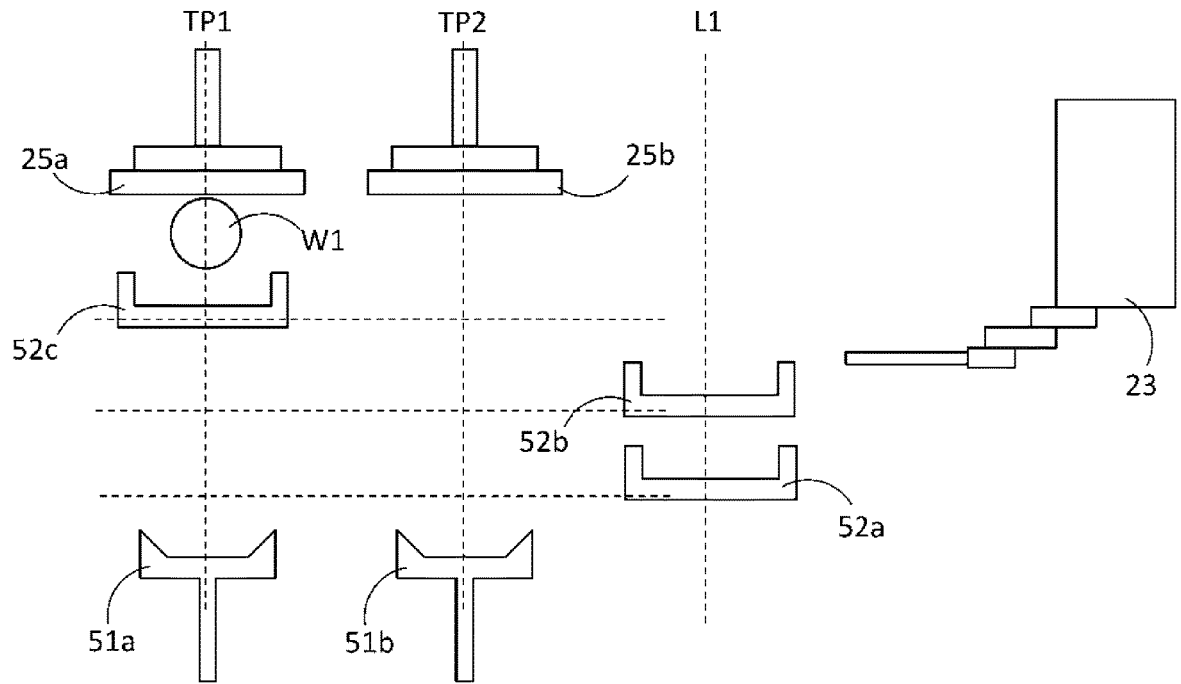
FIG. 18E is an exemplary view for explaining an operation of the first transport mechanism.
Figure 18F:
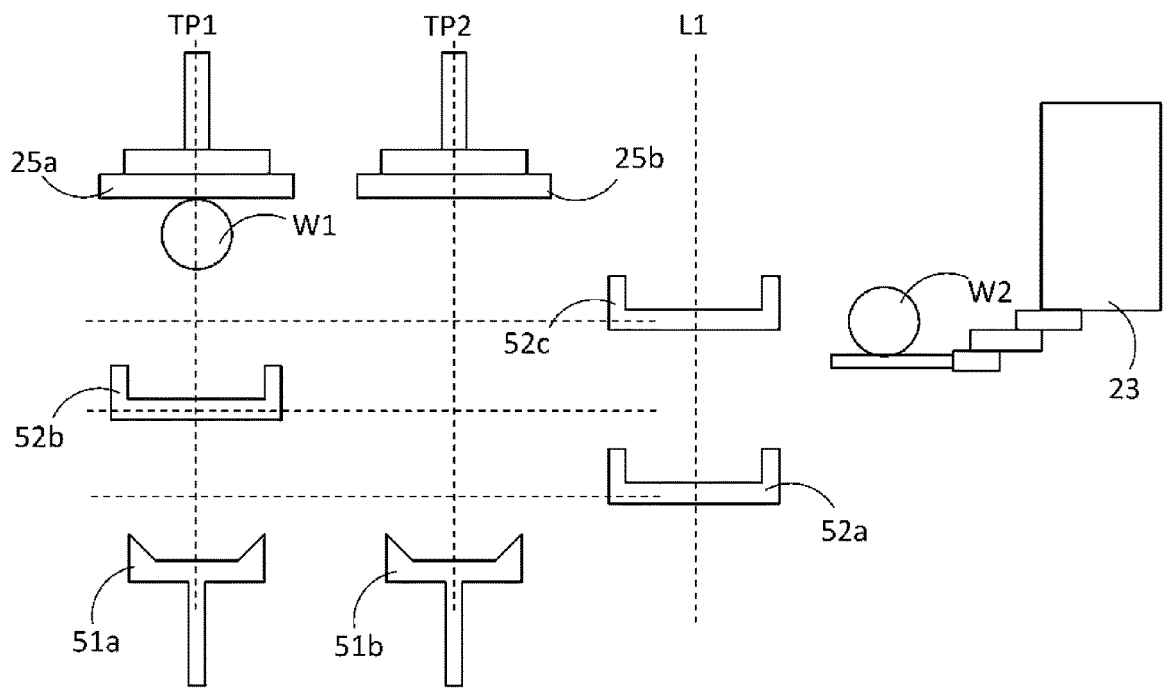
FIG. 18F is an exemplary view for explaining an operation of the first transport mechanism.

Next, as illustrated in FIG. 18D, the first pusher 51a ascends to pass inside the third stage 52c, and the first wafer W1 on the third stage 52c is pushed up by the first pusher 51a to be transferred to the top ring 25a of the first polishing device 21a. Then, after the first wafer W1 is sucked and held by the top ring 25a of the first polishing device 21a, as illustrated in FIG. 18E, the first pusher 51a descends to an initial height position. After that, as illustrated in FIG. 18F, the first wafer W1 is polished at a polishing position of the first polishing device 21a (more specifically, with reference to FIG. 4, the top ring 25a is moved onto the polishing pad 102a by a moving means that is not shown; the polishing pad 102a is abutted to the first wafer W1 held on the top ring 25a, by a lifting/lowering means that is not shown; and the first wafer W1 is polished by a relative movement of the top ring 25a and the polishing table 101a. A wafer W is similarly polished at a polishing position of other polishing devices below). At this time, the third stage 52c is moved from the first substrate-transport position TP1 to the standby position L1, the second stage 52b is moved from the standby position L1 to the first substrate-transport position TP1. The transport robot 23 holds the second wafer W2 before polishing.

Figure 18G:
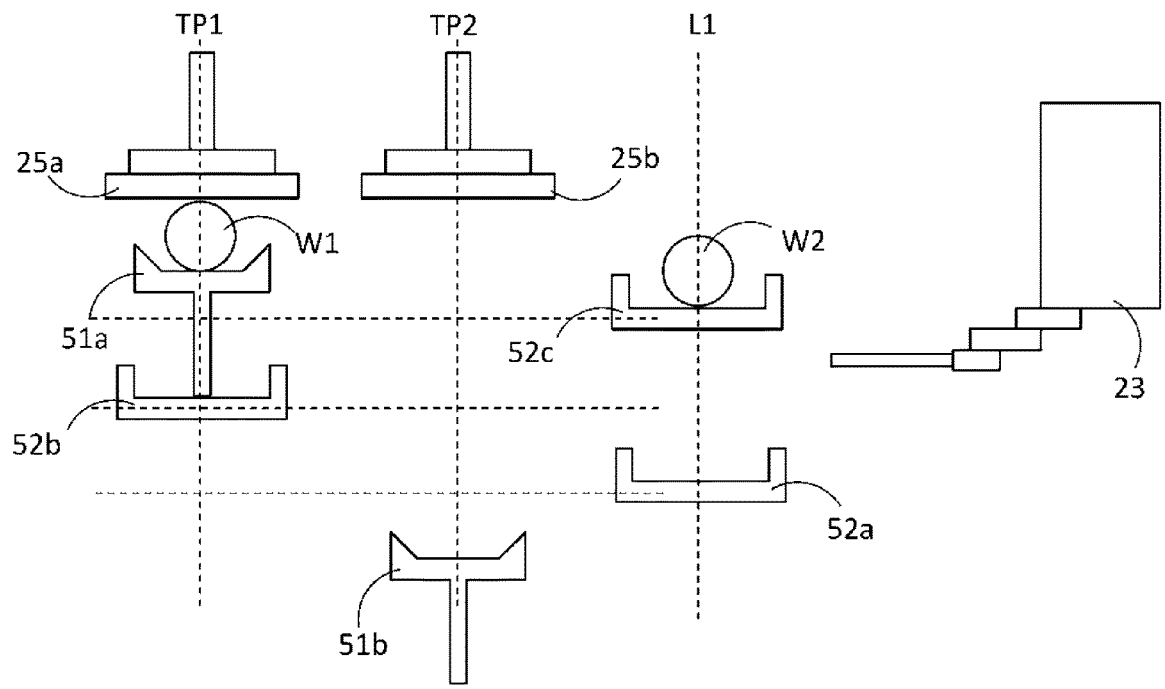
FIG. 18G is an exemplary view for explaining an operation of the first transport mechanism.
Figure 18H:
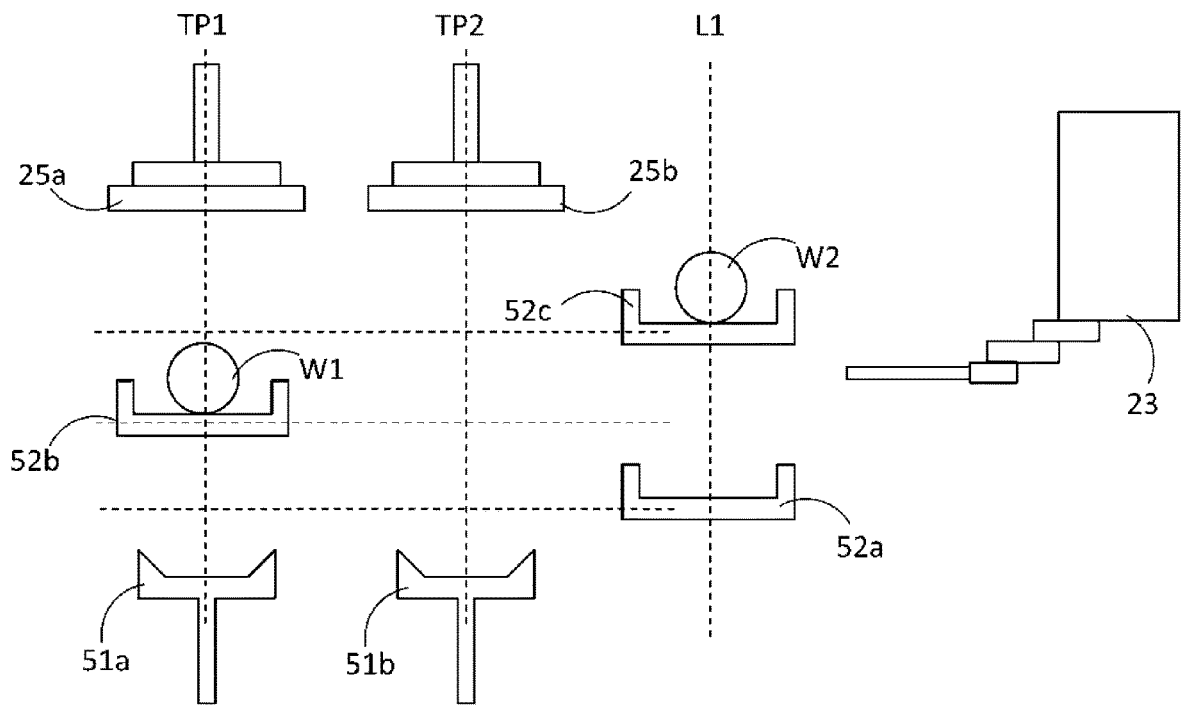
FIG. 18H is an exemplary view for explaining an operation of the first transport mechanism.

After the polishing of the first wafer W1 is finished at the first polishing device 21a, as illustrated in FIG. 18G, the first pusher 51a ascends to receive the polished first wafer W1 from the top ring 25a of the first polishing device 21a. Then, as illustrated in FIG. 18H, the first pusher 51a descends to pass through the second stage 52b, and the first wafer W1 on the first pusher 51a is transferred to the second stage 52b. The first wafer W1 held by the second stage 52b is cleaned by a cleaning nozzle (not shown) at the first substrate-transport position TP1. Further, the second wafer W2 before polishing held by the transport robot 23 is transferred to the third stage 52c disposed at the standby position L1.

Figure 18I:
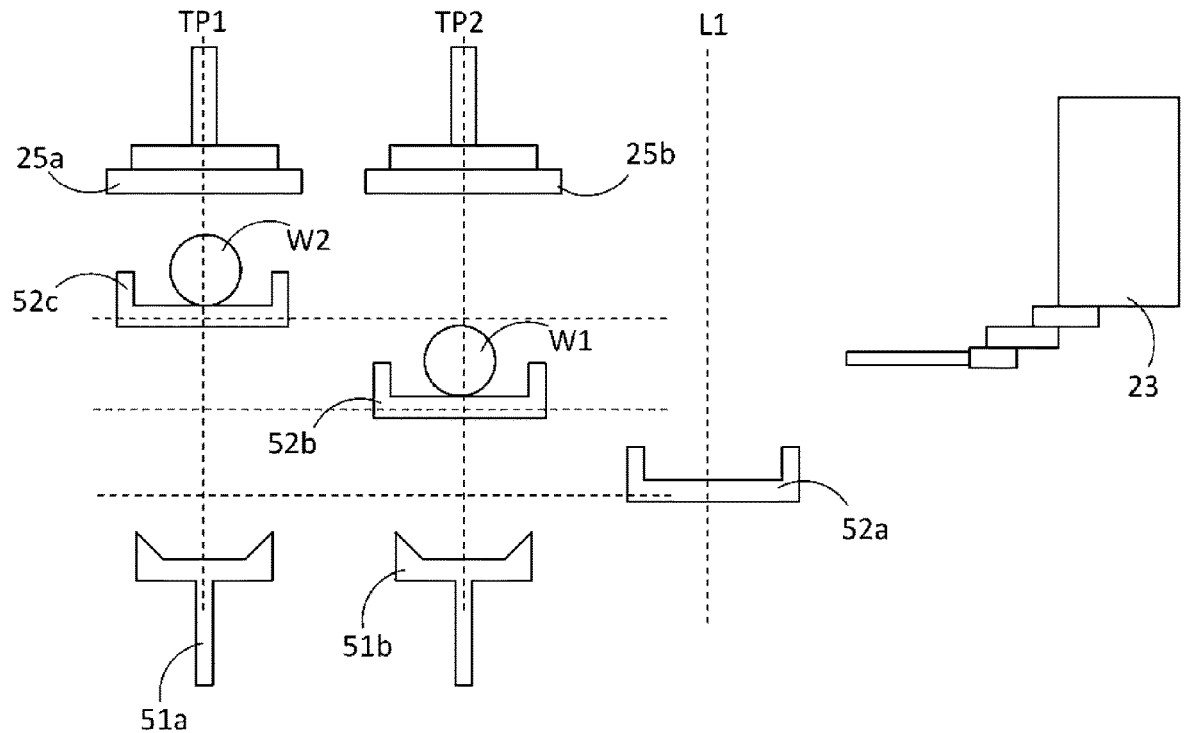
FIG. 18I is an exemplary view for explaining an operation of the first transport mechanism.

Next, as illustrated in FIG. 18I, the second stage 52b holding the first wafer W1 is moved from the first substrate-transport position TP1 to the second substrate-transport position TP2, and at the same time, the third stage 52c holding the second wafer W2 is moved from the standby position L1 to the first substrate-transport position TP1. Thus, two stages 52b and 52c respectively holding the wafers W1 and W2 can be moved crossing each other in opposite directions, improving a throughput of the process.

Figure 18J:
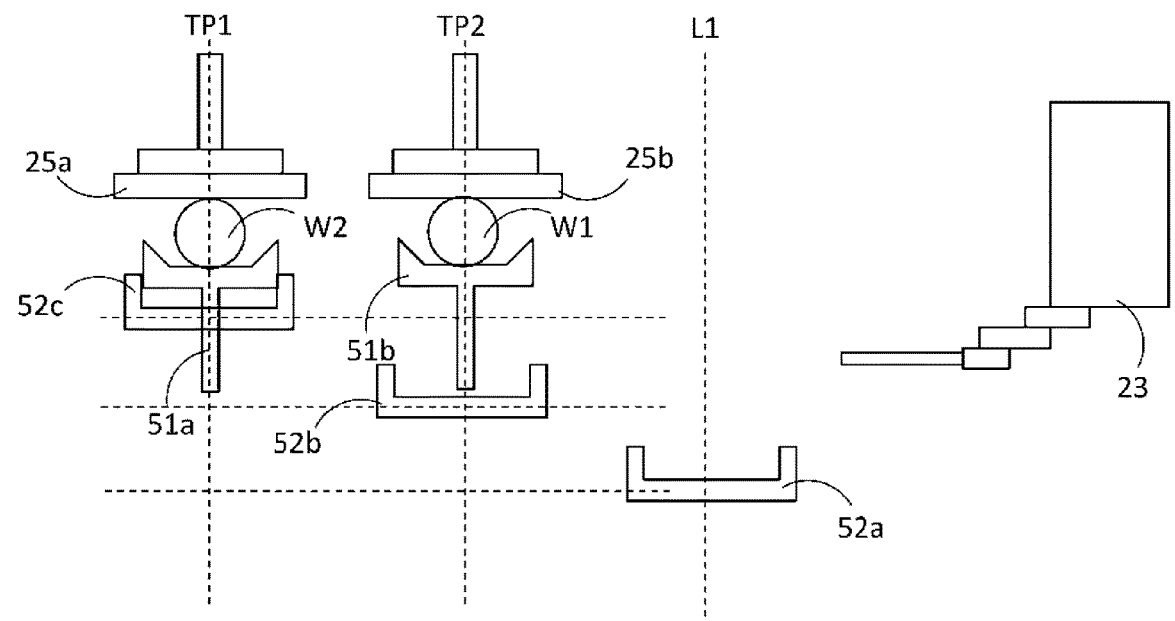
FIG. 18J is an exemplary view for explaining an operation of the first transport mechanism.
Figure 18K:
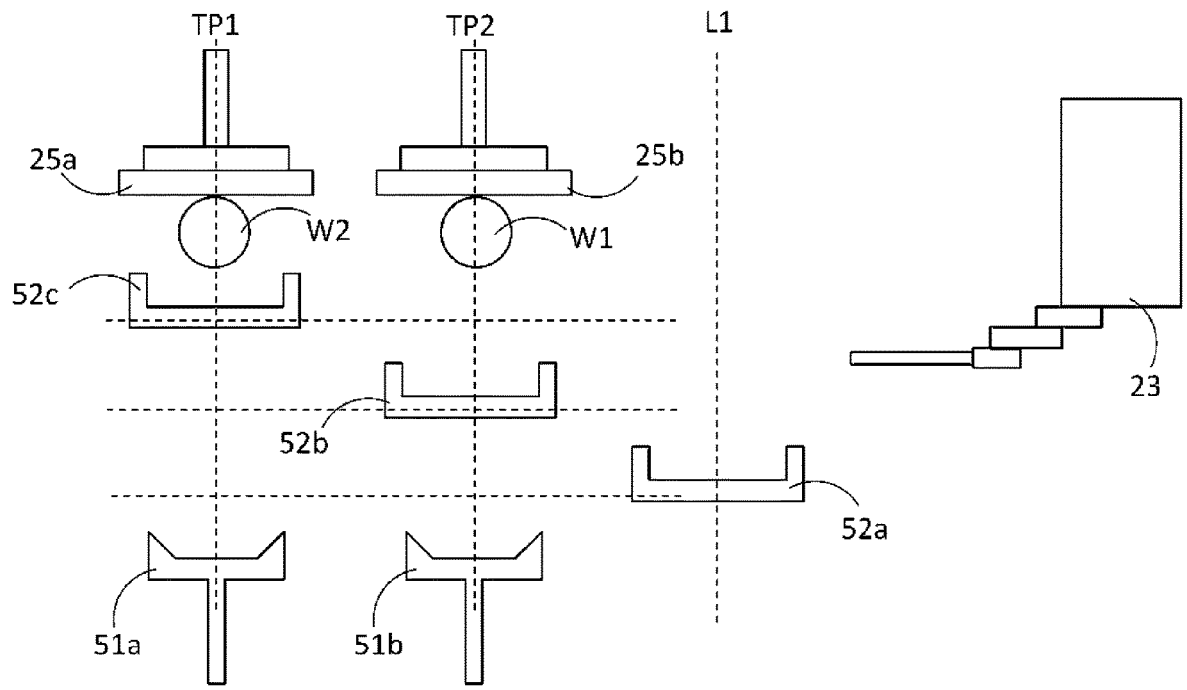
FIG. 18K is an exemplary view for explaining an operation of the first transport mechanism.

Next, as illustrated in FIG. 18J, the second pusher 51b ascends to pass inside the second stage 52b, and the first wafer W1 on the second stage 52b is pushed up by the second pusher 51b to be transferred to the top ring 25b of the second polishing device 21b. Additionally, the first pusher 51a ascends to pass inside the third stage 52c, and the second wafer W2 on the third stage 52c is pushed up by the first pusher 51a to be transferred to the top ring 25a of the first polishing device 21a. Then, as illustrated in FIG. 18K, after the first wafer W1 is sucked and held by the top ring 25b of the second polishing device 21b, the second pusher 51b descends to an initial height position. Additionally, after the second wafer W2 is sucked and held by the top ring 25a of the first polishing device 21a, the first pusher 51a descends to an initial height position.

Figure 18L:
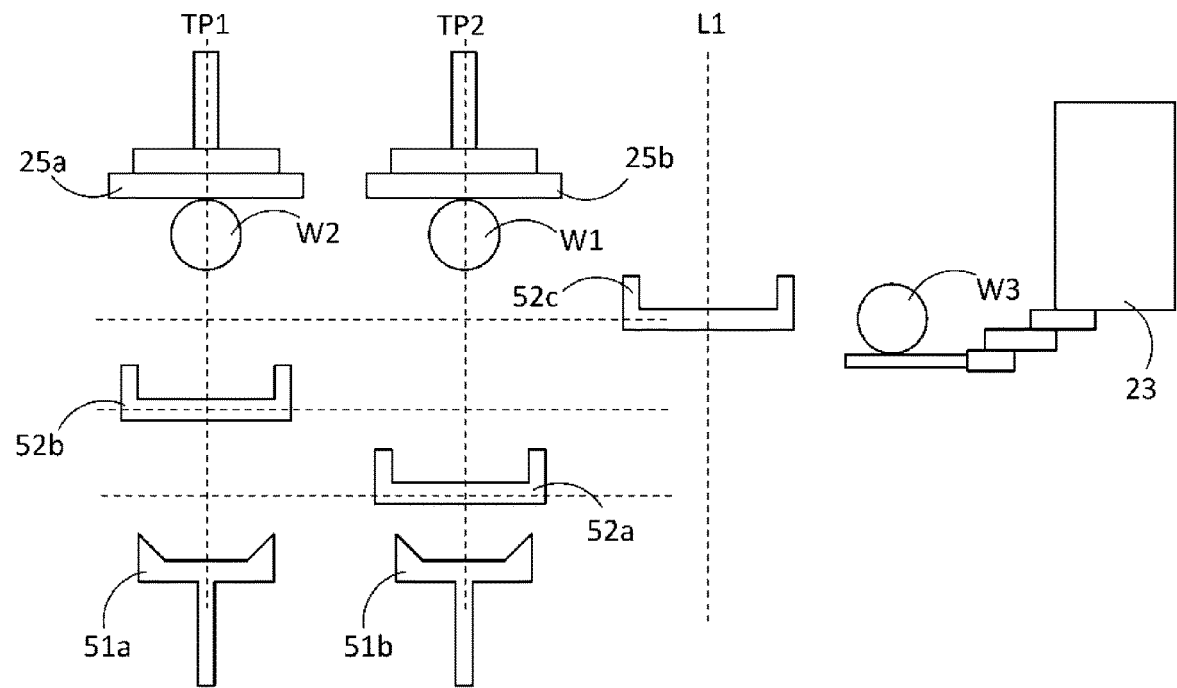
FIG. 18L is an exemplary view for explaining an operation of the first transport mechanism.

After that, as illustrated in FIG. 18L, the first wafer W1 is further polished at the second polishing device 21b, and the second wafer W2 is polished at the first polishing device 21a. At this time, the third stage 52c is moved from the first substrate-transport position TP1 to the standby position L1, the second stage 52b is moved from the second substrate-transport position TP2 to the first substrate-transport position TP1. Additionally, the first stage 52a is moved from the standby position L1 to the second substrate-transport position TP2. The transport robot 23 holds a third wafer W3 before polishing.

Figure 18M:
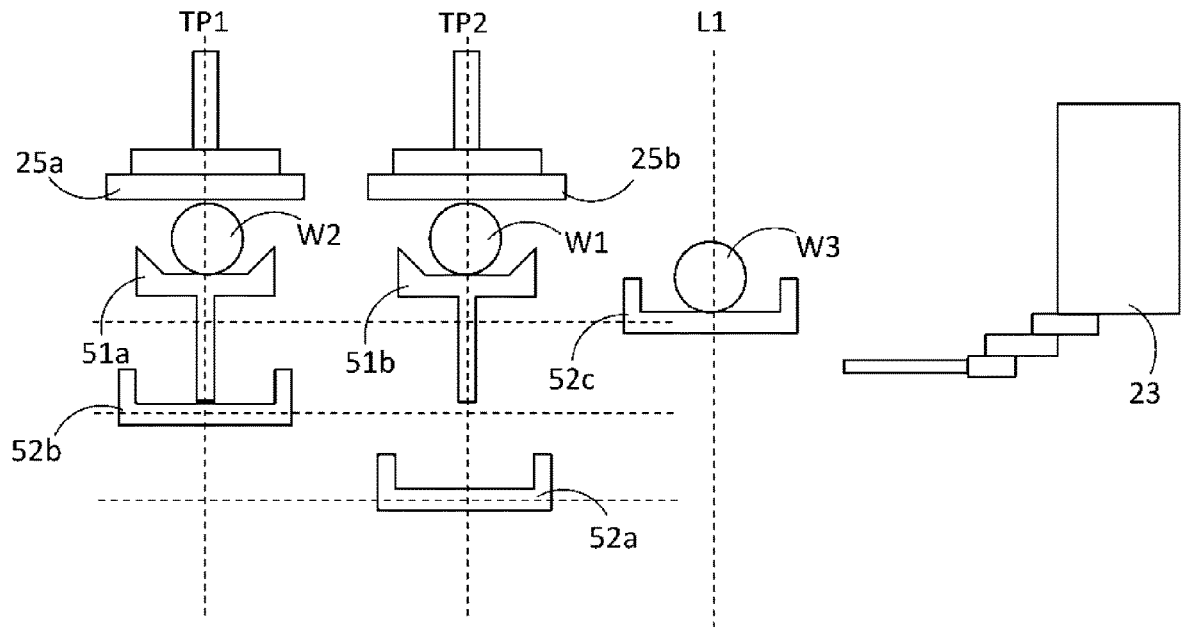
FIG. 18M is an exemplary view for explaining an operation of the first transport mechanism.

After the polishing of the first wafer W1 is finished at the second polishing device 21b, as illustrated in FIG. 18M, the second pusher 51b ascends to receive the polished first wafer W1 from the top ring 25b of the second polishing device 21b. Additionally, after the polishing of the second wafer W2 is finished at the first polishing device 21a, the first pusher 51a ascends to receive the polished second wafer W2 from the top ring 25a of the first polishing device 21a.

Figure 18N:
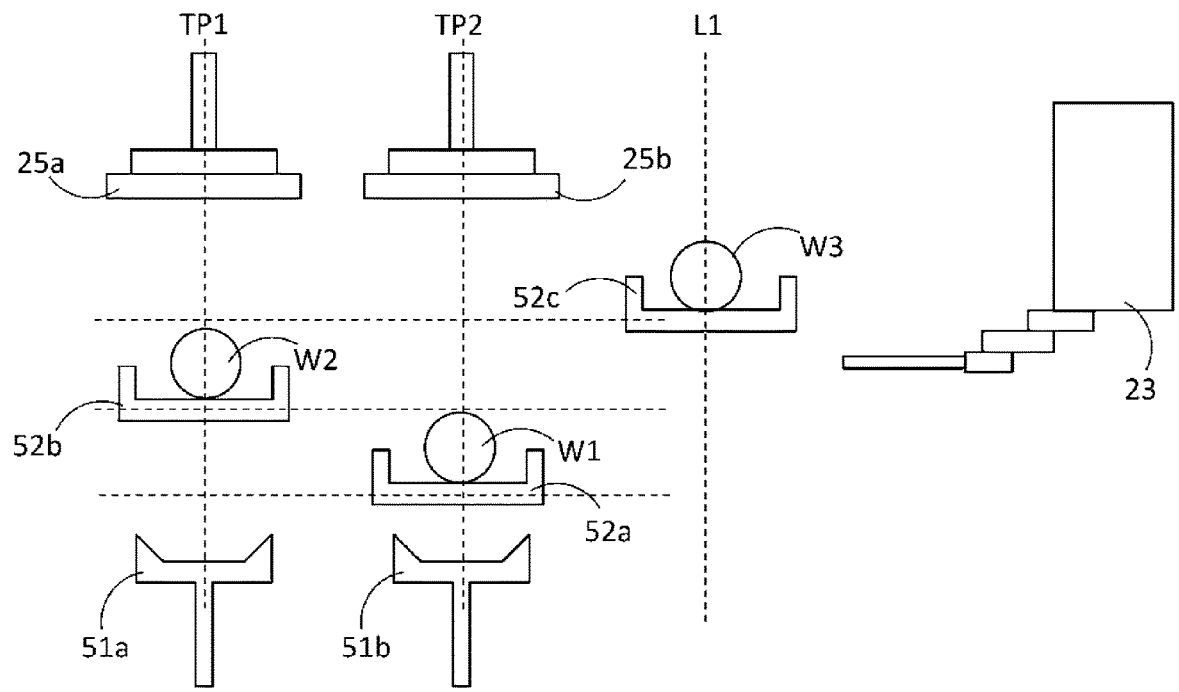
FIG. 18N is an exemplary view for explaining an operation of the first transport mechanism.

Then, as illustrated in FIG. 18N, the second pusher 51b descends to pass through the first stage 52a, and the first wafer W1 on the second pusher 51b is transferred to the first stage 52a. The first wafer W1 held by the first stage 52a is cleaned by a cleaning nozzle (not shown) at the second substrate-transport position TP2. Further, the first pusher 51a descends to pass through the second stage 52b, and the second wafer W2 on the first pusher 51a is transferred to the second stage 52b. The second wafer W2 held by the second stage 52b is cleaned by a cleaning nozzle (not shown) at the first substrate-transport position TP1. The third wafer W3 before polishing held by the transport robot 23 is transferred to the third stage 52c disposed at the standby position L1.

Figure 18O:
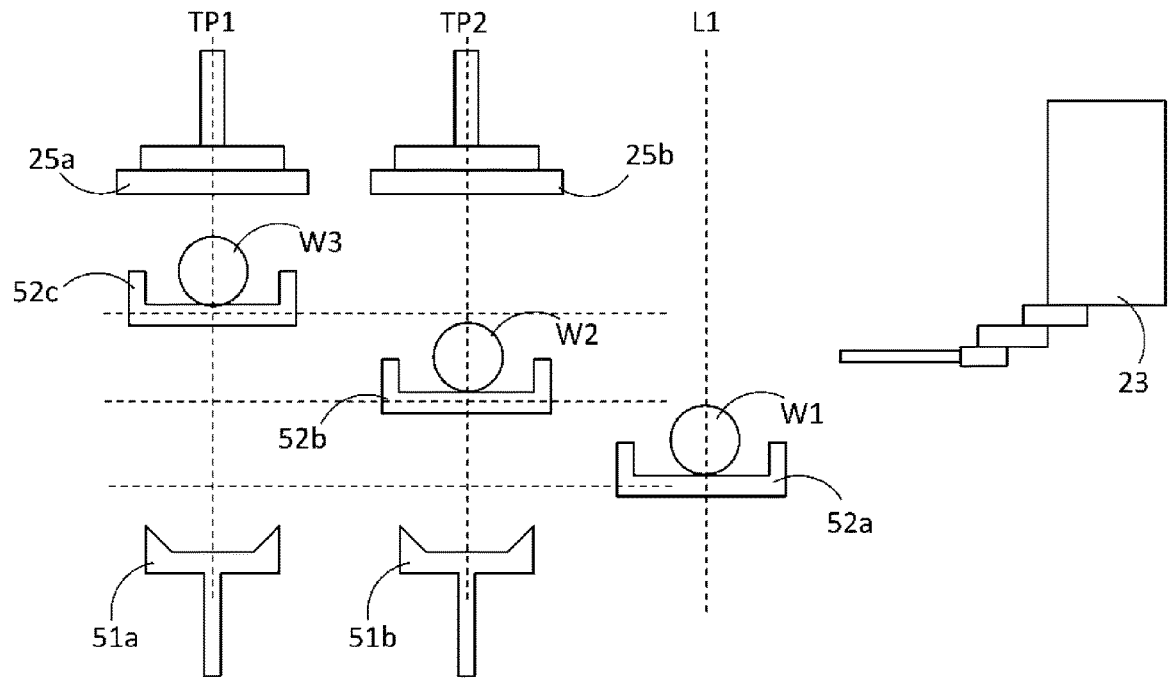
FIG. 18O is an exemplary view for explaining an operation of the first transport mechanism.

Next, as illustrated in FIG. 18O, the first stage 52a holding the first wafer W1 is moved from the second substrate-transport position TP2 to the standby position L1, and the first wafer W1 held by the first stage 52a is taken out from above the first stage 52a by the transport robot 23. Whereas, the second stage 52b holding the second wafer W2 is moved from the first substrate-transport position TP1 to the second substrate-transport position TP2, for polishing process at the second polishing device 21b. At the same time, the third stage 52c holding the third wafer W3 is moved from the standby position L1 to the first substrate-transport position TP1, for polishing process at the first polishing device 21b.

Figure 19A:
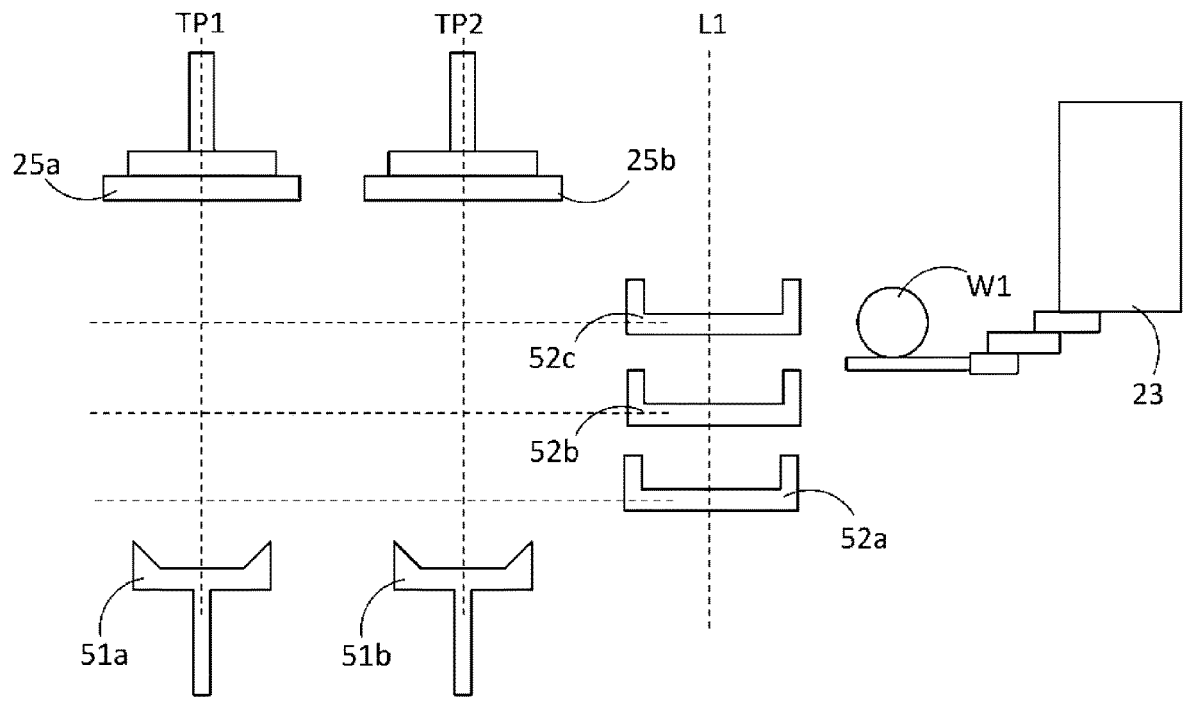
FIG. 19A is an exemplary view for explaining an operation of the first transport mechanism.
Figure 19B:
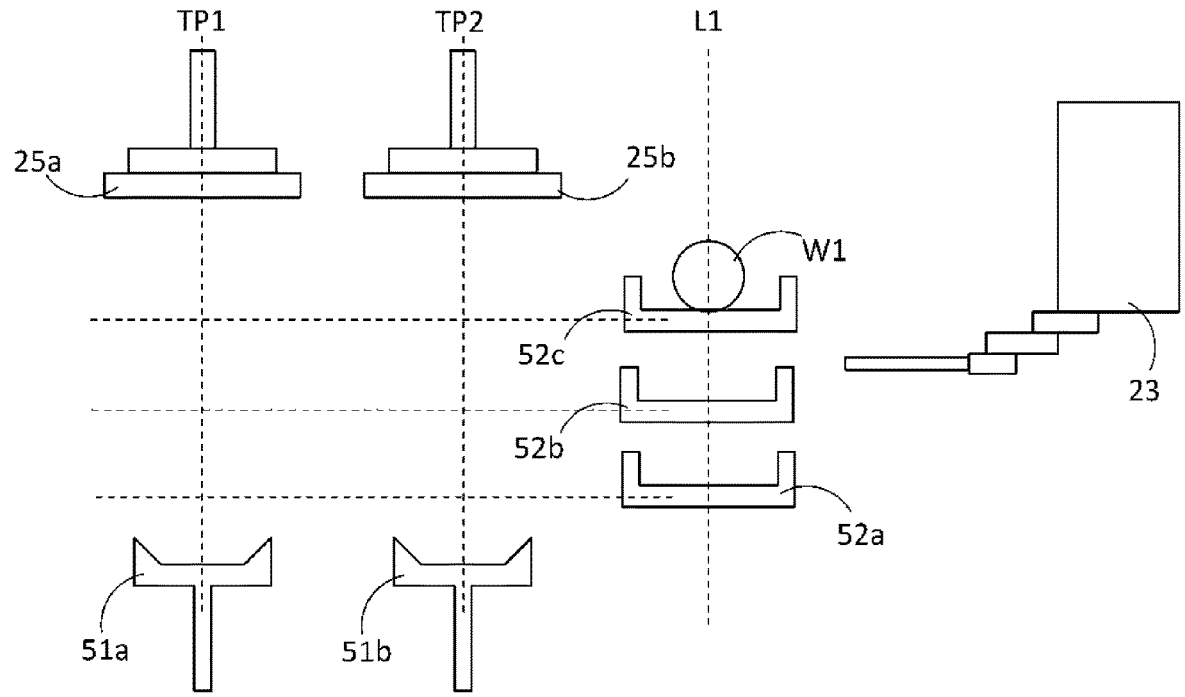
FIG. 19B is an exemplary view for explaining an operation of the first transport mechanism.
Figure 19C:
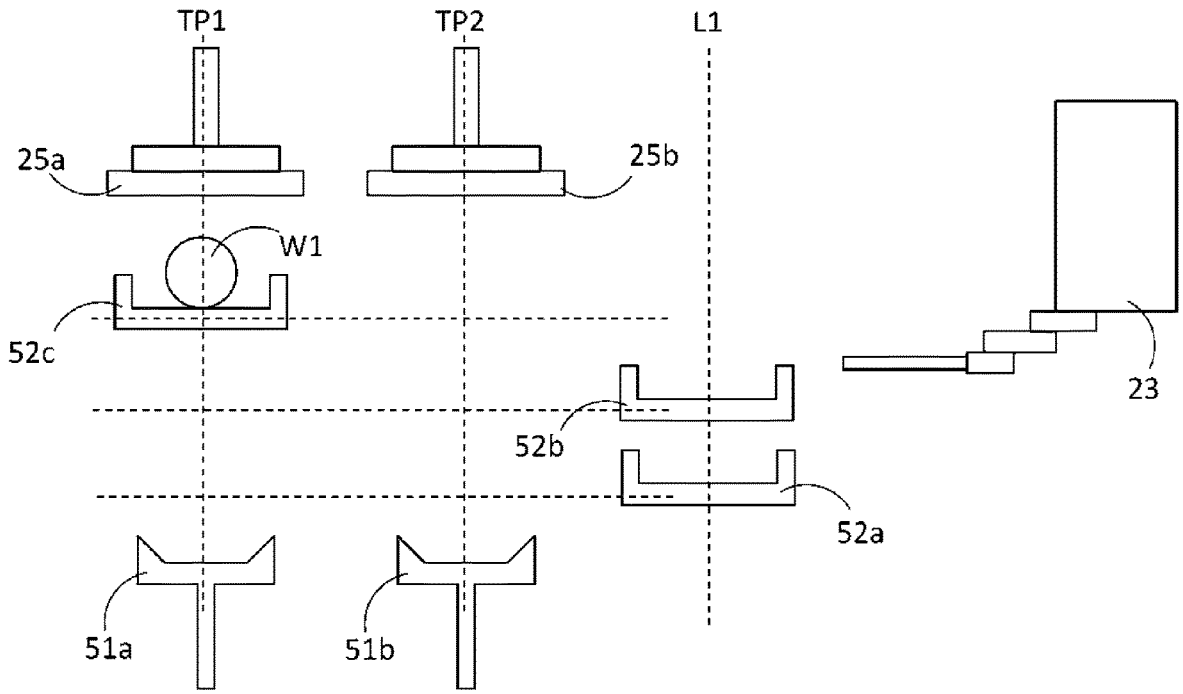
FIG. 19C is an exemplary view for explaining an operation of the first transport mechanism.

When two wafers are simultaneously (in parallel) processed at the first polishing device 21a and the second polishing device 21b, as illustrated in FIGS. 19A and 19B, the first wafer W1 before polishing held by the transport robot 23 is transferred to the third stage 52c, of the exchanger 50, disposed at the standby position L1. Then, as illustrated in FIG. 19C, the third stage 52c holding the first wafer W1 is moved from the standby position L1 to the first substrate-transport position TP1.

Figure 19D:
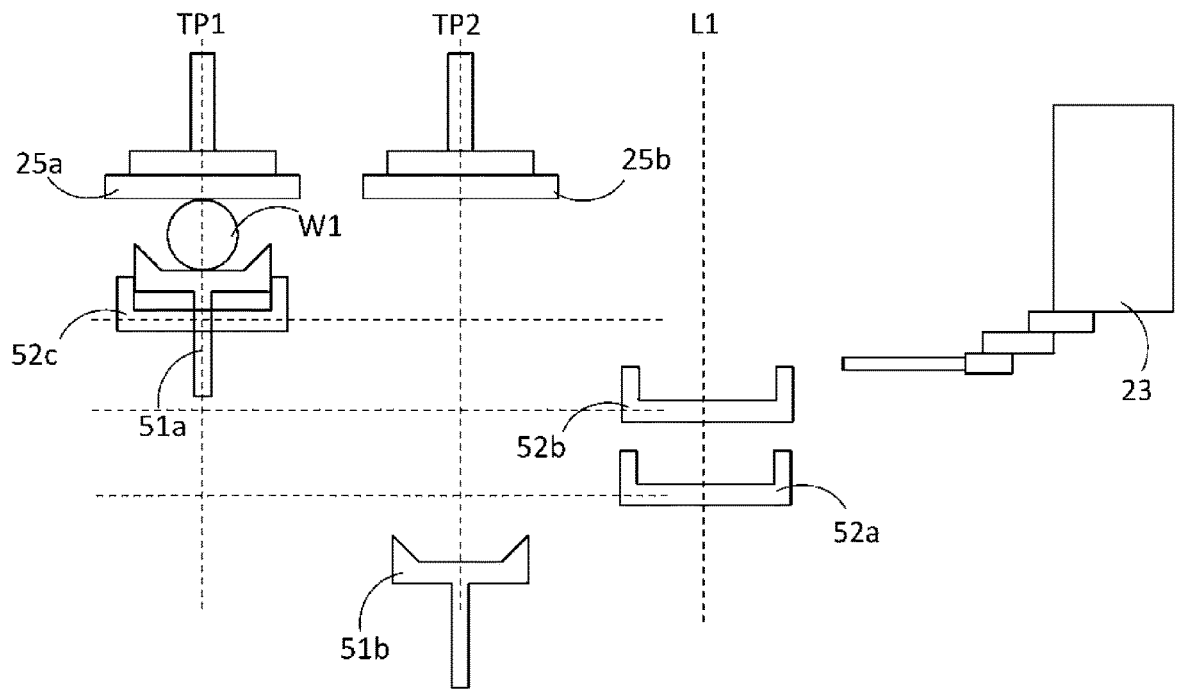
FIG. 19D is an exemplary view for explaining an operation of the first transport mechanism.
Figure 19E:
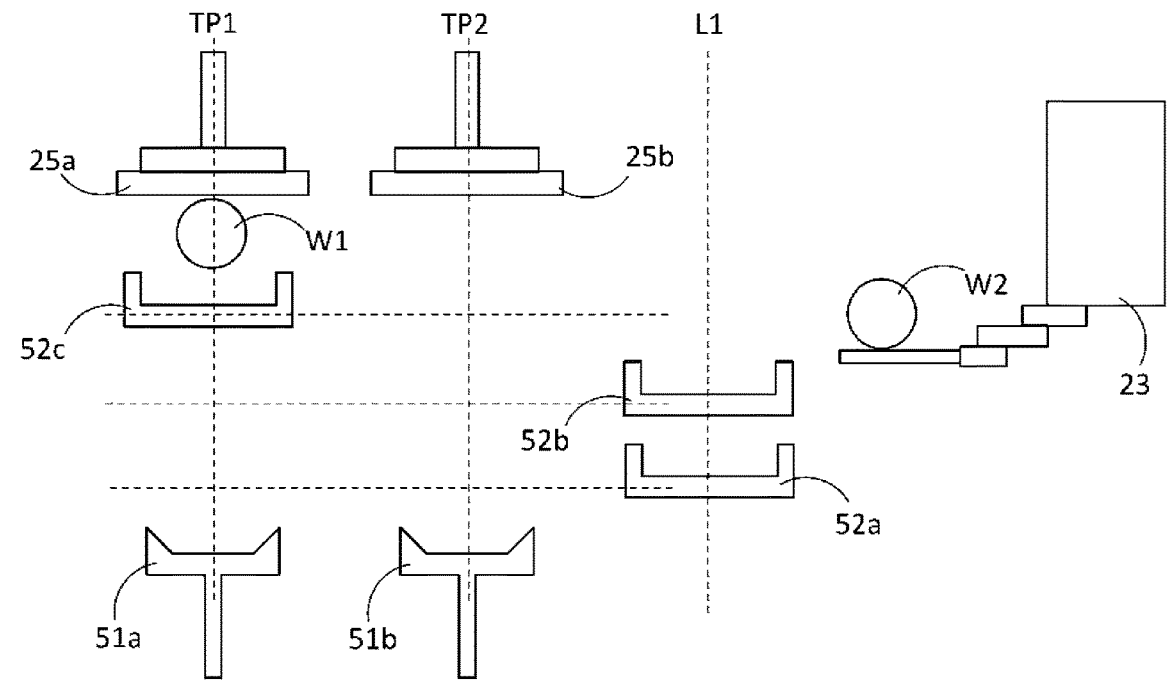
FIG. 19E is an exemplary view for explaining an operation of the first transport mechanism.

Next, as illustrated in FIG. 19D, the first pusher 51a ascends to pass inside the third stage 52c, and the first wafer W1 on the third stage 52c is pushed up by the first pusher 51a to be transferred to the top ring 25a of the first polishing device 21a. Then, after the first wafer W1 is sucked and held by the top ring 25a of the first polishing device 21a, as illustrated in FIG. 19E, the first pusher 51a descends to an initial height position. The transport robot 23 holds the second wafer W2 before polishing.

Figure 19F:
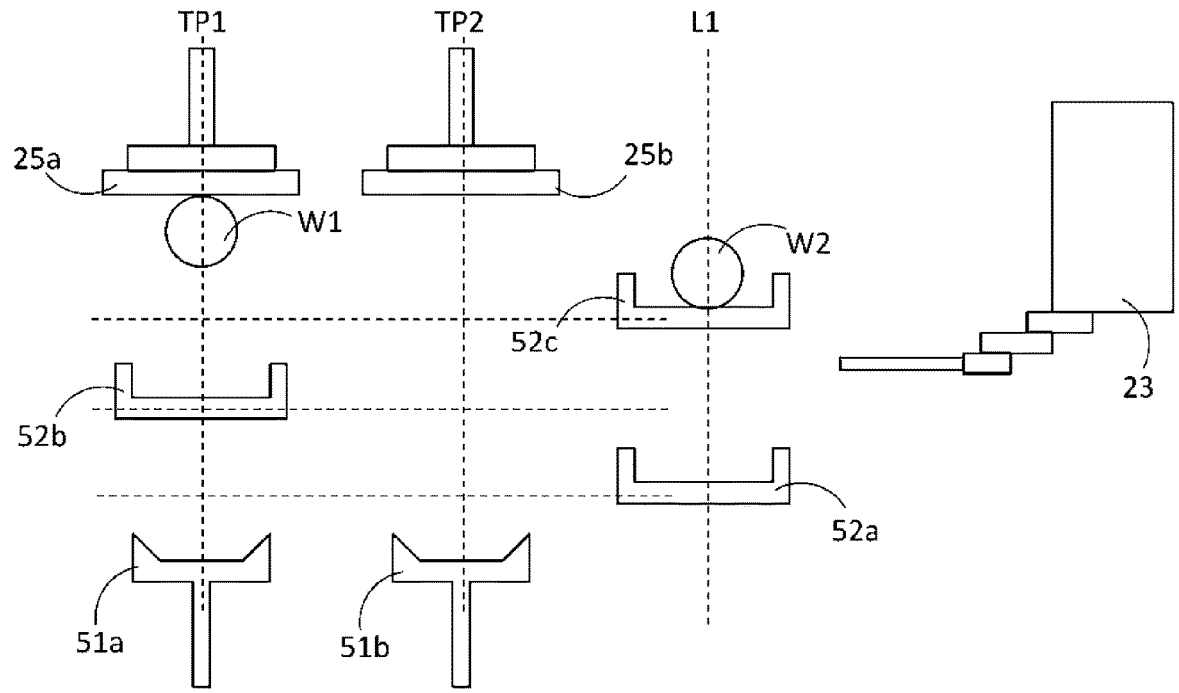
FIG. 19F is an exemplary view for explaining an operation of the first transport mechanism.
Figure 19G:
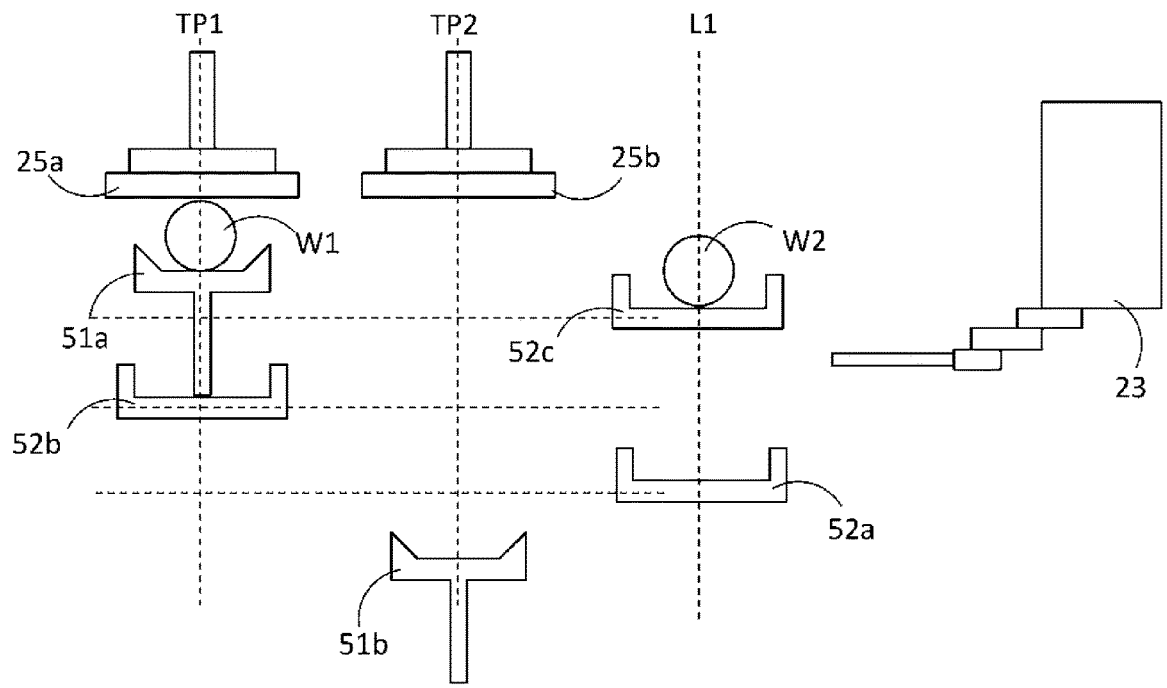
FIG. 19G is an exemplary view for explaining an operation of the first transport mechanism.

After that, as illustrated in FIG. 19F, the first wafer W1 is polished at the first polishing device 21a. At this time, the third stage 52c is moved from the first substrate-transport position TP1 to the standby position L1, the second stage 52b is moved from the standby position L1 to the first substrate-transport position TP1. The second wafer W2 before polishing held by the transport robot 23 is transferred to the third stage 52c disposed at the standby position L1. Then, as illustrated in FIG. 19G, the third stage 52c holding the second wafer W2 is moved from the standby position L1 to the second substrate-transport position TP2.

Figure 31:
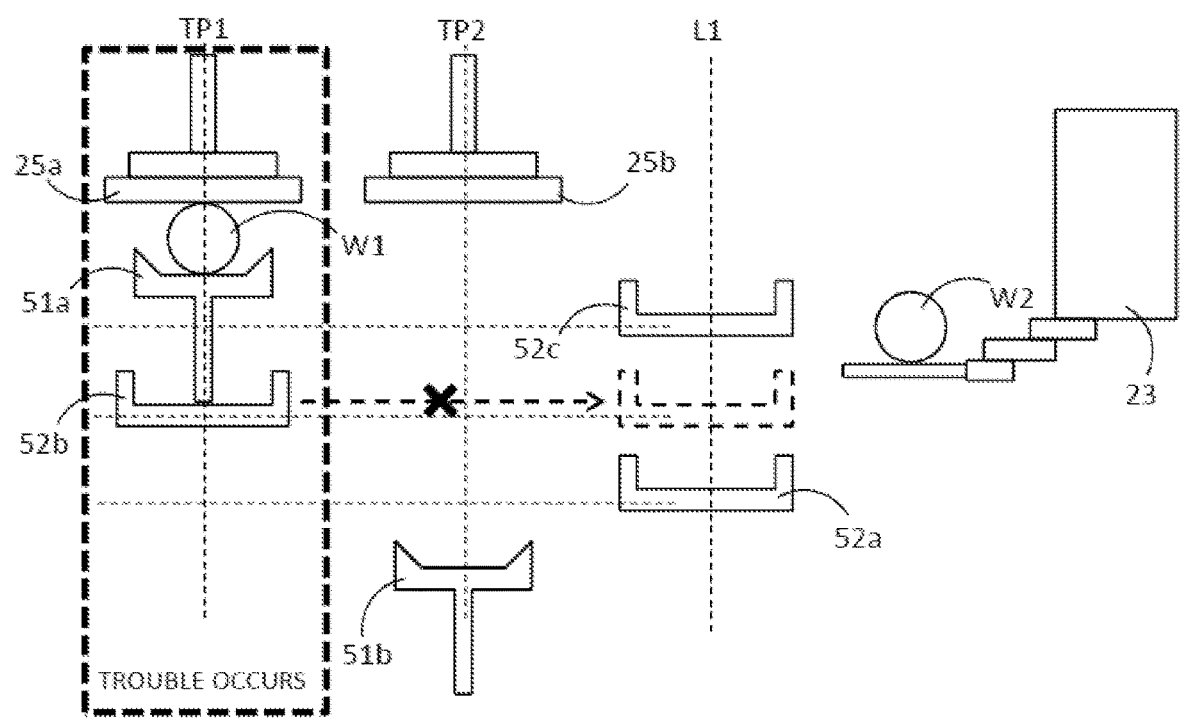
FIG. 31 is an exemplary view for explaining an occurrence of deadlock in parallel processing.

Even in the parallel processing at the first polishing device 21a and the second polishing device 21b, while receiving a wafer from the first polishing device 21a by using the second stage 52b, it is possible to transfer a wafer to the second polishing device 21b by using the same second stage 52b, as with the series processing at the first polishing device 21a and the second polishing device 21b. However, in this case, as illustrated in FIG. 31, when trouble occurs in receiving a wafer from the first polishing device 21a to disable the second stage 52b, wafer transfer to the second polishing device 21b is also disabled as affected by this (deadlock occurs).

Whereas, in this embodiment, when a wafer is polished at the first polishing device 21a and the second polishing device 21b in parallel, the same third stage 52c is used to transfer the wafer to both the first polishing device 21a and the second polishing device 21b, and the second stage 52b and the first stage 52a are exclusively used for receiving the wafers respectively from the first polishing device 21a and the second polishing device 21b. Accordingly, even when trouble occurs in receiving a wafer from the first polishing device 21a to disable the second stage 52b, a wafer can be continuously transferred to the second polishing device 21b (no deadlock occurs).

Figure 19H:
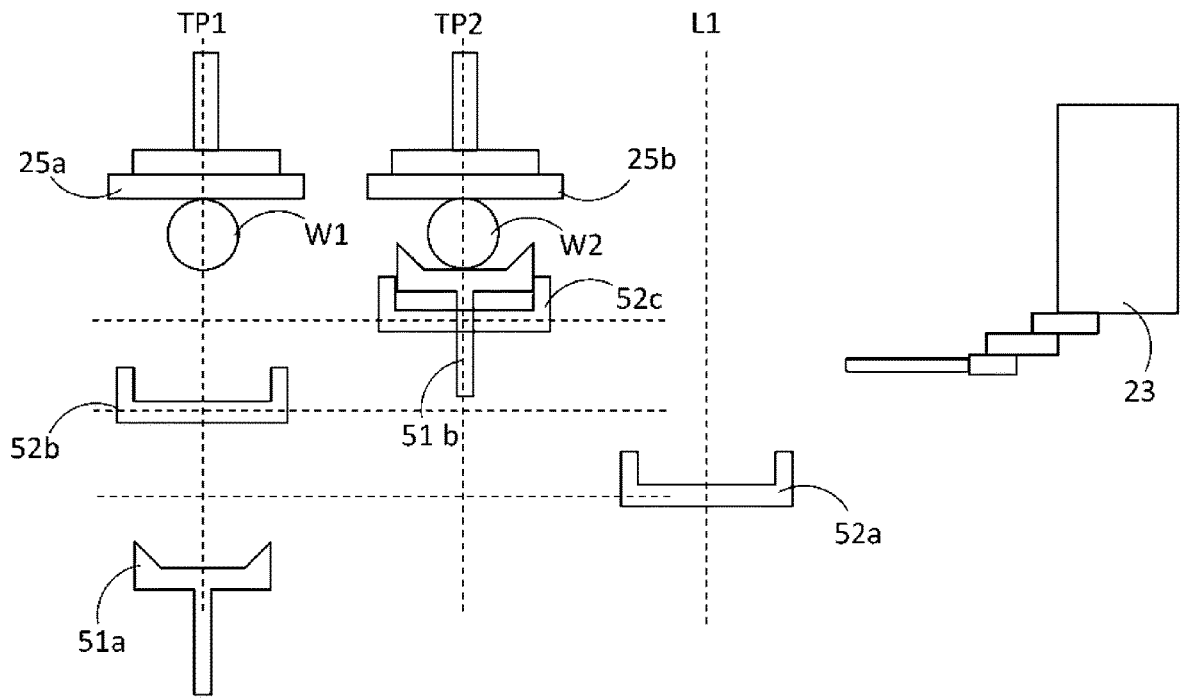
FIG. 19H is an exemplary view for explaining an operation of the first transport mechanism.
Figure 19I:
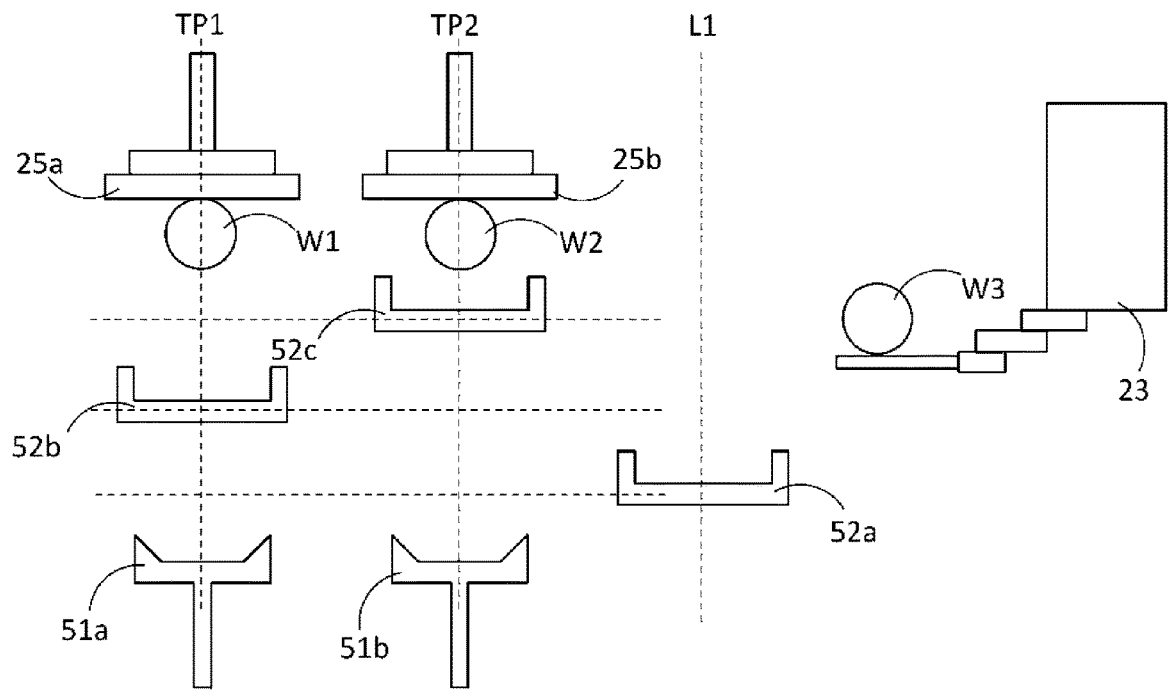
FIG. 19I is an exemplary view for explaining an operation of the first transport mechanism.

Next, as illustrated in FIG. 19H, the second pusher 51b ascends to pass inside the third stage 52c, and the second wafer W2 on the third stage 52c is pushed up by the second pusher 51b to be transferred to the top ring 25b of the second polishing device 21b. Then, after the second wafer W2 is sucked and held by the top ring 25b of the second polishing device 21b, as illustrated in FIG. 19I, the second pusher 51b descends to an initial height position. The transport robot 23 holds the third wafer W3 before polishing.

Figure 19J:
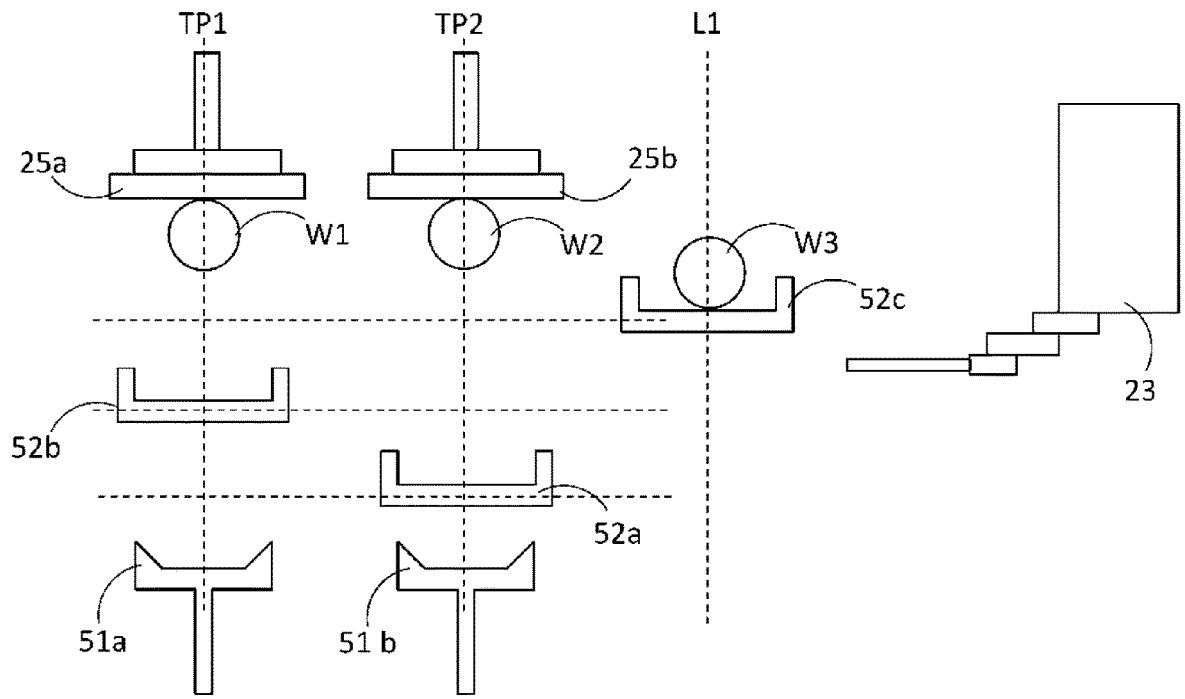
FIG. 19J is an exemplary view for explaining an operation of the first transport mechanism.

After that, as illustrated in FIG. 19J, the second wafer W2 is polished at the second polishing device 21b. At this time, the third stage 52c is moved from the second substrate-transport position TP2 to the standby position L1, the first stage 52a is moved from the standby position L1 to the second substrate-transport position TP2. The third wafer W3 before polishing held by the transport robot 23 is transferred to the third stage 52c disposed at the standby position L1.

Figure 19K:
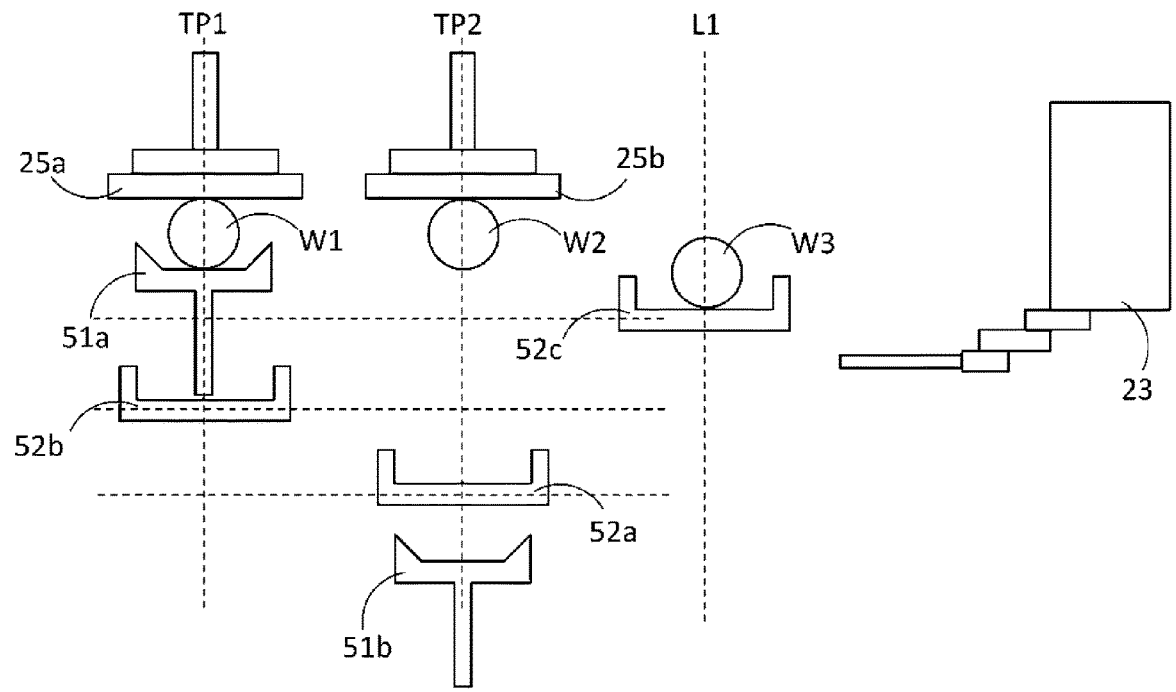
FIG. 19K is an exemplary view for explaining an operation of the first transport mechanism.
Figure 19L:
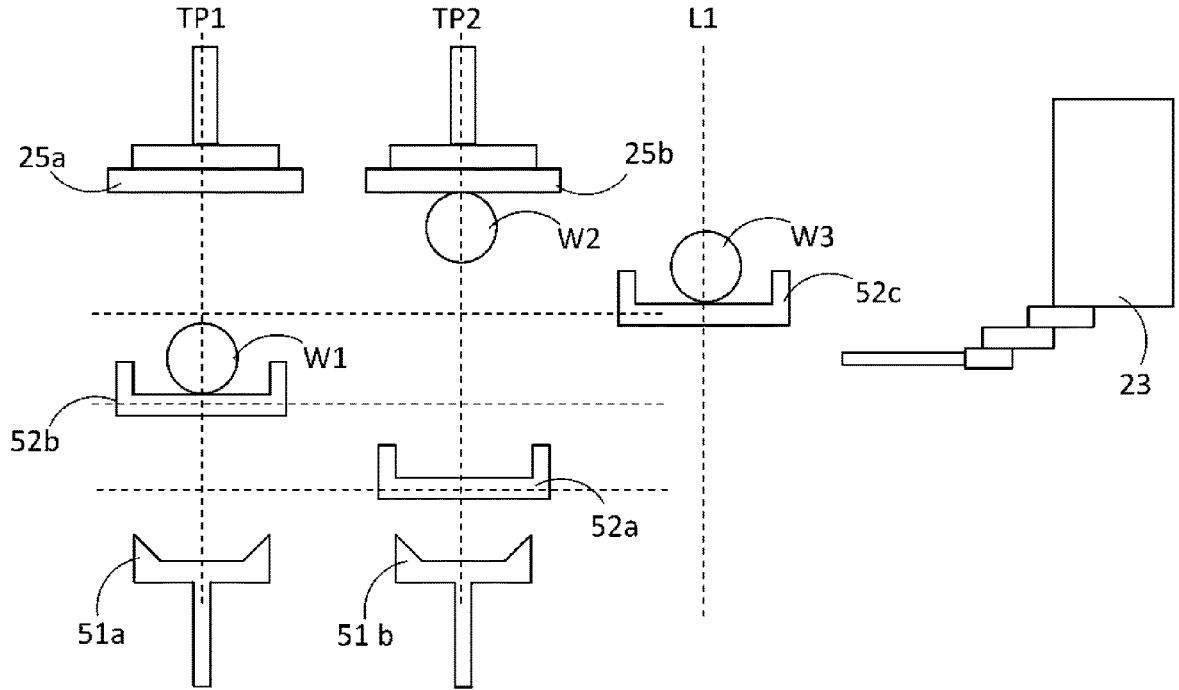
FIG. 19L is an exemplary view for explaining an operation of the first transport mechanism.

When the polishing is finished at the first polishing device 21a before the polishing is finished at the second polishing device 21b, as illustrated in FIG. 19K, the first pusher 51a ascends to receive the polished first wafer W1 from the top ring 25a of the first polishing device 21a. Then, as illustrated in FIG. 19L, the first pusher 51a descends to pass through the second stage 52b, and the first wafer W1 on the first pusher 51a is transferred to the second stage 52b. The first wafer W1 held by the second stage 52b is cleaned by a cleaning nozzle (not shown) at the first substrate-transport position TP1.

Figure 19M:
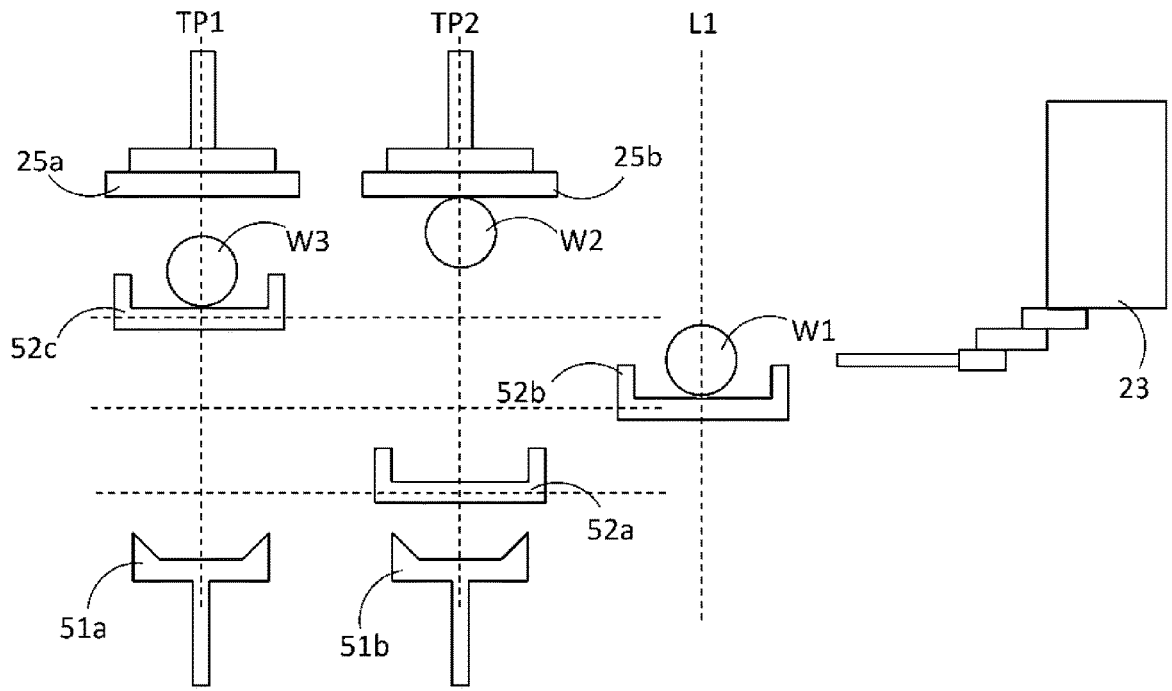
FIG. 19M is an exemplary view for explaining an operation of the first transport mechanism.

Next, as illustrated in FIG. 19M, the second stage 52b holding the first wafer W1 is moved from the first substrate-transport position TP1 to the standby position L1, and at the same time, the third stage 52c holding the third wafer W3 is moved from the standby position L1 to the first substrate-transport position TP1. The first wafer W1 held by the second stage 52b is taken out from above the second stage 52b by the transport robot 23 at the standby position L1.

Figure 19N:
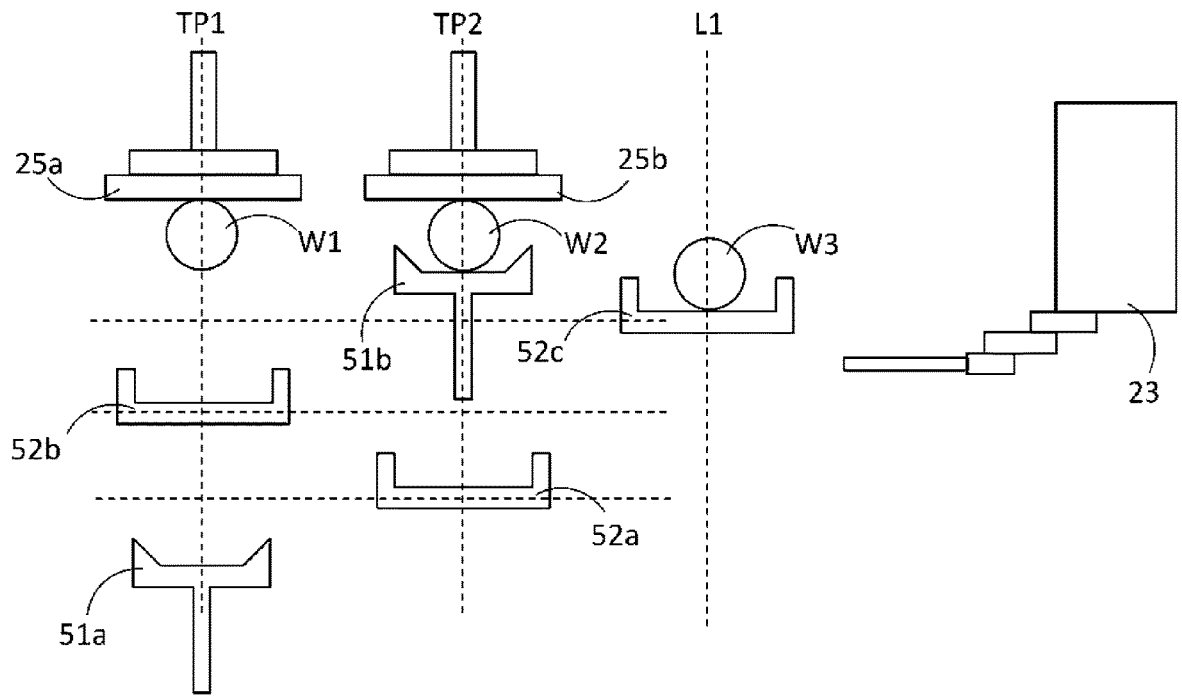
FIG. 19N is an exemplary view for explaining an operation of the first transport mechanism.
Figure 19O:
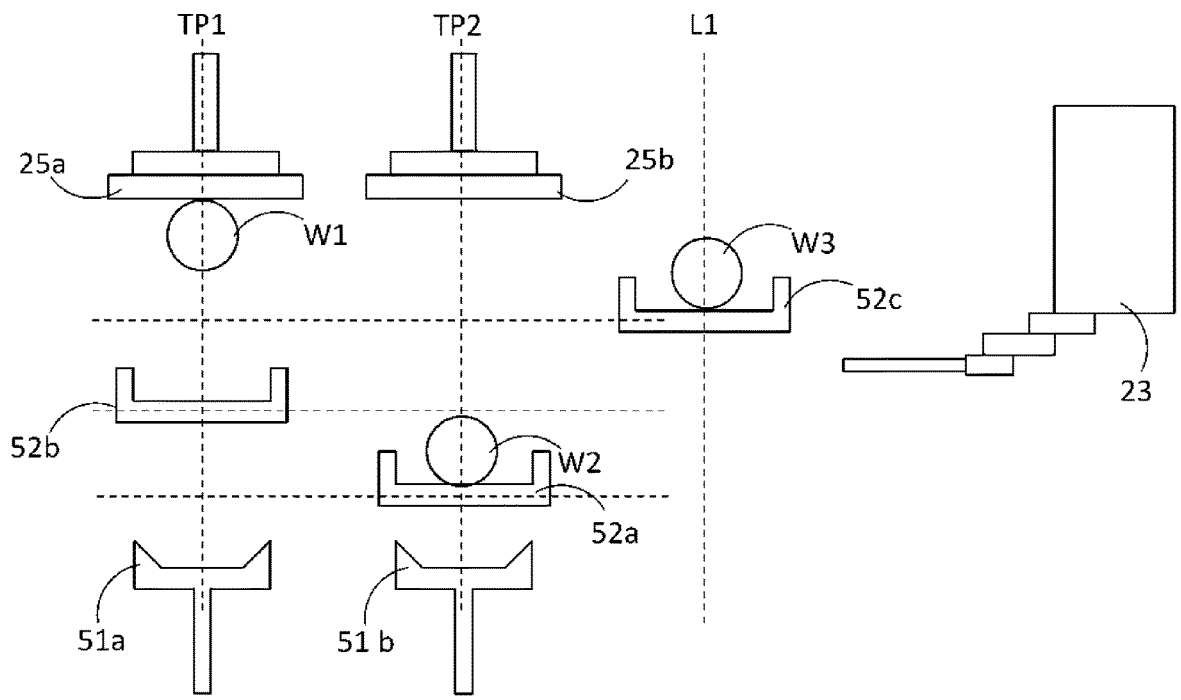
FIG. 19O is an exemplary view for explaining an operation of the first transport mechanism.

Whereas, when the polishing is finished at the second polishing device 21b before the polishing is finished at the first polishing device 21a, as illustrated in FIG. 19N, the second pusher 51b ascends to receive the polished second wafer W2 from the top ring 25b of the second polishing device 21b. Then, as illustrated in FIG. 19O, the second pusher 51b descends to pass through the first stage 52a, and the second wafer W2 on the second pusher 51b is transferred to the first stage 52a. The second wafer W2 held by the first stage 52a is cleaned by a cleaning nozzle (not shown) at the second substrate-transport position TP2.

Figure 19P:
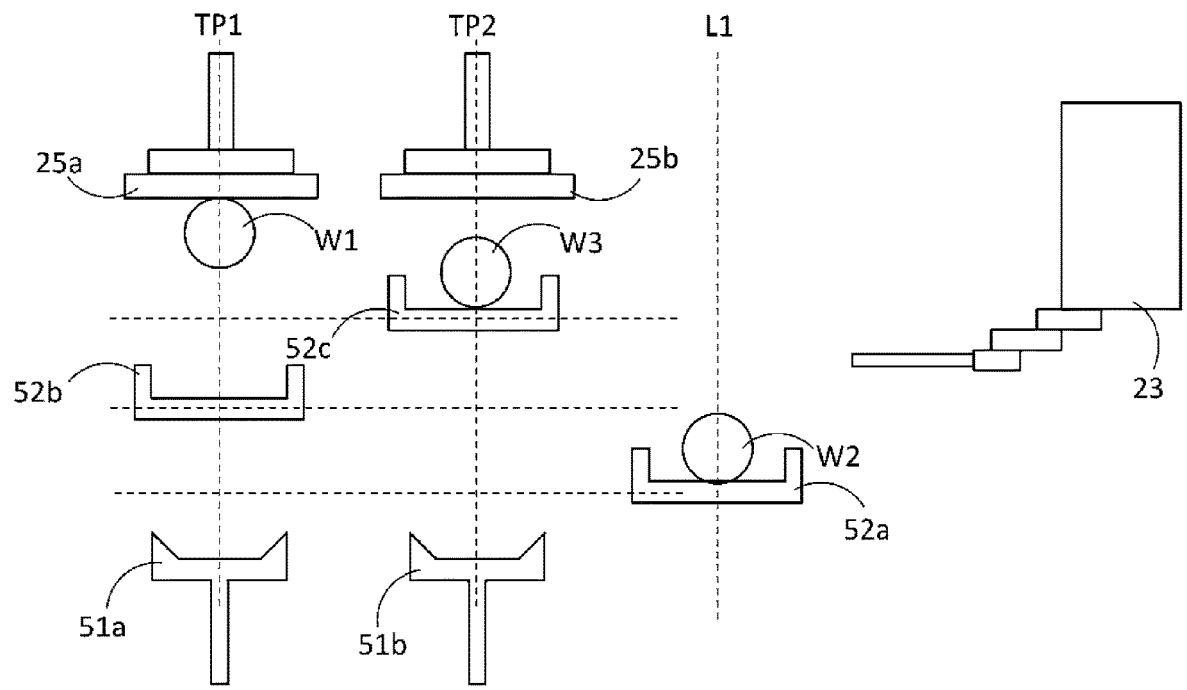
FIG. 19P is an exemplary view for explaining an operation of the first transport mechanism.

Next, as illustrated in FIG. 19P, the first stage 52a holding the second wafer W2 is moved from the second substrate-transport position TP2 to the standby position L1, and at the same time, the third stage 52c holding the third wafer W3 is moved from the standby position L1 to the second substrate-transport position TP2. The second wafer W2 held by the first stage 52a is taken out from above the first stage 52a by the transport robot 23 at the standby position L1.

Figure 20A:
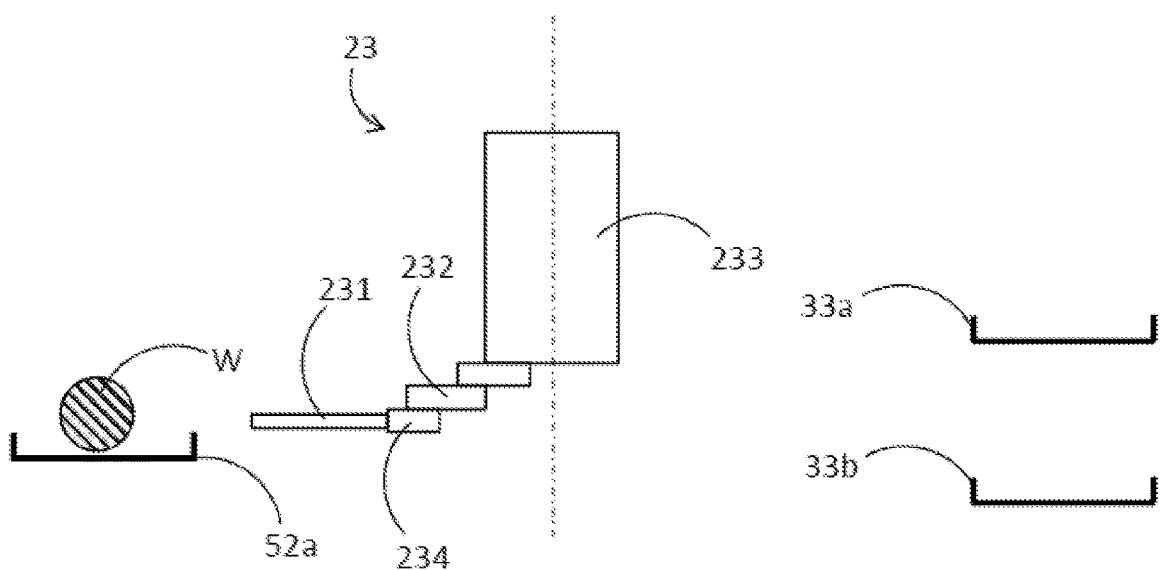
FIG. 20A is an exemplary view for explaining an operation of the transport robot for the cleaning part.

Although the above-described description is repeated, the wafer W held on the first stage 52a is taken out from above the first stage 52a by the hand 231 of the transport robot 23, as illustrated in FIG. 20A. After that, the hand 231 is vertically reversed together with the wafer W, by the reversing mechanism 234 of the transport robot 23.

Figure 20B:
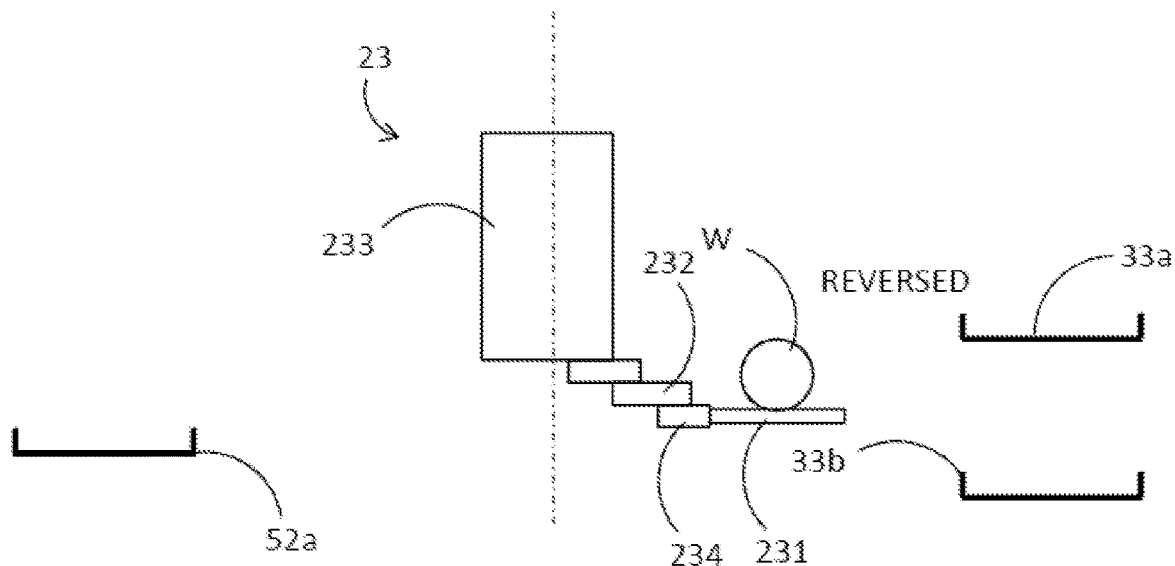
FIG. 20B is an exemplary view for explaining an operation of the transport robot for the cleaning part.
Figure 20C:
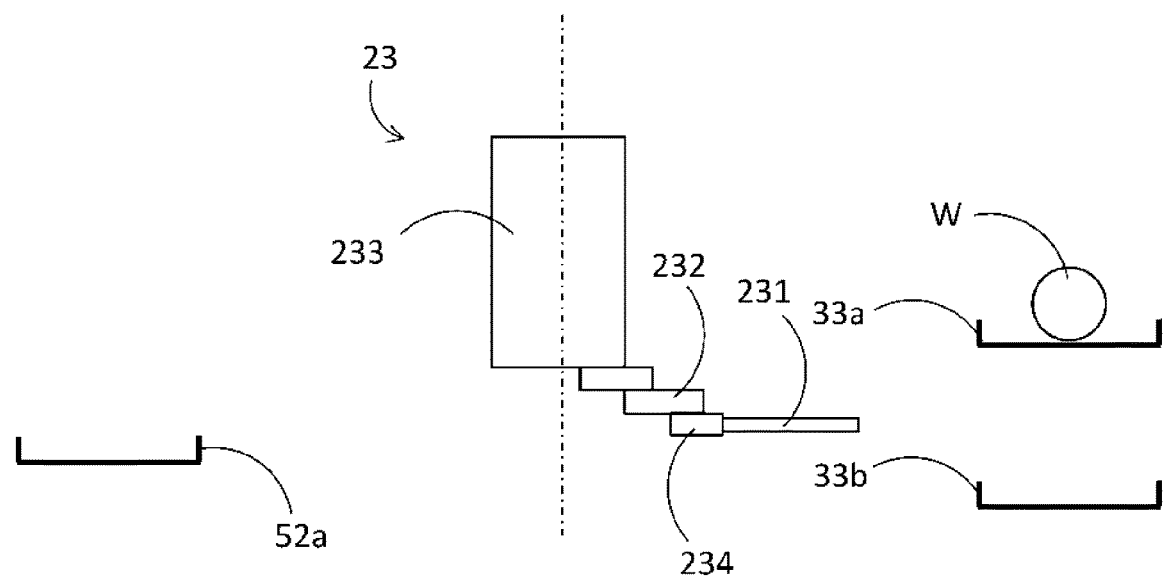
FIG. 20C is an exemplary view for explaining an operation of the transport robot for the cleaning part.

Next, as illustrated in FIG. 20B, the arm 232 of the transport robot 23 is rotated around an axis of the robot main body 233, and the hand 231 is directed to the first wafer station 33a side of the first cleaning unit 30a of the cleaning part 13. Then, as illustrated in FIG. 20C, the arm 232 is extended, and the wafer W held by the hand 231 is transferred to the first wafer station 33a. More specifically, with the hand 231 of the transport robot 23 positioned at a height position same as that of the carry-in port 73 of the first wafer station 33a, the arm 232 is extended, and the wafer W held by the hand 231 is carried into the casing 71 through the carry-in port 73 of the first wafer station 33a, to be placed and supported on the stage 72.

When the first cleaning unit 30a is congested or the like, the wafer W held by the hand 231 may be transferred to the second wafer station 33b of the second cleaning unit 30b. In this embodiment, wafers W transported from the polishing part to the cleaning part are distributed to the first cleaning unit 30a and the second cleaning unit 30b by the transport robot 23, and cleaned in parallel at the first cleaning unit 30a and the second cleaning unit 30b. Accordingly, a throughput of entire process is improved.

Since a wafer cleaning process at the second cleaning unit 30b is similar to a wafer cleaning process at the first cleaning unit 30a, the wafer cleaning process at the first cleaning unit 30a is described below.

Figure 21A:
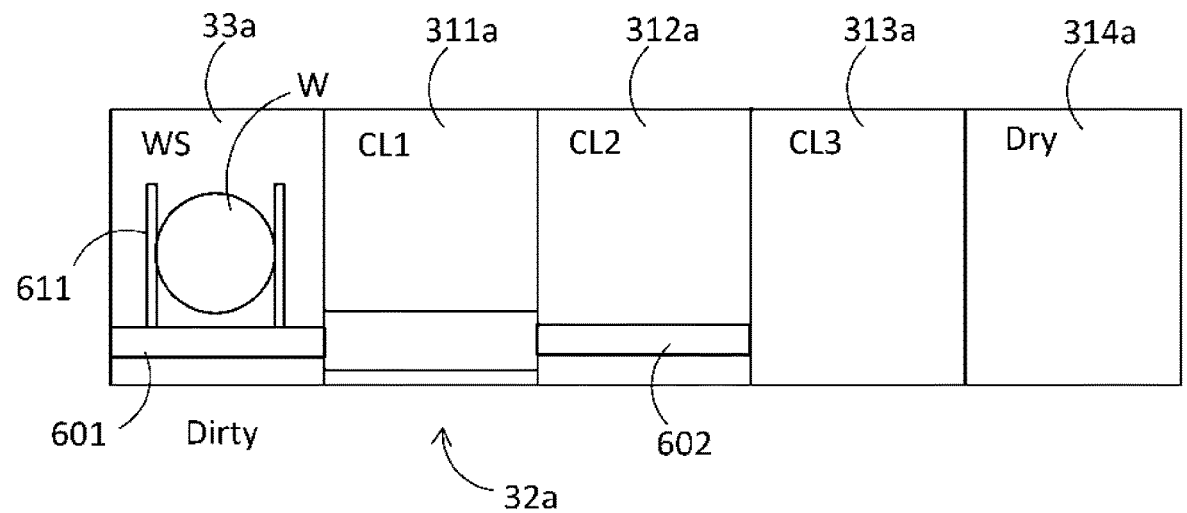
FIG. 21A is an exemplary view for explaining an operation of the first cleaning unit.

As illustrated in FIG. 21A, firstly, with each of tips of the pair of first arms 611 and of the pair of second arms 612 directed upward, the first wafer-holding mechanism 601 and the second wafer-holding mechanism 602 are moved along the arrangement direction of the first cleaning modules 311a to 314a by driving the arm-transport mechanism 62, and the pair of first arms 611 are stopped at a standby position adjacent to the first wafer station 33a. Then, by driving the first rotating mechanism 631, the pair of first arms 611 are rotated around the rotating shaft 631A, and the tips of the pair of first arms 611 are directed laterally. After a shutter of the first wafer station 33a is retracted to open the arm-passage opening 74, the pair of first arms 611 are inserted into the first wafer station 33a through the arm-passage opening 74, to hold a wafer W kept on the stage 72. After the pair of first arms 611 hold the wafer W, the stage 72 is retracted downward.

Figure 21B:
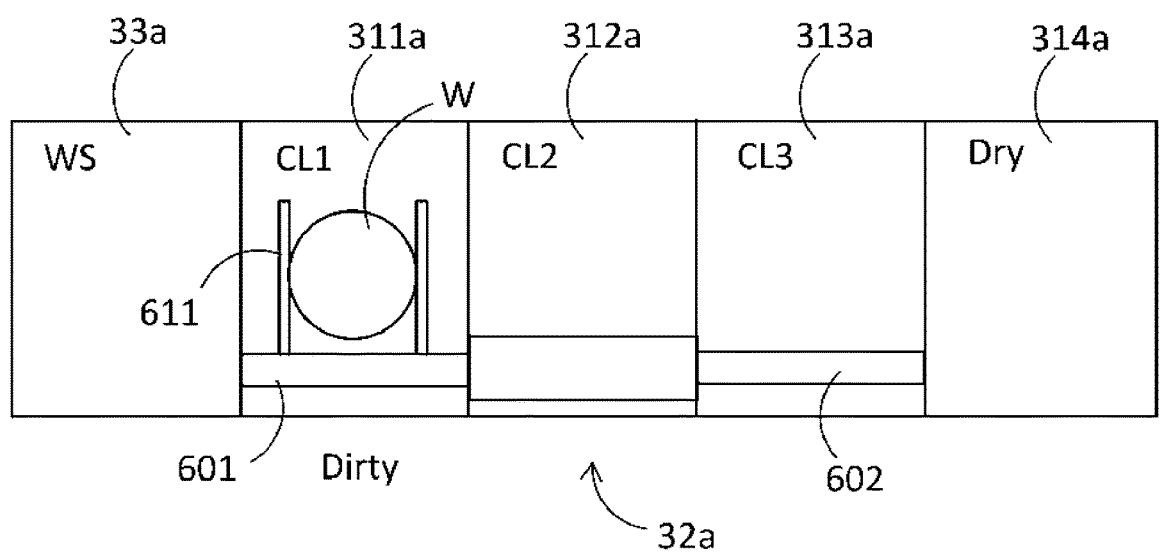
FIG. 21B is an exemplary view for explaining an operation of the first cleaning unit.

Next, as illustrated in FIG. 21B, after the shutter 97 of the primary cleaning module 311a is retracted to open the arm-passage opening 94, the first wafer-holding mechanism 601 and the second wafer-holding mechanism 602 are moved along the arrangement direction of the cleaning modules 311a to 314a by driving the arm-transport mechanism 62, and the wafer W held by the pair of first arms 611 is transported from the first wafer station 33a to the primary cleaning module 311a, and transferred to the cleaner of the primary cleaning module 311a. Then, after the pair of first arms 611 are taken out from the casing 91 of the primary cleaning module 311a, the shutter 97 closes the arm-passage opening 94, and the cleaner of the primary cleaning module 311a cleans the wafer W.

After the cleaning process at the primary cleaning module 311a is finished, the shutter 97 is retracted to open the arm-passage opening 94. The pair of first arms 611 are inserted into the casing 91 of the primary cleaning module 311a through the arm-passage opening 94, to hold the wafer W cleaned by the cleaner.

Figure 21C:
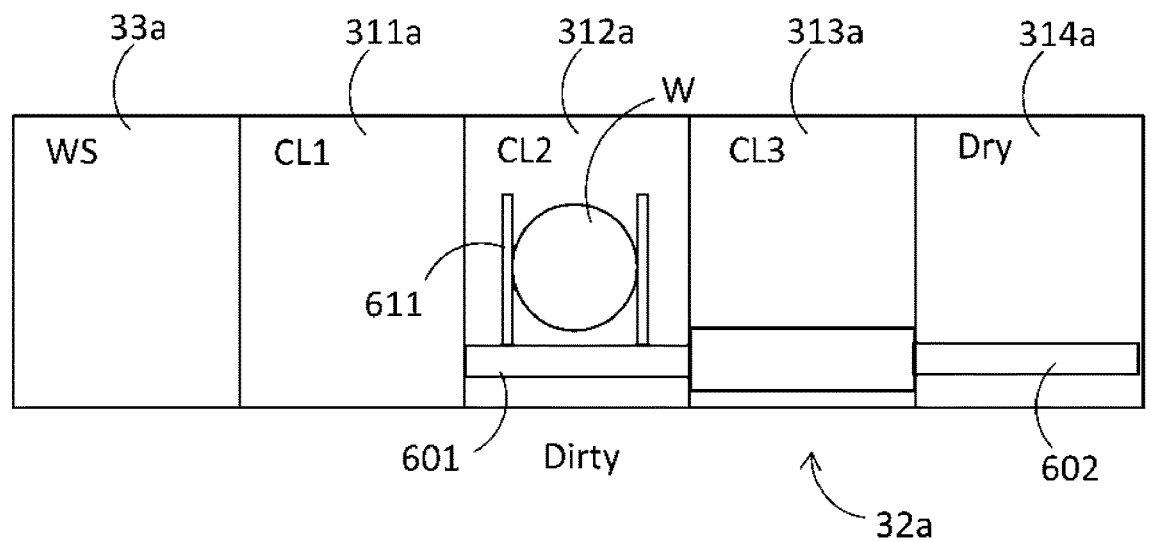
FIG. 21C is an exemplary view for explaining an operation of the first cleaning unit.

Next, as illustrated in FIG. 21C, after the shutter 97 of the secondary cleaning module 312a is retracted to open the arm-passage opening 94, the first wafer-holding mechanism 601 and the second wafer-holding mechanism 602 are moved along the arrangement direction of the cleaning modules 311a to 314a by driving the arm-transport mechanism 62, and the wafer W held by the pair of first arms 611 is transported from the primary cleaning module 311a to the secondary cleaning module 312a, and transferred to the cleaner of the secondary cleaning module 312a. Then, after the pair of first arms 611 are taken out from the casing 91 of the secondary cleaning module 312a, the shutter 97 closes the arm-passage opening 94, and the cleaner of the secondary cleaning module 312a cleans the wafer W.

Figure 21D:
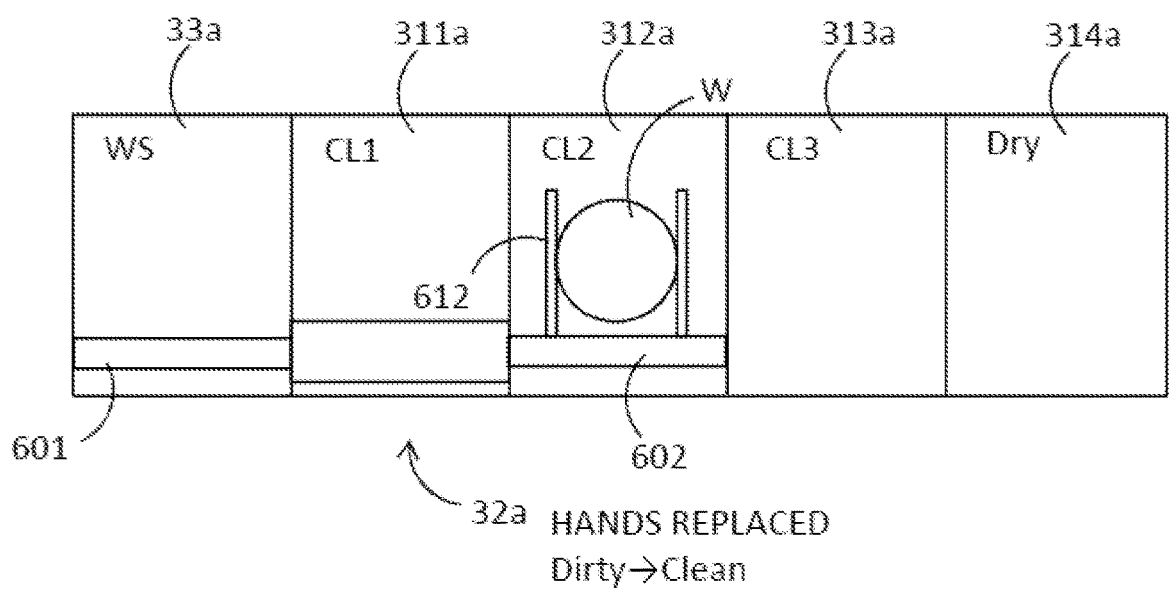
FIG. 21D is an exemplary view for explaining an operation of the first cleaning unit.

Next, as illustrated in FIG. 21D, by driving the first rotating mechanism 631, the pair of first arms 611 are rotated around the rotating shaft 631A, and the tips of the pair of first arms 611 are directed upward. Then, with each of the tips of the pair of first arms 611 and of second arms 612 directed upward, the first wafer-holding mechanism 601 and the second wafer-holding mechanism 602 are moved along the arrangement direction of the first cleaning modules 311a to 314a by driving the arm-transport mechanism 62, and the pair of second arms 612 are stopped at a standby position adjacent to a secondary cleaning module 312a. By driving the second rotating mechanism 632, the pair of second arms 612 are rotated around the rotating shaft 632A, and the tips of the pair of second arms 612 are directed laterally.

After the cleaning process at the secondary cleaning module 312a is finished, the shutter 97 is retracted to open the arm-passage opening 94. The pair of second arms 612 are inserted into the casing 91 of the secondary cleaning module 312a through the arm-passage opening 94, to hold the wafer W cleaned by the cleaner.

Thus, in this embodiment, while the pair of first arms 611 hold and transport the wafer W before cleaning at the secondary cleaning module 312a, the pair of second arms 612 hold and transport the wafer W cleaned at the secondary cleaning module 312a. In other words, arms are replaced at the secondary cleaning module 312a. This can prevent contamination of the wafer W cleaned at the secondary cleaning module 312a due to contact of the wafer W with the pair of first arms 611.

Figure 21E:
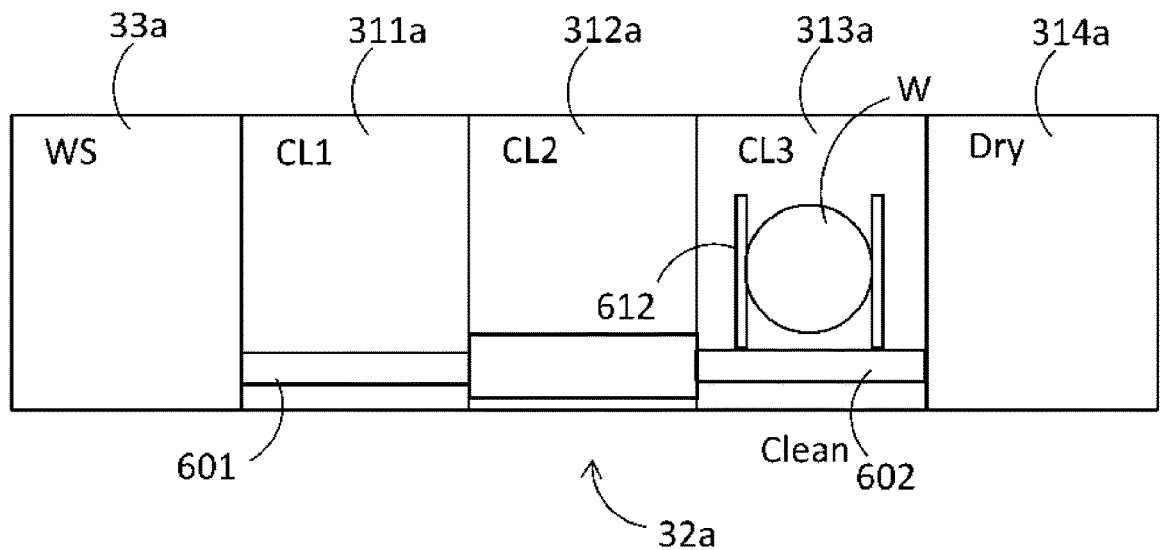
FIG. 21E is an exemplary view for explaining an operation of the first cleaning unit.

Next, as illustrated in FIG. 21E, after the shutter 97 of the tertiary cleaning module 313a is retracted to open the arm-passage opening 94, the first wafer-holding mechanism 601 and the second wafer-holding mechanism 602 are moved along the arrangement direction of the cleaning modules 311a to 314a by driving the arm-transport mechanism 62, and the wafer W held by the pair of second arms 612 is transported from the secondary cleaning module 312a to the tertiary cleaning module 313a, and transferred to the cleaner of the tertiary cleaning module 313a. Then, after the pair of second arms 612 are taken out from the casing 91 of the tertiary cleaning module 313a, the shutter 97 closes the arm-passage opening 94, and the cleaner of the tertiary cleaning module 313a cleans the wafer W.

After the cleaning process at the tertiary cleaning module 313a is finished, the shutter 97 is retracted to open the arm-passage opening 94. The pair of second arms 612 are inserted into the casing 91 of the tertiary cleaning module 313a through the arm-passage opening 94, to hold the wafer W cleaned by the cleaner.

Figure 21F:
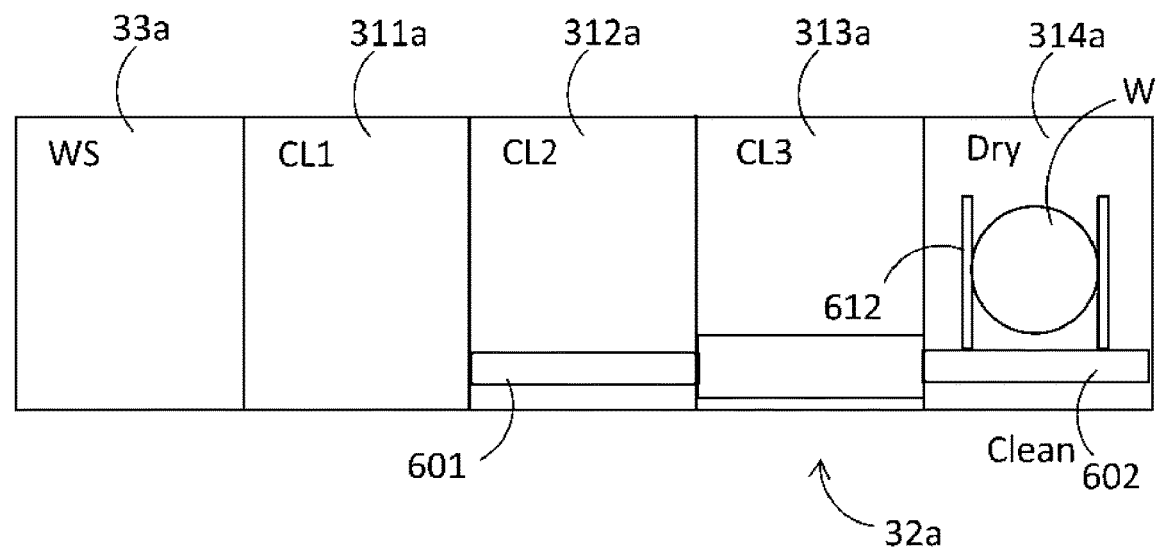
FIG. 21F is an exemplary view for explaining an operation of the first cleaning unit.

Next, as illustrated in FIG. 21F, after the shutter 97 of the quaternary cleaning module 314a is retracted to open the arm-passage opening 94, the first wafer-holding mechanism 601 and the second wafer-holding mechanism 602 are moved along the arrangement direction of the cleaning modules 311a to 314a by driving the arm-transport mechanism 62, and the wafer W held by the pair of second arms 612 is transported from the tertiary cleaning module 313a to the quaternary cleaning module 314a, and transferred to the cleaner of the quaternary cleaning module 314a. Then, after the pair of second arms 612 are taken out from the casing 91 of the quaternary cleaning module 314a, the shutter 97 closes the arm-passage opening 94, and the cleaner of the quaternary cleaning module 314a cleans and dries the wafer W.

After the cleaning and drying processes at the quaternary cleaning module 314a are finished, the shutter 97 is retracted to open the arm-passage opening 94. A hand of the transport robot 111 of the loading/unloading part 11 described above is inserted into the casing 91 of the quaternary cleaning module 314a through the arm-passage opening 94, to take out the wafer W cleaned by the cleaner and subjected to a drying (e.g., spin drying) process as a last step, to the loading/unloading part 11.

According to the embodiment above, since the cleaning part 13 has the first cleaning unit 30a and the second cleaning unit 30b that are vertically arranged in two stages, even when a plurality of wafers W are successively transported from the polishing part 12 to the cleaning part 13, the plurality of wafers W can be cleaned in parallel by distributing the wafers W to the first cleaning unit 30a and the second cleaning unit 30b. Accordingly, a throughput of entire process can be improved.

According to the embodiment, since the wafer W before polishing is transported to the polishing part 12 with the slide stage 42 of the transporting part 14, the transport robot 111 disposed at the loading/unloading part 11 can be prevented from being contaminated due to contact with a polishing environment.

According to the embodiment, the first cleaning unit 30a and the second cleaning unit 30b are vertically arranged in two stages, and the slide stage 42 is disposed between the first cleaning unit 30a and the second cleaning unit 30b, enabling suppression of an increase in footprint of the entire apparatus.

According to the embodiment, the polishing-part transport mechanism 22 is arranged adjacent to the transporting part 14 and each of the first and second polishing units 20a and 20b, the wafers W transported from the transporting part 14 to the polishing part 12 are distributed to the first transport unit 24a and the second transport unit 24b by the transport robot 23 of the polishing-part transport mechanism 22. Then, a wafer W is carried into the first polishing unit 20a from the first transport unit 24a, and a wafer W is carried into the second polishing unit 20b from the second transport unit 24b. Thus, the first polishing unit 20a and the second polishing unit 20b do not share a wafer carry-in path, eliminating congestion in carrying a substrate into the first polishing unit 20a and the second polishing unit 20b. This can improve a throughput of entire process.

According to the embodiment, even when abnormality occurs in any of the cleaning modules 311a to 314a of the first cleaning unit 30a, the wafer W located in the first cleaning unit 30a is transported to the second cleaning unit 30b, to be cleaned, so that the wafer W located in the first cleaning unit 30a can be saved.

According to the embodiment, the first transport unit 24a of the polishing part 12 can transport the wafer W received from the transport robot 23, to each of the first polishing device 21a and the second polishing device 21b. Moreover, the second transport unit 24b of the polishing part 12 can transport the wafer W received from the transport robot 23, to each of the third polishing device 21c and the fourth polishing device 21d. For example, the first stage 52a of the first transport unit 24a receives a first wafer from the transport robot 23 and moves to the first substrate-transport position TP1, then the first pusher 51a ascends to transfer the first wafer from the first stage 52a to the first polishing device 21a, and while the first wafer is being polished at the first polishing device 21a, it is possible that the second stage 52b receives a second wafer from the transport robot 23 and moves to the second substrate-transport position TP2, then the second pusher 51b ascends to transfer the second wafer from the second stage 52b to the second polishing device 21b, and the second wafer is polished at the second polishing device 21b. Thus polishing two wafers in parallel can provide improvement in a throughput of entire process. It is also possible that, after the wafer is polished at the first polishing device 21a, the first pusher 51a descends to transfer the substrate from the first polishing device 21a to the second stage 52b, the second stage 52b moves to the second substrate-transport position TP2, the second pusher 51b ascends to transfer the wafer from the second stage 52b to the second polishing device 21b, and the wafer is further polished at the second polishing device 21b.

According to the embodiment, since the exchanger 50 of the polishing part 12 has three stages 52a to 52c, for example, while both the first and second stages 52a and 52b are used for transfer of a wafer with the first and second polishing devices 21a and 21b, the third stage 52c can receive a next wafer and wait. This can provide an earlier start timing of polishing process for the next wafer, and further improvement in the throughput.

According to the embodiment, when first and second wafers W1 and W2 are polished simultaneously (in parallel) at the first and second polishing devices 21a and 21b, the same third stage 52c is used to transfer a wafer to both the first and second polishing devices 21a and 21b, and the second stage 52b and the first stage 52a are exclusively used for receiving wafers from the first and second polishing devices 21a and 21b respectively. Consequently, even when trouble occurs in receiving a wafer from one polishing device 21a, a wafer can be continuously transferred to another polishing device 21b (occurrence of deadlock can be avoided).

According to the embodiment, since a cleaning-part transport mechanism 32a configured to transport a wafer W between each of the cleaning modules 311a to 314a has the pair of openable/closable arms 611 and the rotating mechanism 631, and the rotating mechanism 631 can rotate the pair of arms 611 so as to direct their tips upward, even when the shutter 97 of a specific cleaning module among the plurality of cleaning modules 311a to 314a is closed, the arms 611 can avoid (skip) this cleaning module, to move. This eliminates necessity of waiting for the shutter 97 to open in moving the arms 611 to pass this cleaning module, enabling improvement in a throughput of entire process.

According to the embodiment, it is possible to reduce a space required above the pair of arms 611 since the vertical-moving mechanism 641 lowers the pair of arms 611 when the rotating mechanism 631 rotates the pair of arms 611 so as to direct their tips upward.

According to the embodiment, the substrate processing apparatus has two sets consisting of the pair of arms 611 and 612, the vertical-moving mechanisms 641 and 642, and the rotating mechanisms 631 and 632, the two sets of arms can be properly used according to cleanliness of a wafer to be held. For example, while a first set of arms are used for a first half of cleaning process in cleaning process of each of the cleaning modules, a second set of arms are used for a second half of the cleaning process, which can prevent contamination of a wafer being subjected to the second half of cleaning process due to contact with the first set of arms.

According to the embodiment, since the pair of arms 611 are provided with the chuck tops 612a and 612b capable of abutting to the outer periphery of the wafer W, vertically in two stages, the chuck tops 612a and 612b can be properly used according to cleanliness of a wafer to be held. For example, while the lower chuck top 612b is used for a first half of cleaning process in cleaning process of each of the cleaning modules, the upper chuck top 612a is used for a second half of the cleaning process, which can prevent contamination of a wafer being subjected to the second half of cleaning process due to contact with the lower chuck top 612b.

According to the embodiment, since there is disposed the wafer-holding mechanism 601 having the pair of arms 611, the vertical-moving mechanism 641, and the rotating mechanism 631 in a suspended state below the arm-transport mechanism 62, a maintenance space for the wafer-holding mechanism 601 is enlarged. This can reduce time required for maintenance.

According to the embodiment, before the wafer W before polishing is polished at the polishing part 12, a surface of this wafer W can be cleaned at the pre-cleaning module 39a. This can reduce trouble such as generation of scratch due to biting of a coarse particle during the polishing process of the wafer W.

Although in the embodiment described above, the pair of first arms 611 hold and transport the wafer W before cleaning at the secondary cleaning module 312a, and the pair of second arms 612 hold and transport the wafer W cleaned at the secondary cleaning module 312a, the present invention is not limited to this. For example, the pair of first arms 611 may hold and transport the wafer W before cleaning at the primary cleaning module 311a while the pair of second arms 612 may hold and transport the wafer W cleaned at the primary cleaning module 311a, and the pair of first arms 611 may hold and transport the wafer W before cleaning at the tertiary cleaning module 313a while the pair of second arms 612 may hold and transport the wafer W cleaned at the tertiary cleaning module 313a.

In the embodiment described above, a transport unit (e.g., the first transport unit 24a) of the polishing part 12 has two pushers (the first and second pushers 51a and 51b) disposed at two substrate-transport positions (the first and second substrate-transport positions TP1 and TP2) for respective two polishing devices (the first and second polishing devices 21a and 21b), and configured to vertically move; and the exchanger 50 including at least two stages (the first and second stages 52a and 52b) vertically arranged in two stages and configured to horizontally move independently from each other, between the standby position L1 for transfer of a wafer W with the transport robot 23, and two substrate-transport positions TP1 and TP2. However, the present invention is not limited to this, and the transport unit of the polishing part 12 may have M pieces (M is a natural number of 3 or more) of pushers arranged at M locations of the substrate-transport positions for respective M pieces of polishing devices, and configured to vertically move; and an exchanger 50 including at least M pieces of stages vertically arranged in M stages and configured to horizontally move independently from each other, between the standby position L1 for transfer of a wafer W with the transport robot 23, and M locations of the substrate-transport positions. In this case, the exchanger 50 preferably has at least one additional stage vertically arranged in multiple stages with respect to the M pieces of stages, and configured to horizontally move between the standby position L1 and the M locations of substrate-transport positions, independently from the M pieces of stages.

Although, in the embodiment described above, a polishing device for polishing a wafer is described as an example, this technology is not limited to a polishing device, and can be applied to other substrate processing apparatuses. For example, a plurality of polishing units may be replaced with another substrate processing unit (e.g., a film-forming processing unit such as a plating unit or a CVD unit, a wet etching unit, or a dry etching unit), to form a substrate processing apparatus different from a polishing device. Furthermore, a plurality of different substrate processing units may be combined and arranged in line in a predetermined direction.

Although preferred embodiments have been described above, it should be understood that the present technology is not limited to the illustrated embodiments, but changes and modifications can be made therein without departing from the technical idea.

What is claimed is:

1. A substrate processing apparatus comprising:
a processing part configured to process a substrate;
a transporting part configured to transport a substrate before processing to the processing part; and
a cleaning part configured to clean a processed substrate, wherein
the cleaning part has a first cleaning unit and a second cleaning unit that are vertically arranged in two stages;
the first cleaning unit and the second cleaning unit each have a plurality of cleaning modules that are arranged in series; and
the transporting part has
a cover extending in an arrangement direction of the plurality of cleaning modules and formed with a carry-in port at one end thereof,
a slide stage disposed inside the cover and configured to transport a substrate before processing along the arrangement direction of the plurality of cleaning modules, and
an exhaust duct provided at the opposite side to the carry-in port of the cover and configured to evacuate inside the cover.

2. A substrate processing apparatus comprising:
a polishing part configured to polish a substrate;
a transporting part configured to transport a substrate before polishing to the polishing part; and
a cleaning part configured to clean a polished substrate, wherein
the polishing part has
a first polishing unit and a second polishing unit, and
a polishing-part transport mechanism arranged adjacent to the transporting part and each of the first polishing unit and the second polishing unit; and
the polishing-part transport mechanism has
a first transport unit configured to transport a substrate to the first polishing unit,
a second transport unit configured to transport a substrate to the second polishing unit, and
a transport robot disposed between the first transport unit and the second transport unit, and configured to transfer a substrate between the transporting part, and the first transport unit and the second transport unit.

3. The substrate processing apparatus according to claim 2, wherein
the cleaning part is arranged adjacent to the transport robot; and
the transport robot transfers a substrate between the cleaning part, and the first transport unit and the second transport unit.

4. A substrate processing apparatus comprising:
a polishing part configured to polish a substrate;
a transporting part configured to transport a substrate before polishing to the polishing part; and
a cleaning part configured to clean a polished substrate, wherein
the polishing part has
N pieces of polishing devices, N being a natural number of 2 or more,
a transport unit configured to transport a substrate to each of the N pieces of polishing devices, and
a transport robot configured to transfer a substrate between the transporting part and the transport unit; and
the transport unit has
N pieces of pushers respectively arranged at N locations of substrate-transport positions for the respective N pieces of polishing devices, and configured to vertically move, and
an exchanger having N pieces of stages vertically arranged in N stages, and configured to horizontally move independently from each other, between a standby position for transfer of a substrate with the transport robot and the N locations of substrate-transport positions.

5. The substrate processing apparatus according to claim 4, wherein
the exchanger has at least one additional stage vertically arranged in multiple stages with respect to the N pieces of stages, and configured to horizontally move between the standby position and the N locations of substrate-transport positions, independently from the N pieces of stages.

6. The substrate processing apparatus according to claim 5 further comprising a control part configured to control an operation of the polishing part, wherein the control part controls an operation of the polishing part such that, when substrates are successively polished at a first polishing device and a second polishing device;

a first stage receives a first substrate from the transport robot and moves from the standby position to the first substrate-transport position;

the first pusher ascends to transfer the first substrate from the first stage to the first polishing device;

while the first polishing device is polishing the first substrate, the first stage moves back to the standby position to receive a second substrate from the transport robot;

after the polishing at the first polishing device is finished, the first pusher descends to transfer the first substrate from the first polishing device to a second stage; and the second stage moves from the first substrate-transport position to a second substrate-transport position, and at the same time, the first stage moves from the standby position to the first substrate-transport position.

7. The substrate processing apparatus according to claim 5 further comprising a control part configured to control an operation of the polishing part, wherein the control part controls an operation of the polishing part such that, when substrates are polished in parallel at the first polishing device and the second polishing device, a first stage is used for receiving a substrate from the first polishing device, but the first stage is not used for transfer of the substrate with the second polishing device; and a second stage is used for receiving a substrate from the second polishing device, but the second stage is not used for transfer of the substrate with the first polishing device.

8. The substrate processing apparatus according to claim 5 further comprising a control part configured to control an operation of the polishing part, wherein the control part controls an operation of the polishing part such that, when a first substrate and a second substrate are polished in parallel at the first polishing device and the second polishing device, a first stage receives the first substrate from the transport robot and moves from the standby position to the first substrate-transport position;

the first pusher ascends to transfer the first substrate from the first stage to the first polishing device;

while the first polishing device is polishing the first substrate, the first stage moves back to the standby position from the first substrate-transport position to receive the second substrate from the transport robot, and moves from the standby position to a second substrate-transport position;

the second pusher ascends to transfer the second substrate from the first stage to the second polishing device;

while the second polishing device is polishing the second substrate, the first stage moves back to the standby position from the second substrate-transport position to receive a third substrate from the transport robot;

when the polishing at the first polishing device is finished before the polishing at the second polishing device is finished, the first pusher descends to transfer the first substrate from the first polishing device to the second stage, and the second stage moves from the first substrate-transport position to the standby position, and at the same time, the first stage moves from the standby position to the first substrate-transport position; and when the polishing at the second polishing device is finished before the polishing at the first polishing device is finished, the second pusher descends to transfer the second substrate from the second polishing device to a third stage, and the third stage moves from the second substrate-transport position to the standby position, and at the same time, the first stage moves from the standby position to the first substrate-transport position.

9. A substrate processing apparatus comprising:

a polishing part configured to polish a substrate;

a transporting part configured to transport a substrate before polishing to the polishing part; and a cleaning part configured to clean a polished substrate, wherein the cleaning part has a plurality of cleaning modules arranged in series, and a cleaning-part transport mechanism configured to transport a substrate between the cleaning modules each; and the cleaning-part transport mechanism has a pair of arms that are openable/closable and configured to hold a substrate, a vertical-moving mechanism configured to vertically move the pair of arms, a rotating mechanism configured to rotate the pair of arms around a rotating shaft that is in parallel with an opening/closing direction, and an arm-transport mechanism configured to linearly move the pair of arms along an arrangement direction of the plurality of cleaning modules.

10. The substrate processing apparatus according to claim 9 further comprising a control part configured to control an operation of the cleaning part, wherein the control part controls an operation of the cleaning part such that, when the rotating mechanism rotates the pair of arms so as to direct tips of the pair of arms upward, the vertical-moving mechanism lowers the pair of arms.

11. The substrate processing apparatus according to claim 9, wherein the cleaning-part transport mechanism has two sets each consisting of the pair of arms, the vertical-moving mechanism, and the rotating mechanism.

12. The substrate processing apparatus according to claim 9, wherein the pair of arms are provided with chuck tops capable of abutting to an outer periphery of a substrate, vertically arranged in multiple stages.

13. The substrate processing apparatus according to claim 9, wherein a set consisting of the pair of arms, the vertical-moving mechanism, and the rotating mechanism is disposed in a suspended state below the arm-transport mechanism.

14. The substrate processing apparatus according to claim 9, wherein the cleaning part further has a pre-cleaning module arranged on a same line as the plurality of cleaning modules and configured to clean a substrate before polishing; and the cleaning-part transport mechanism transports a substrate between the pre-cleaning module and each of the cleaning modules.

15. The substrate processing apparatus according to claim 2, further comprising a control part configured to control an operation of the polishing part and the cleaning part, wherein the cleaning part has a first cleaning unit and a second cleaning unit that are vertically arranged in two stages;

the first cleaning unit has a plurality of first cleaning modules and a first wafer station that are arranged in series, and a first cleaning-part transport mechanism configured to transport a substrate between the first wafer station and each of the first cleaning modules;

the second cleaning unit has a plurality of second cleaning modules and a second wafer station that are arranged in series, and a second cleaning-part transport mechanism configured to transport a substrate between the second wafer station and each of the second cleaning modules; and the control part controls an operation of the polishing part and the cleaning part such that, when abnormality occurs in any of the plurality of the first cleaning modules, the first cleaning-part transport mechanism transports a substrate located in the first cleaning modules to the first wafer station, the transport robot transfers the substrate from the first wafer station to the second wafer station, and the substrate is transported from the second wafer station to the second cleaning modules by the second cleaning-part transport mechanism, to be cleaned.

16. The substrate processing apparatus according to claim 1, wherein the processing part is a polishing part configured to polish a substrate.

17. The substrate processing apparatus according to claim 1, wherein the transporting part is disposed between the first cleaning unit and the second cleaning unit.

18. The substrate processing apparatus according to claim 1, wherein the cover is formed with a carry-out port communicated with the processing part, and the carry-in port and the carry-out port are configured to be opened and closed by a shutter.

19. The substrate processing apparatus according to claim 1, wherein a rod-less cylinder is used as a stage-moving mechanism configured to move the slide stage linearly along the arrangement direction of the plurality of cleaning module.

* * * * *